US009466930B2

(12) United States Patent
Little et al.

(10) Patent No.: US 9,466,930 B2
(45) Date of Patent: *Oct. 11, 2016

(54) FLIPPABLE ELECTRICAL CONNECTOR

(71) Applicant: FOXCONN INTERCONNECT TECHNOLOGY LIMITED, Grand Cayman (KY)

(72) Inventors: Terrance F. Little, Fullerton, CA (US); Chih-Pi Cheng, New Taipei (TW); Wei-Hao Su, New Taipei (TW); Cheng-Chi Yeh, New Taipei (TW); Yuan Zhang, Rowland-Heights, CA (US); Ming-Lun Szu, New Taipei (TW); Chi-Tung Kuan, New Taipei (TW)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 14/675,620

(22) Filed: Mar. 31, 2015

(65) Prior Publication Data
US 2015/0207280 A1 Jul. 23, 2015

Related U.S. Application Data

(63) Continuation-in-part of application No. 14/558,732, filed on Dec. 3, 2014, and a continuation-in-part of
(Continued)

(51) Int. Cl.
*H01R 13/6585* (2011.01)
*H01R 24/60* (2011.01)
(Continued)

(52) U.S. Cl.
CPC ............. *H01R 24/60* (2013.01); *H01R 12/58* (2013.01); *H01R 13/6581* (2013.01);
(Continued)

(58) Field of Classification Search
CPC .......... H01R 13/6585; H01R 13/6587; H01R 13/6594; H01R 13/6275
See application file for complete search history.

(56) References Cited

U.S. PATENT DOCUMENTS

| 5,073,130 A | 12/1991 | Nakamura |
| 6,755,689 B2 | 6/2004 | Zhang et al. |

(Continued)

FOREIGN PATENT DOCUMENTS

| CM | CN201868687 U | 6/2011 |
| CN | 201029143 Y | 2/2008 |
| CN | 201230066 Y | 4/2009 |
| CN | 101573840 A | 11/2009 |
| CN | 201623280 U | 11/2010 |

(Continued)

OTHER PUBLICATIONS

USB Type-C Specification 0.9c05-20140518.
Universal Serial Bus Type-C Cable and Connector Specification Revision 1.0 Aug. 11, 2014.
(Continued)

*Primary Examiner* — Gary Paumen
(74) *Attorney, Agent, or Firm* — Wei Te Chung; Ming Chieh Chang

(57) ABSTRACT

A plug connector mateable with the receptacle connector, includes an insulative housing enclosed in a metallic shell, defining a receiving cavity to receive the mating tongue, and equipped with a plurality of contacts on opposite sides in the vertical direction. A latch forms a pair of locking heads extending into two opposite lateral sides of the receiving cavity to lock with a shielding plate embedded within a mating tongue of the complementary receptacle connector during mating.

20 Claims, 74 Drawing Sheets

Related U.S. Application Data application No. 14/542,550, filed on Nov. 15, 2014, now Pat. No. 9,350,126, and a continuation-in-part of application No. 14/497,205, filed on Sep. 25, 2014, and a continuation-in-part of application No. 14/477,889, filed on Sep. 5, 2014, and a continuation-in-part of application No. 14/454,737, filed on Aug. 8, 2014, and a continuation-in-part of application No. 14/337,180, filed on Jul. 21, 2014, now Pat. No. 9,318,853, and a continuation-in-part of application No. 14/517,941, filed on Oct. 20, 2014.

(60) Provisional application No. 61/981,217, filed on Apr. 18, 2014, provisional application No. 62/001,084, filed on May 21, 2014, provisional application No. 61/940,815, filed on Feb. 17, 2014, provisional application No. 61/949,232, filed on Mar. 6, 2014, provisional application No. 61/917,363, filed on Dec. 18, 2013, provisional application No. 61/943,310, filed on Feb. 22, 2014, provisional application No. 61/926,270, filed on Jan. 11, 2014, provisional application No. 61/916,147, filed on Dec. 14, 2013, provisional application No. 61/919,681, filed on Dec. 20, 2013, provisional application No. 61/875,096, filed on Sep. 8, 2013, provisional application No. 61/863,896, filed on Aug. 8, 2013, provisional application No. 61/866,037, filed on Aug. 14, 2013, provisional application No. 61/867,584, filed on Aug. 19, 2013, provisional application No. 61/856,077, filed on Jul. 19, 2013, provisional application No. 61/857,687, filed on Jul. 23, 2013, provisional application No. 61/899,276, filed on Nov. 3, 2013.

(51) Int. Cl.
*H01R 13/6591* (2011.01)
*H01R 12/58* (2011.01)
*H01R 13/6581* (2011.01)
*H01R 107/00* (2006.01)
*H01R 12/72* (2011.01)
*H01R 24/28* (2011.01)
*H05K 1/11* (2006.01)
*H05K 1/18* (2006.01)

(52) U.S. Cl.
CPC ....... *H01R 13/6591* (2013.01); *H01R 12/724* (2013.01); *H01R 24/28* (2013.01); *H01R 2107/00* (2013.01); *H05K 1/117* (2013.01); *H05K 1/184* (2013.01); *H05K 2201/09063* (2013.01); *H05K 2201/10189* (2013.01)

(56) References Cited

U.S. PATENT DOCUMENTS

| | | | | |
|---|---|---|---|---|
| 6,916,198 B2* | 7/2005 | Wu | ................ | H01R 13/6589 439/497 |
| 7,534,150 B2* | 5/2009 | Shen | ................ | H01R 12/712 439/752 |
| 7,670,178 B2* | 3/2010 | Gu | ................ | H01R 13/65802 439/607.01 |
| 7,758,379 B2 | 7/2010 | Chen | | |
| 8,087,944 B2 | 1/2012 | Kumamoto et al. | | |
| 8,517,773 B2 | 8/2013 | Lee et al. | | |
| 8,968,031 B2* | 3/2015 | Simmel | ................ | H01R 13/659 439/108 |
| 8,968,033 B2* | 3/2015 | Little | ................ | H01R 13/6581 439/607.35 |
| 2010/0267261 A1 | 10/2010 | Lin | | |
| 2010/0297885 A1* | 11/2010 | Cao | ................ | H01R 4/028 439/626 |
| 2010/0311258 A1* | 12/2010 | Su | ................ | H01R 13/5213 439/136 |
| 2013/0095702 A1* | 4/2013 | Golko | ................ | H01R 13/6273 439/676 |
| 2014/0024257 A1 | 1/2014 | Castillo et al. | | |
| 2014/0206233 A1* | 7/2014 | Kao | ................ | H01R 13/6471 439/607.28 |
| 2015/0162684 A1* | 6/2015 | Amini | ................ | H01R 12/73 439/660 |
| 2015/0171562 A1* | 6/2015 | Gao | ................ | H01R 13/6582 439/345 |
| 2015/0214673 A1* | 7/2015 | Gao | ................ | H01R 13/6597 439/352 |
| 2015/0214674 A1* | 7/2015 | Simmel | ................ | H01R 13/659 439/607.35 |
| 2015/0244098 A1* | 8/2015 | Ma | ................ | H01R 24/60 439/660 |
| 2015/0295362 A1 | 10/2015 | Tziviskos et al. | | |
| 2015/0340813 A1 | 11/2015 | Ng et al. | | |
| 2015/0340815 A1 | 11/2015 | Gao et al. | | |
| 2015/0340825 A1 | 11/2015 | Ng et al. | | |

FOREIGN PATENT DOCUMENTS

| | | |
|---|---|---|
| CN | 201741935 U | 2/2011 |
| CN | 201741937 U | 2/2011 |
| CN | 102437482 A | 5/2012 |
| CN | 102544812 A | 7/2012 |
| CN | 202423735 U | 9/2012 |
| CN | 202737282 U | 2/2013 |
| CN | 103081253 A | 5/2013 |
| CN | 203242848 U | 10/2013 |
| CN | 203481540 U | 3/2014 |
| TW | M288035 | 2/2006 |
| TW | M357077 | 5/2009 |
| TW | I427870 | 6/2011 |
| TW | M414692 | 10/2011 |
| TW | M443957 | 12/2012 |
| TW | M453995 | 5/2013 |
| TW | M454654 | 6/2013 |
| WO | WO2009147791 | 12/2009 |
| WO | WO2013/020359 | 2/2013 |

OTHER PUBLICATIONS

Universal Serial Bus Type-C Cable and Connector Specification Revision 0.7 Working Draft Jan. xx, 2014.

* cited by examiner

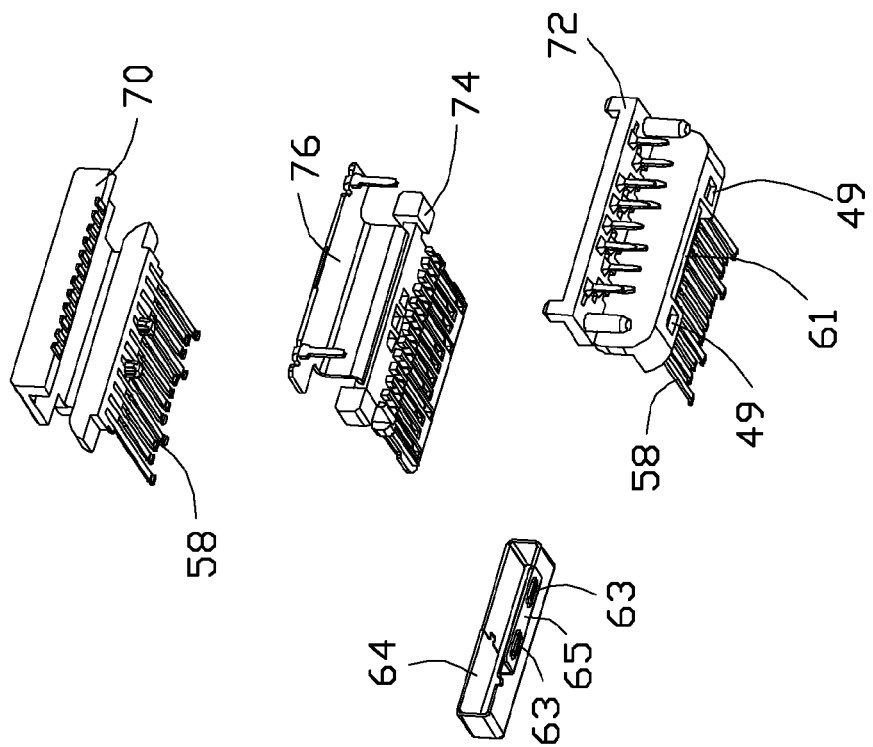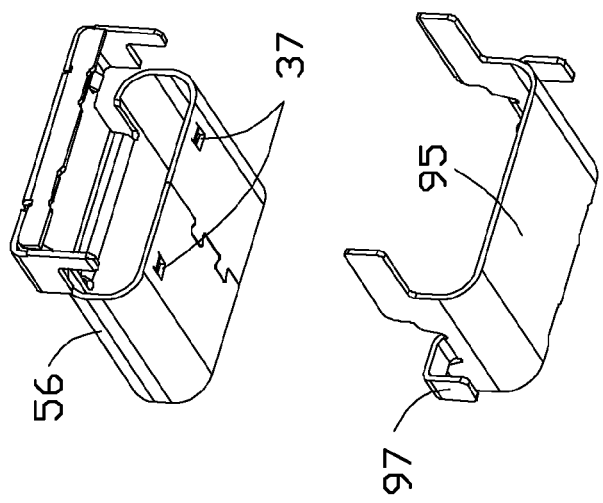
FIG. 8(B)

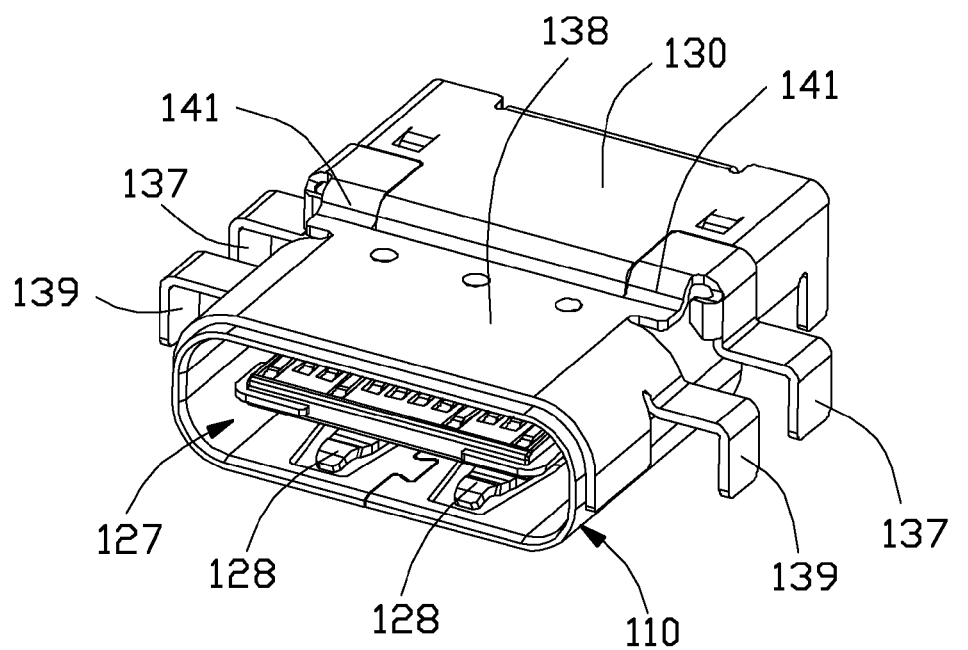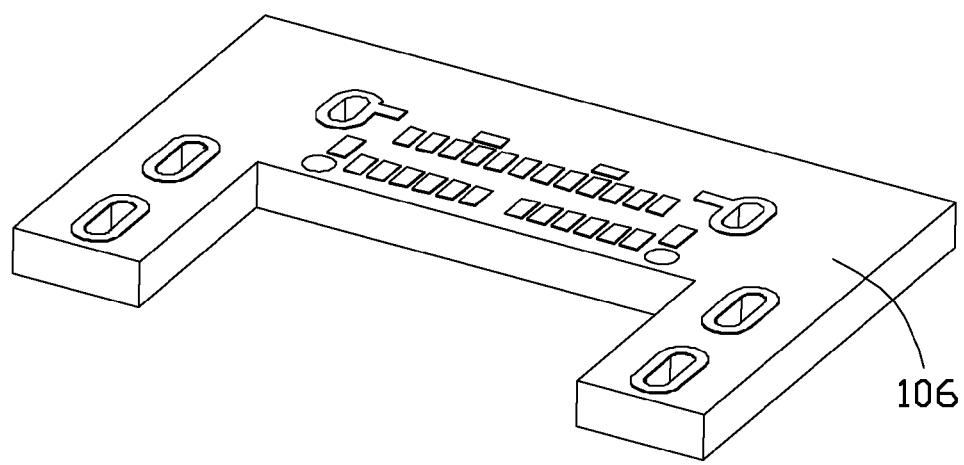
FIG. 16(A)

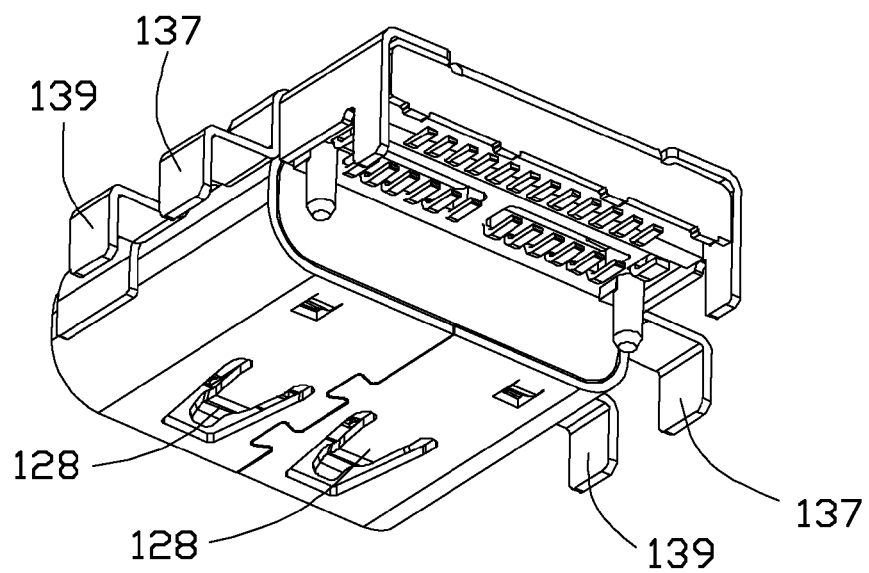
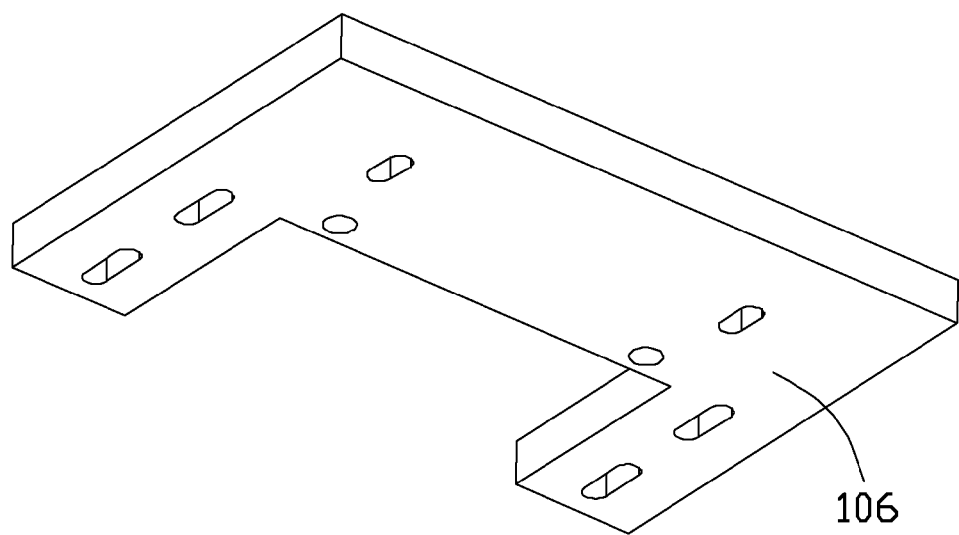
FIG. 16(B)

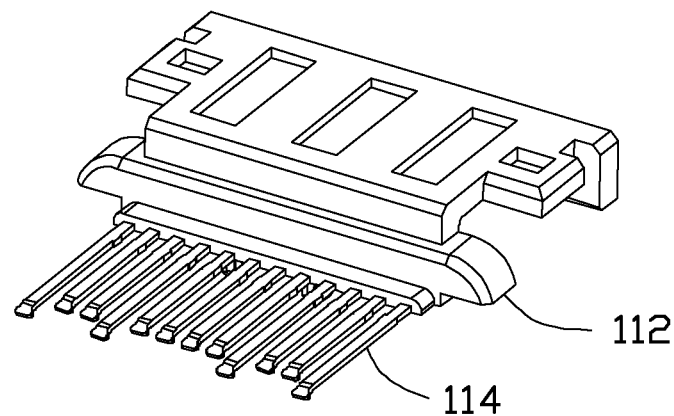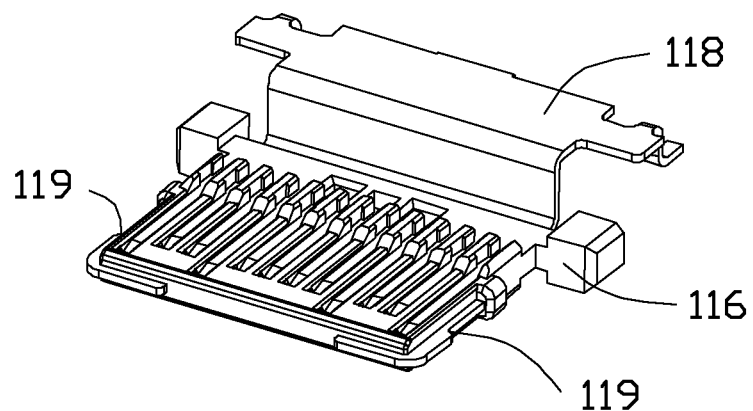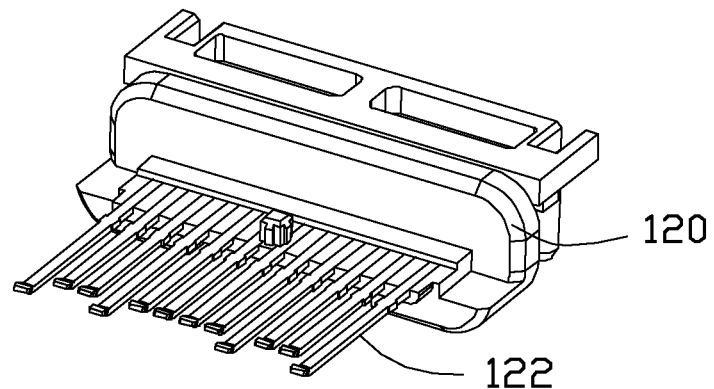
FIG. 19(A)

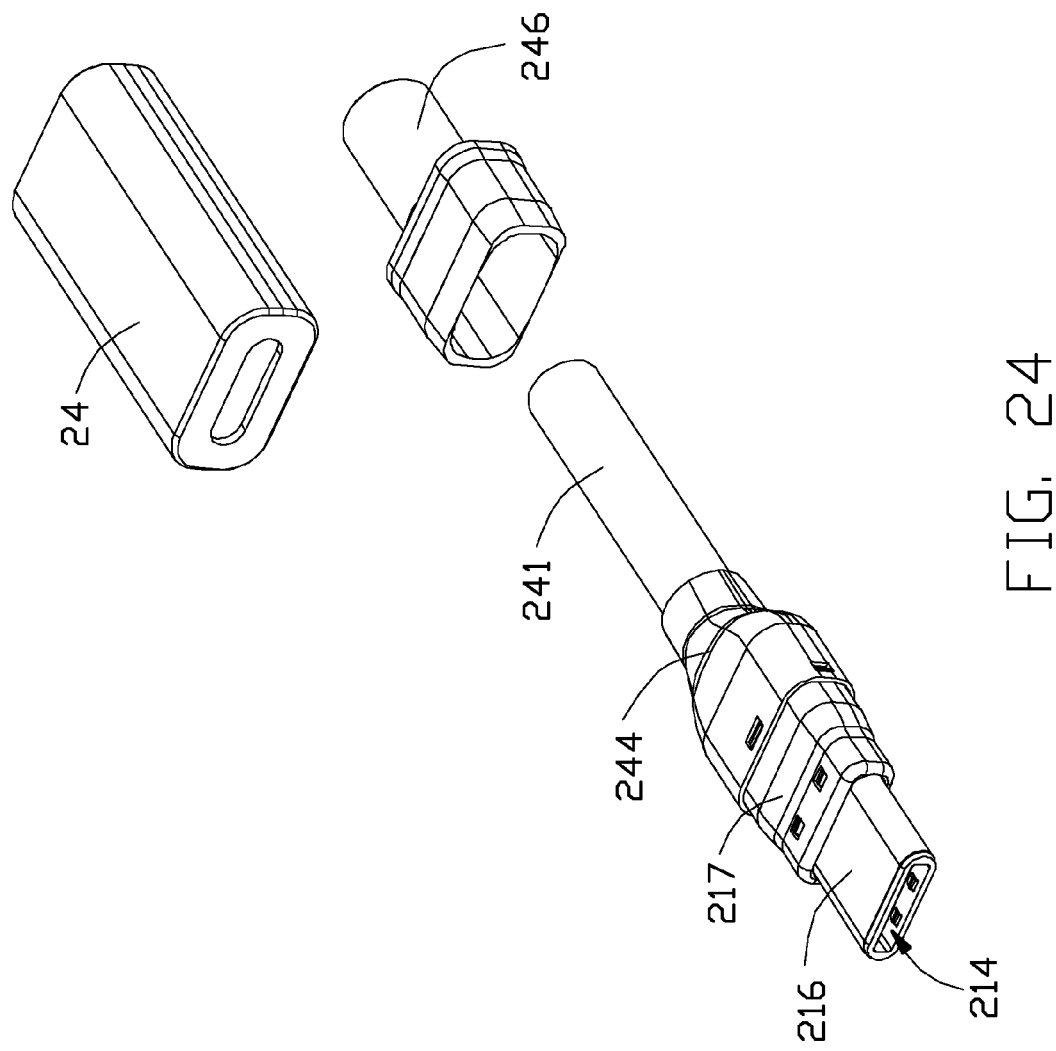

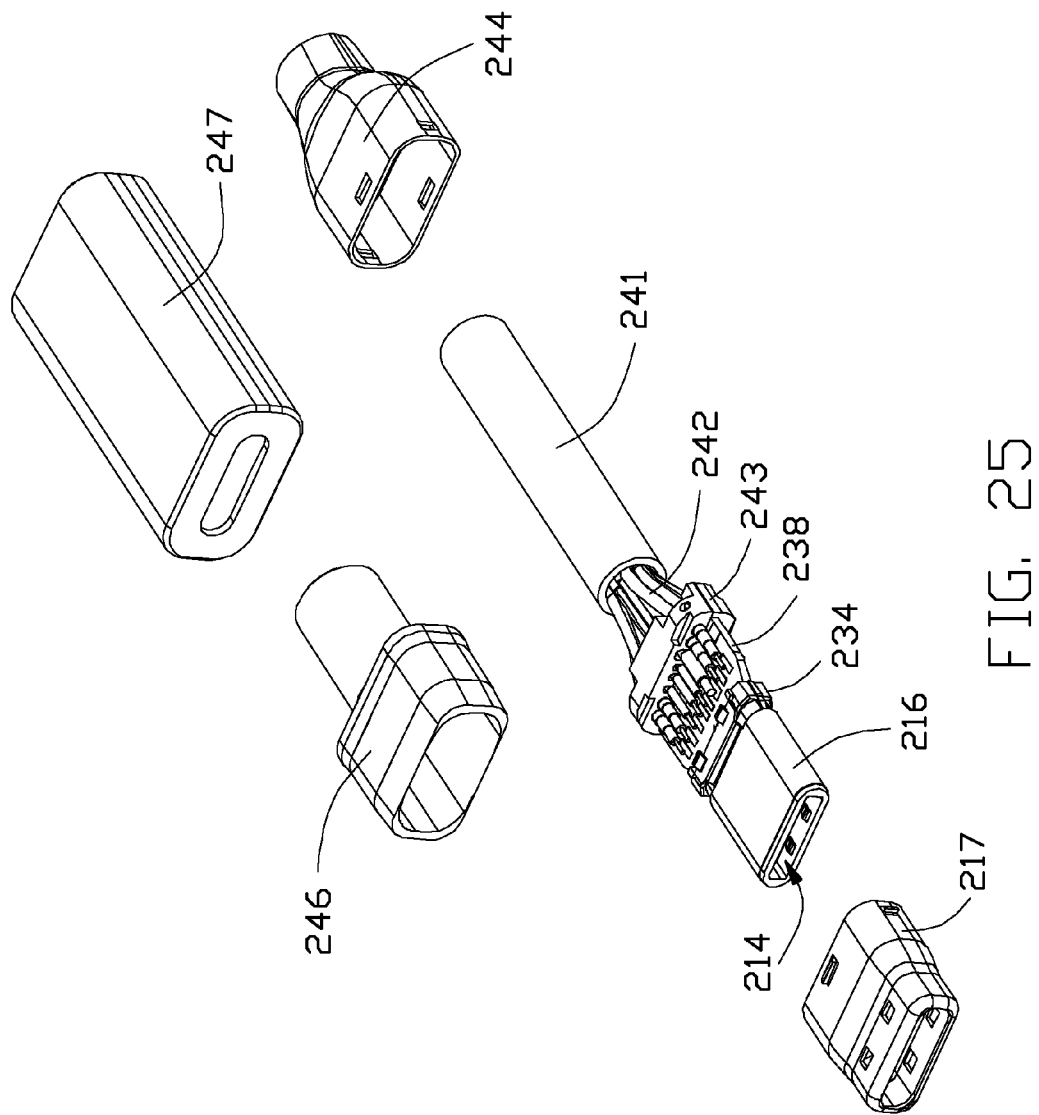

FLIPPABLE ELECTRICAL CONNECTOR

CROSS REFERENCE TO RELATED APPLICATIONS

This application is a continuation-in-part of the co-pending application Ser. No. 14/497,205 filed Sep. 25, 2014 and Ser. No. 14/558,732 filed Dec. 3, 2014 and the instant application further claims the benefit of, and priority to, U.S. Provisional Patent Application No. 61/981,217, filed Apr. 18, 2014 and No. 62/001,084, filed May 21, 2014, the contents of which are incorporated entirely herein by reference.

BACKGROUND OF THE INVENTION

1. Field of the Invention

The present invention relates to an electrical connector, and more particularly to a flippable plug connector used with a receptacle connector.

2. Description of Related Art

In the previously filed provisional applications, the plug connector is "flippable" whereas we turn the plug over and it functions the same top and bottom. In order to be able to handle switching of the super speed signaling, a MUX (or SS switch) is built into the silicon. This can be costly and also cause some additional degredation in the super speed signals. Recently, a proposal for use with the future USB (Universal Serial Bus) was presented.

Hence, a new and simple electrical plug connector and the complementary receptacle connector are desired to improve those disclosed in the aforementioned proposal.

SUMMARY OF THE INVENTION

Accordingly, the object of the present invention is to provide a flippable plug connector and a complementary receptacle connector wherein the plug connector forms a capsular front contour and includes an insulative housing defining a rectangular receiving cavity therein and enclosed in the metallic shell. Two upper and lower rows of contacts are disposed in the housing with corresponding contacting sections extending into two opposite upper and lower sides the receiving cavity wherein the upper and lower rows of contacts are diagonally symmetrically arranged with each other in both electrical and mechanical arrangement so as to meet the so-called flappable mating, i.e., the dual orientations.

The corresponding receptacle connector includes an insulative housing enclosed with a metallic shield with a forwardly extending mating tongue with a capsular mating cavity formed by the shield. Two opposite upper and lower rows of contacts are disposed in the housing with corresponding contacting sections exposed upon two opposite surfaces of the mating tongue wherein the upper and lower rows of contacts are diagonally symmetrically arranged with each other for both electrical and mechanical arrangement so as to perform the so-called flappable mating with the corresponding plug connector.

Other objects, advantages and novel features of the invention will become more apparent from the following detailed description when taken in conjunction with the accompanying drawings.

BRIEF DESCRIPTION OF THE DRAWINGS

FIG. 8(B) is a rear partially exploded perspective view of the receptacle connector of FIG. 5(B) wherein the housing and the contacts are pre-assembled together.

FIG. 9(A) is a cross-sectional view of the receptacle connector to show the extending plate of the collar.

FIG. 16(A) is a front exploded perspective view of the receptacle connector away from the printed circuit board of FIG. 15(A).

FIG. 16(B) is a rear exploded perspective view of the receptacle connector away from the printed circuit board of FIG. 15(B).

FIG. 19(A) is a further front exploded perspective view of the receptacle connector of FIG. 18(A).

FIG. 24 is a further front exploded perspective view of the plug connector of FIG. 23.

FIG. 25 is a further front exploded perspective view of the plug connector of FIG. 24.

DETAILED DESCRIPTION OF THE PREFERRED EMBODIMENT

Reference will now be made in detail to the preferred embodiment of the present invention.

Figure 1:
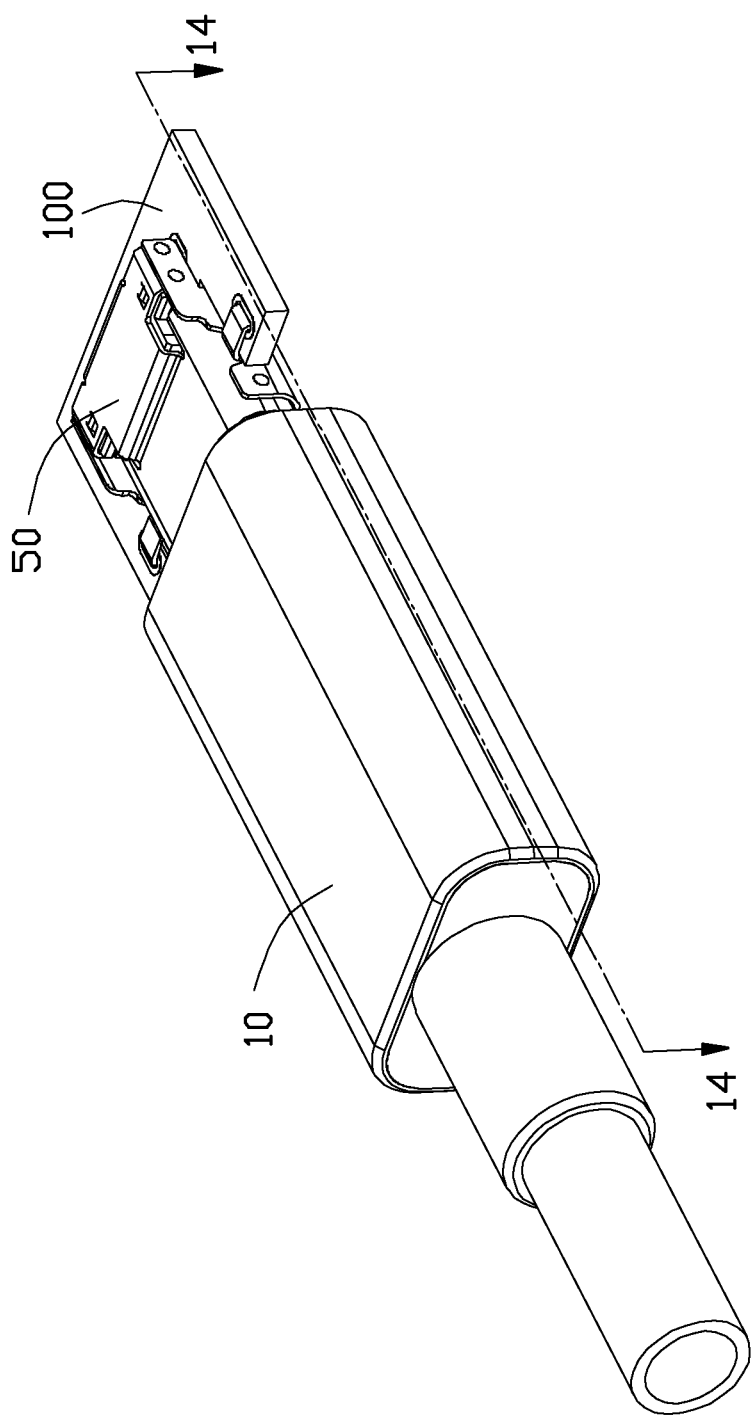
FIG. 1 is an assembled perspective view of a mated receptacle connector on the printed circuit board and a plug connector of a first embodiment of the instant invention.
Figure 2A:
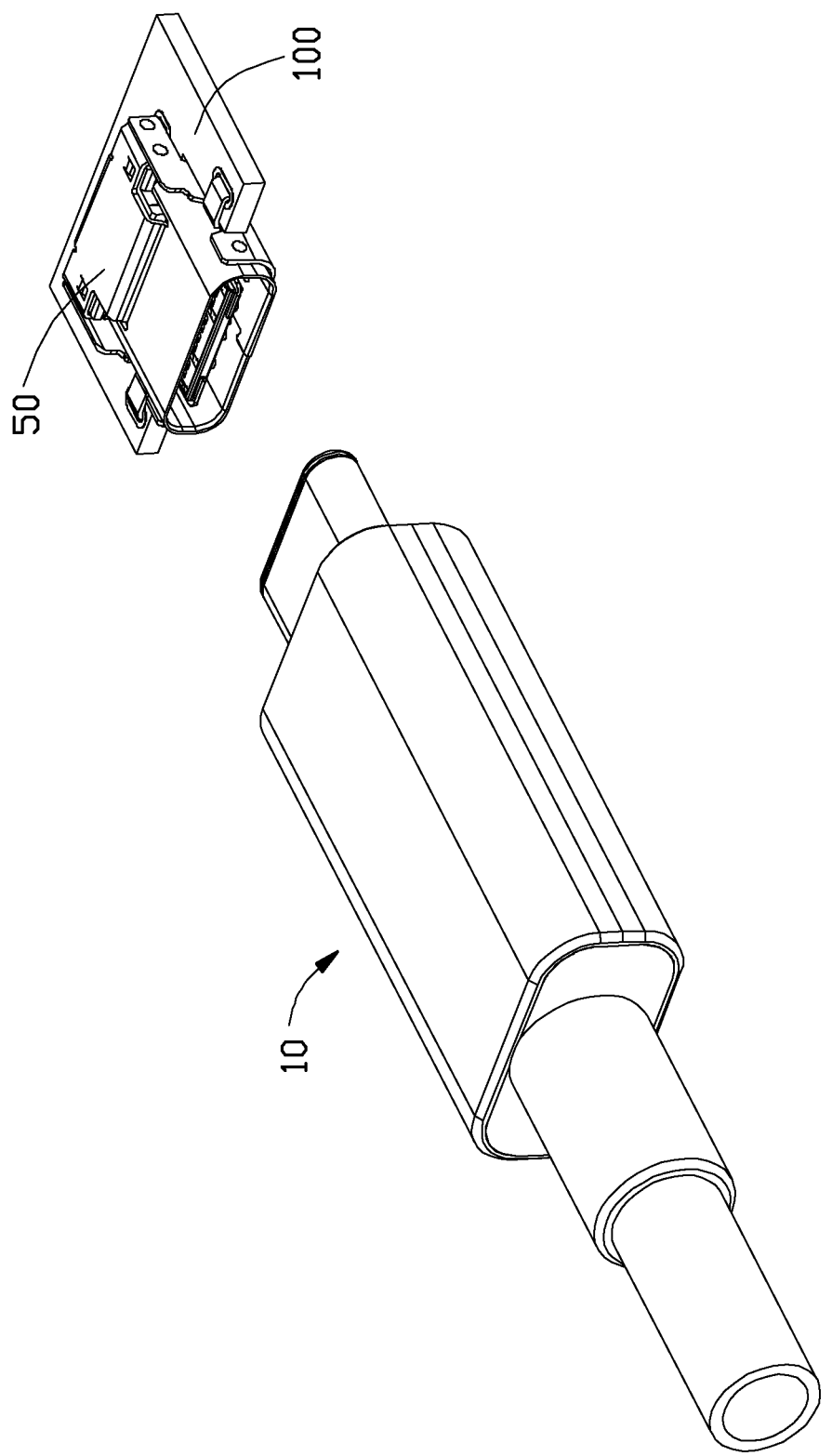
FIG. 2(A) is a front exploded perspective view of the receptacle connector and the plug connector of FIG. 1.
Figure 2B:
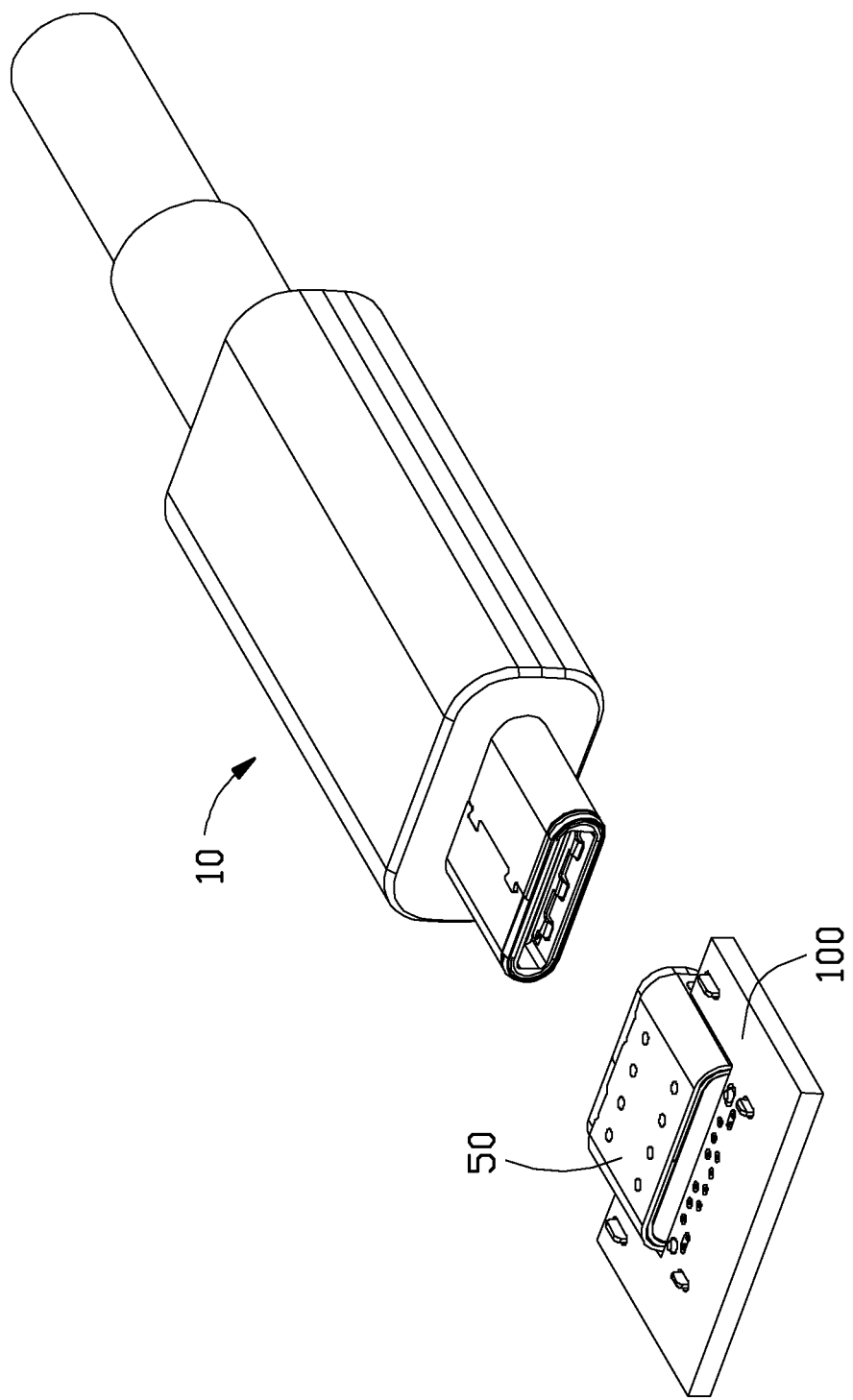
FIG. 2(B) is a rear exploded perspective view of the receptacle connector and the plug connector of FIG. 1.
Figure 3:
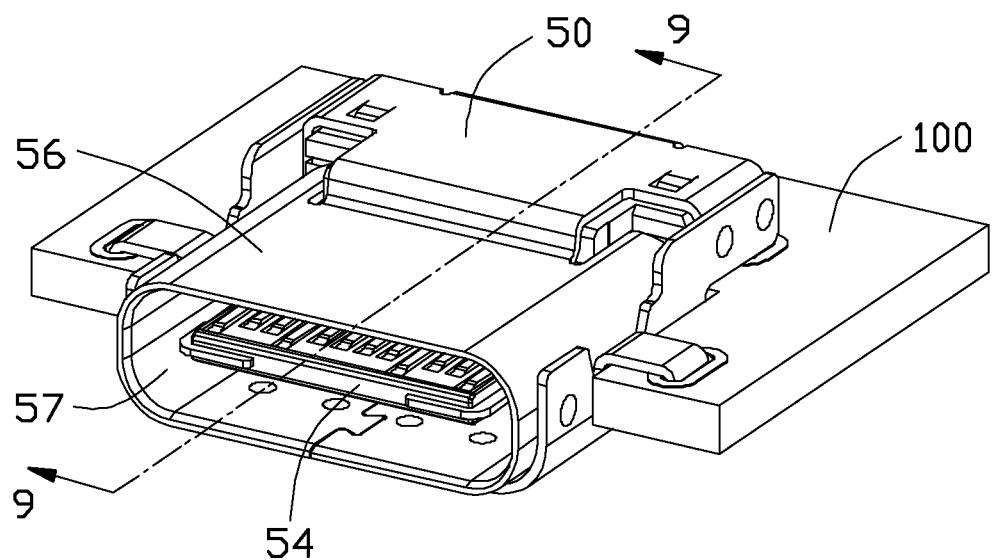
FIG. 3 is a front perspective view of the receptacle connector on the printed circuit board of FIG. 1.
Figure 4:
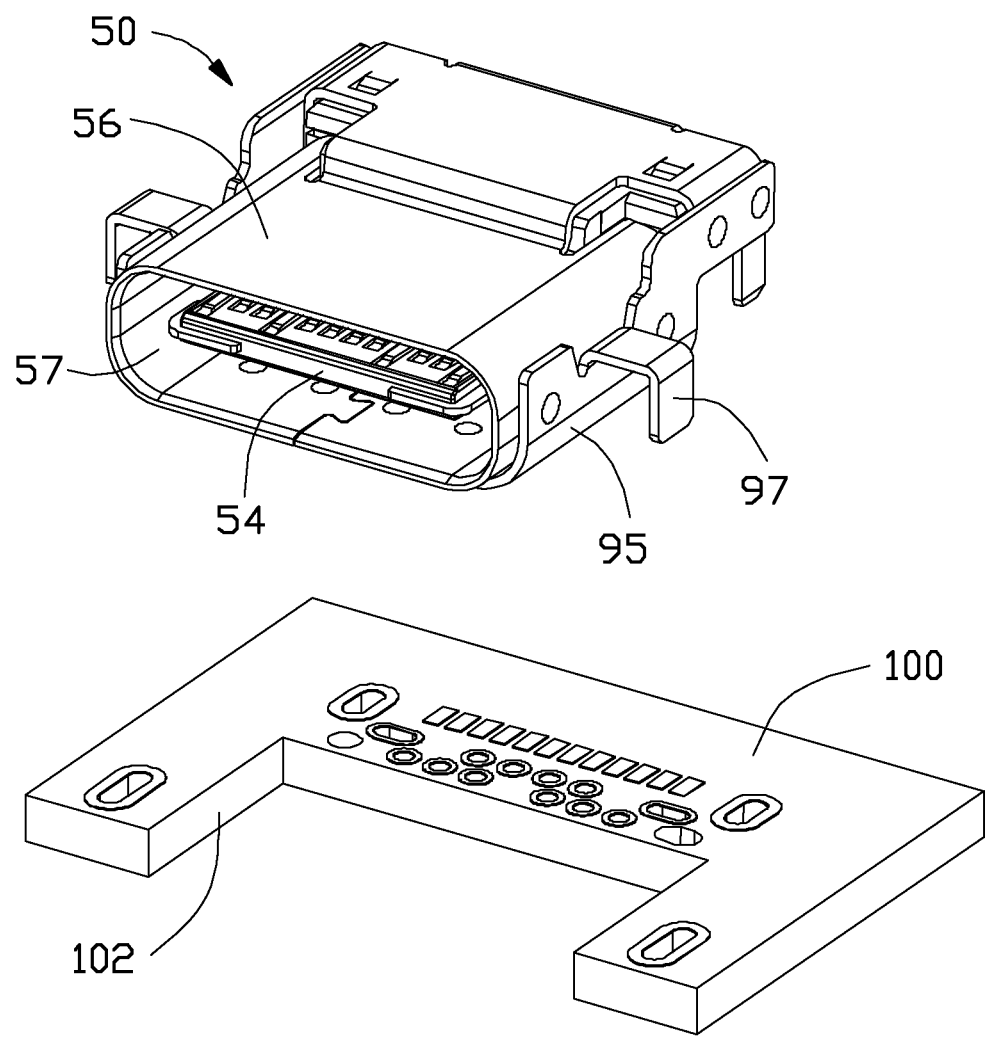
FIG. 4 is a front perspective view of the receptacle connector spaced from the printed circuit board of FIG. 3.
Figure 5A:
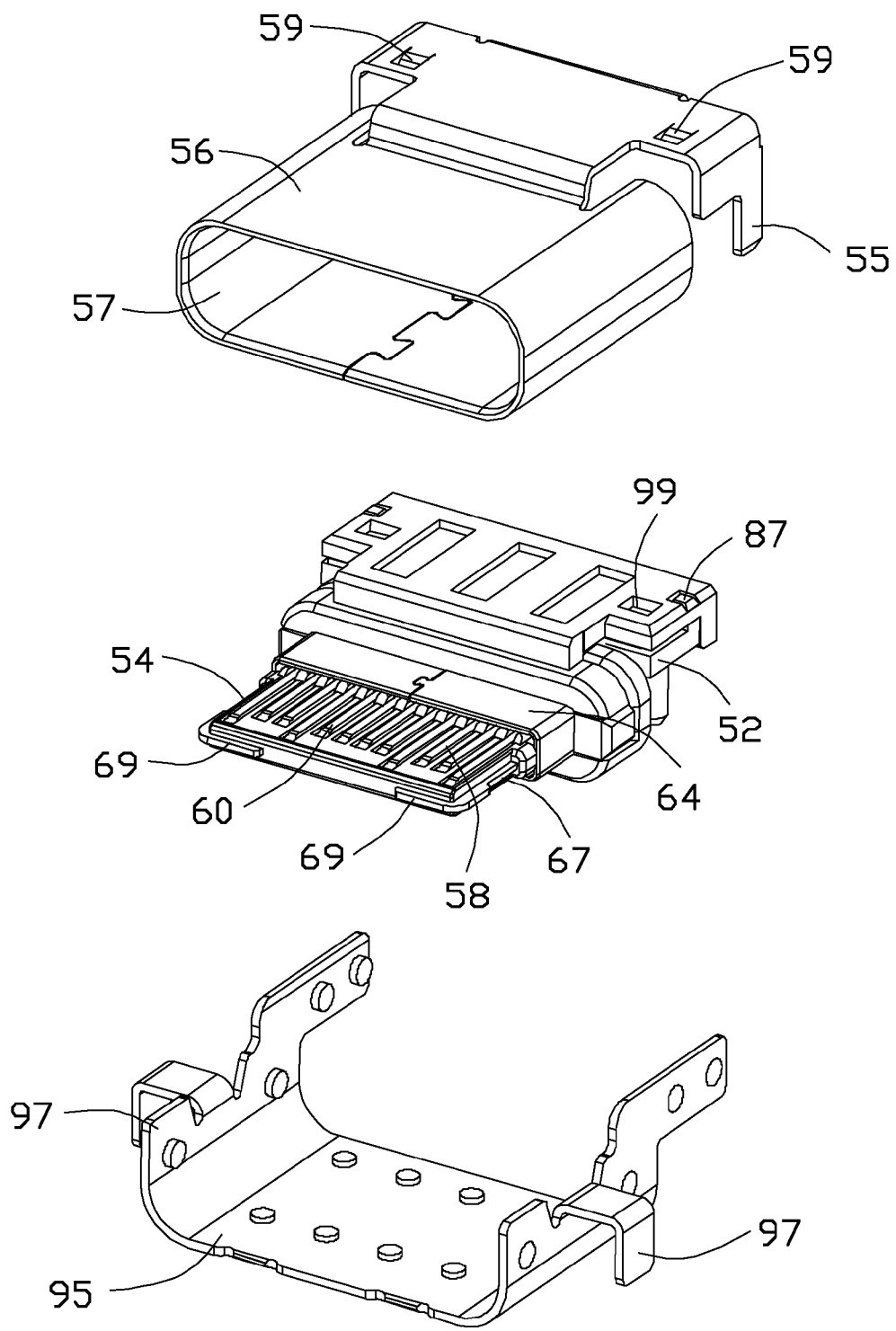
FIG. 5(A) is a front partially exploded perspective view of the receptacle connector of FIG. 4.
Figure 5B:
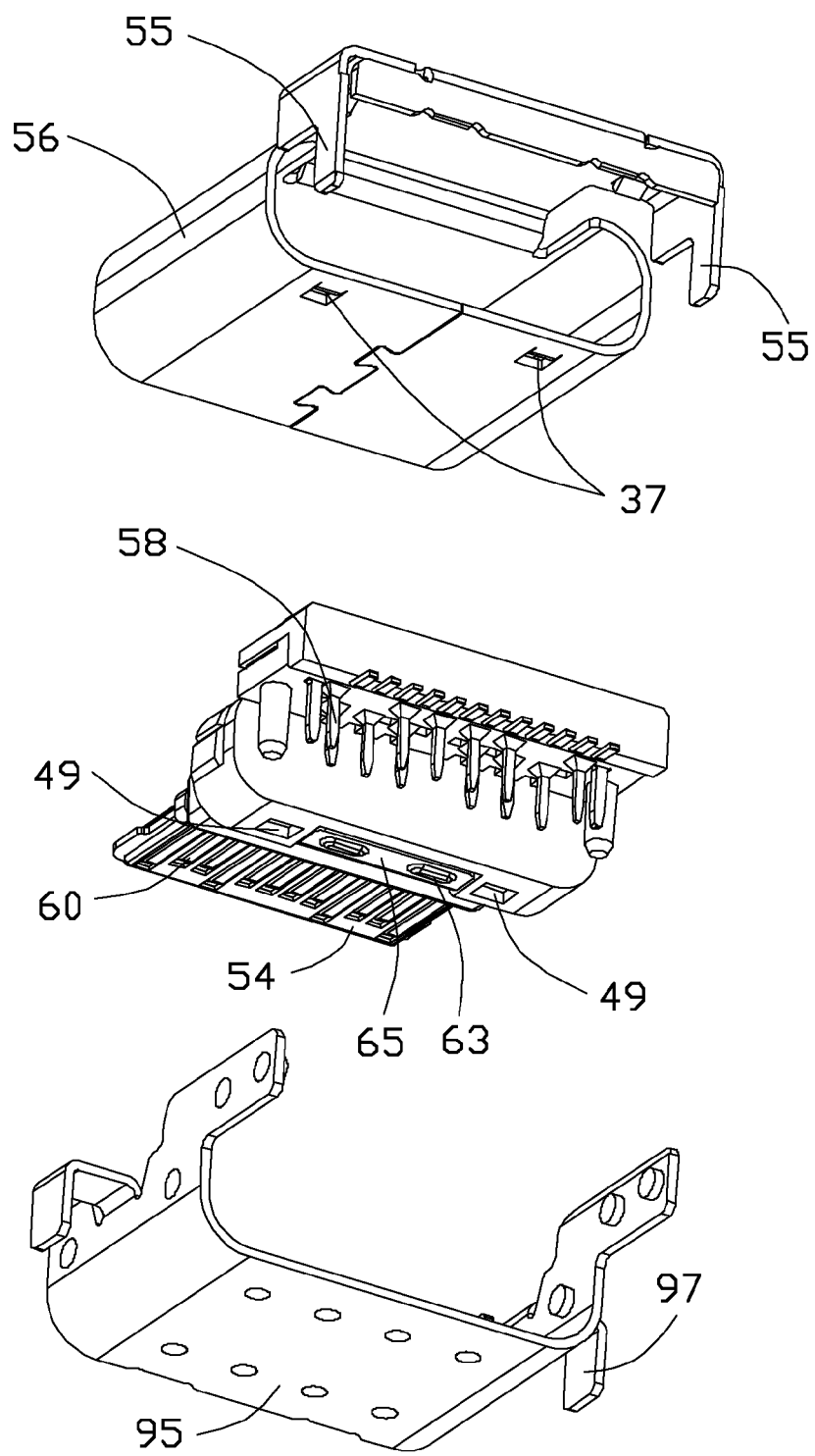
FIG. 5(B) is a rear partially exploded perspective view of the receptacle connector of FIG. 4.
Figure 6:
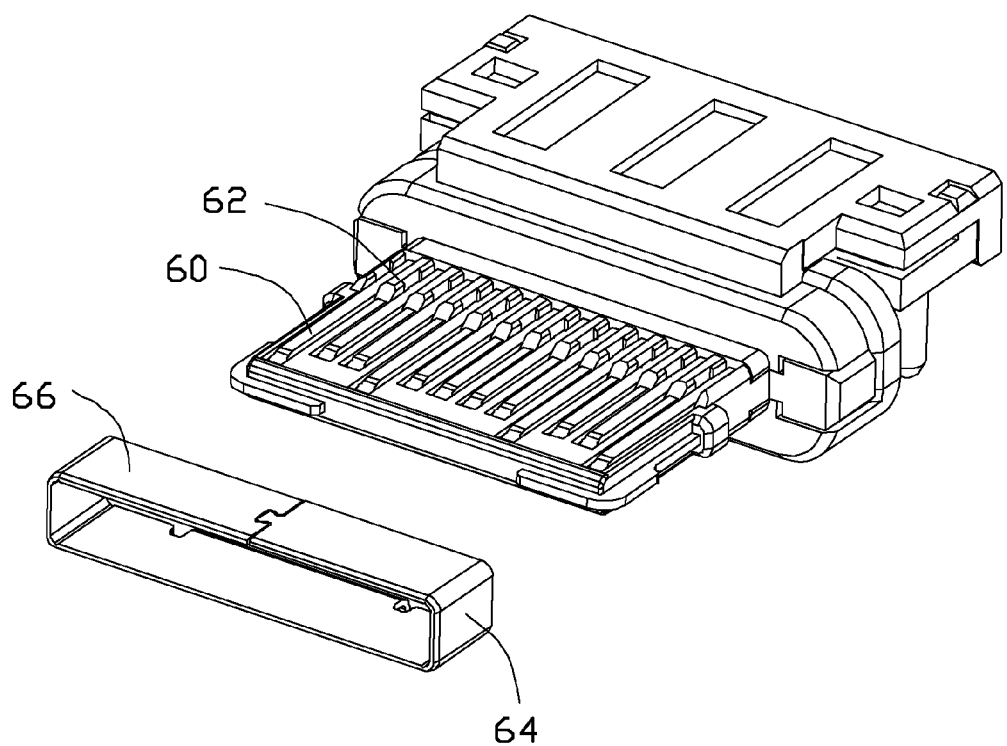
FIG. 6 is a front partially exploded perspective view of the receptacle connector of FIG. 5(A) without the shield thereof.
Figure 7A:
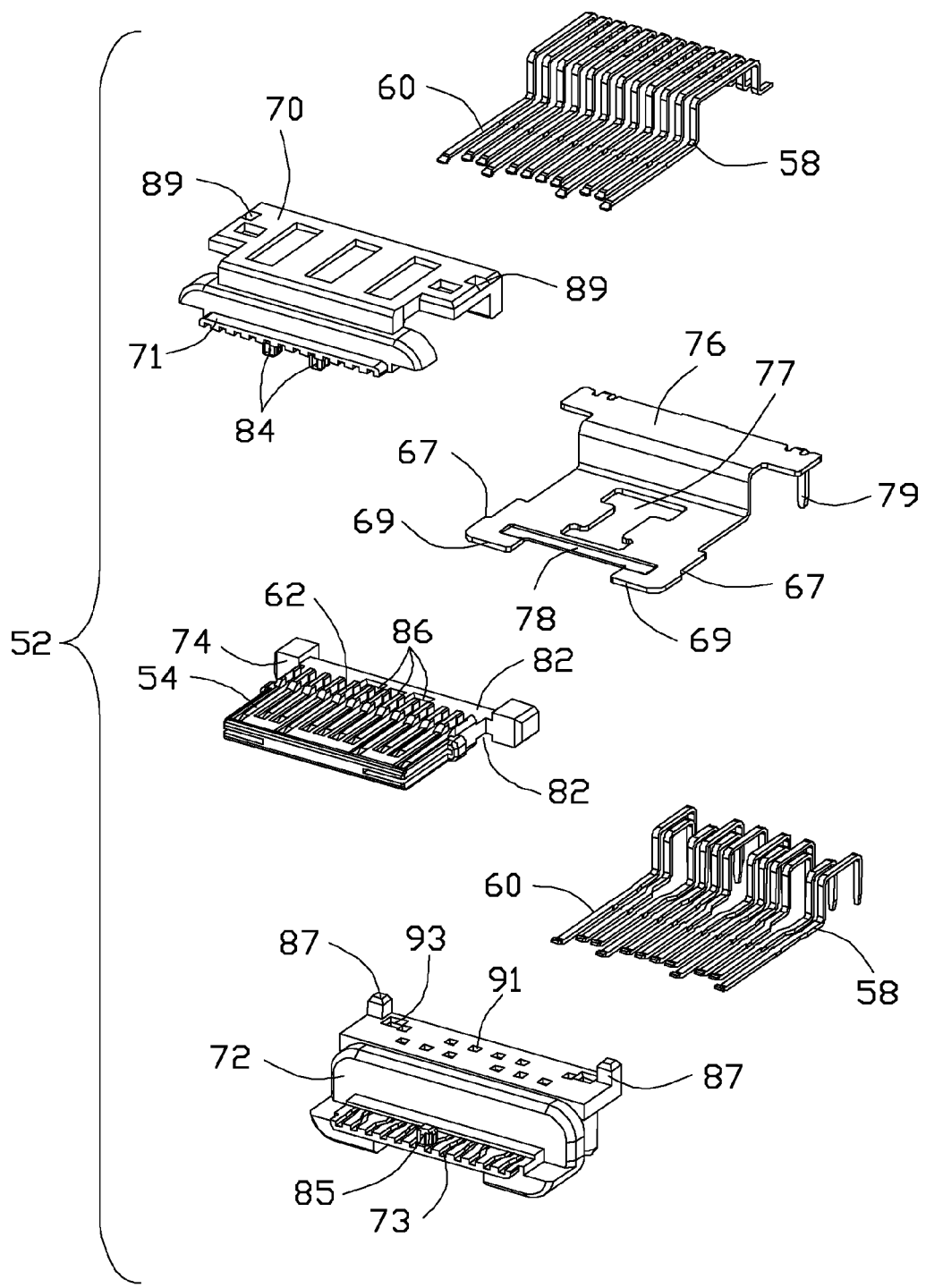
FIG. 7(A) is a front partially exploded perspective view of the receptacle connector of FIG. 5(A) to show the housing and the contacts thereof.
Figure 7B:
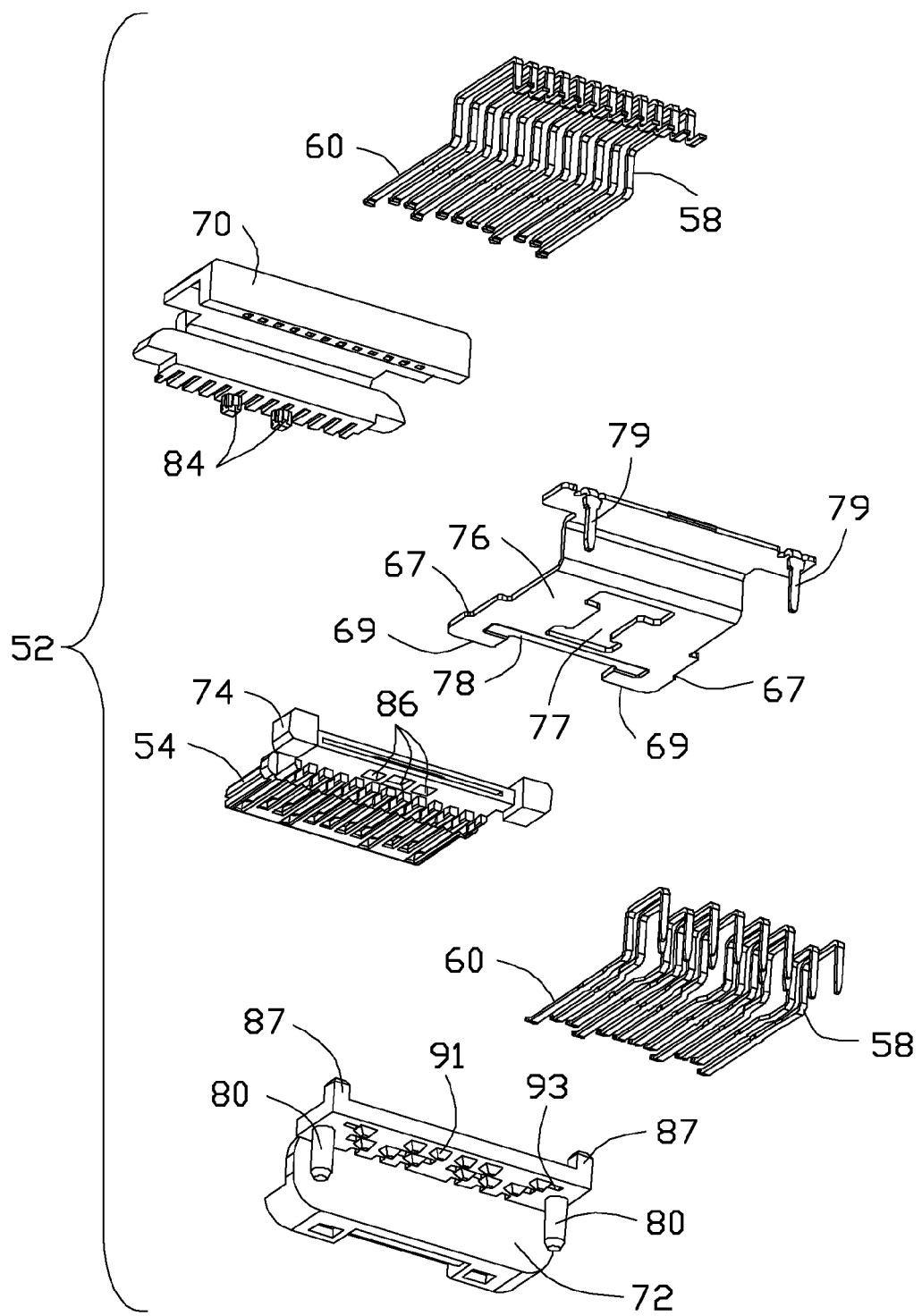
FIG. 7(B) is a rear partially exploded perspective view of the receptacle connector of FIG. 5(B) to show the housing and the contacts thereof.
Figure 8A:
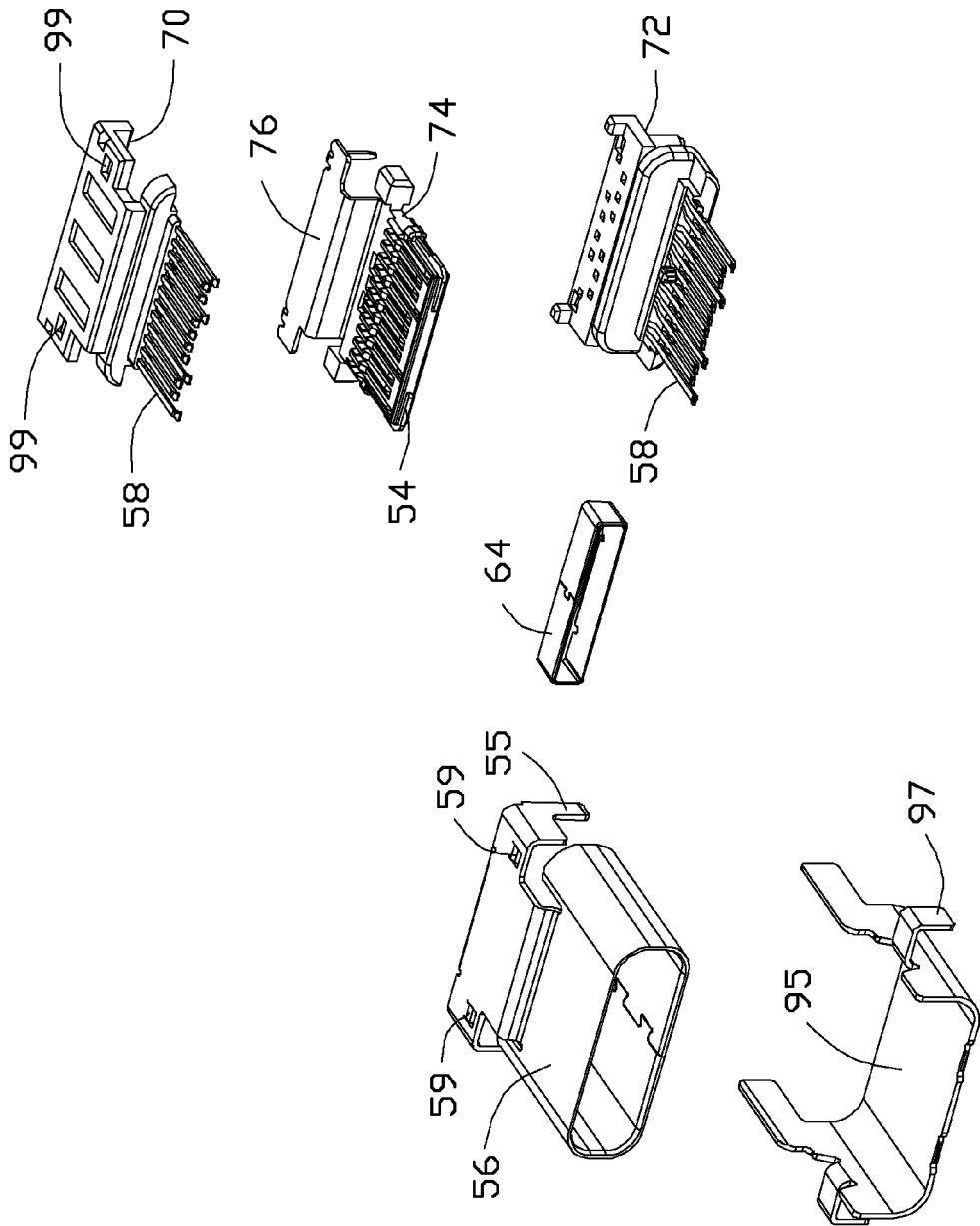
FIG. 8(A) is a front partially exploded perspective view of the receptacle connector of FIG. 5(A) wherein the housing and the contacts are pre-assembled together.
Figure 9:
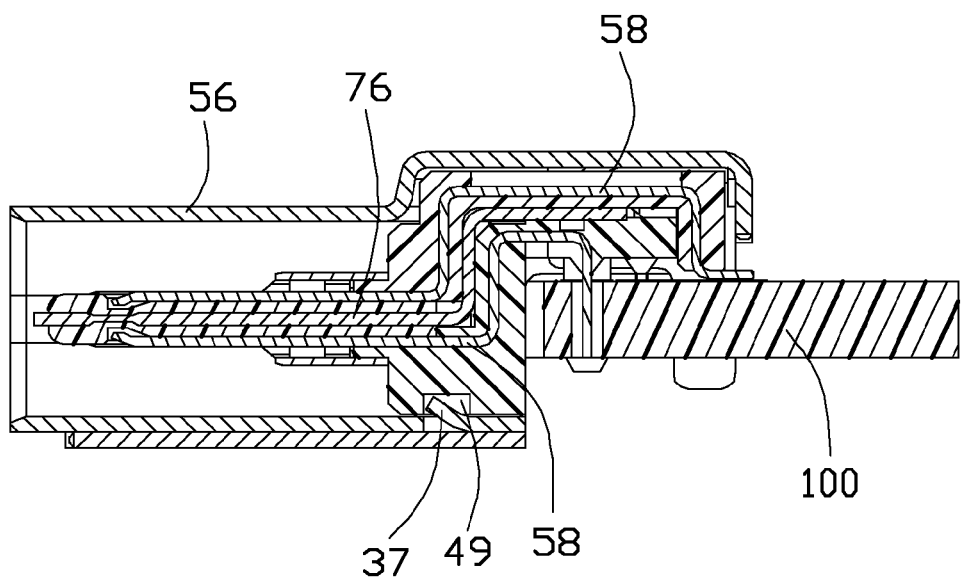
FIG. 9 is a cross-sectional view of the receptacle connector on the printed circuit board of FIG. 3 to show the retention tang of the shield.
Figure 9:
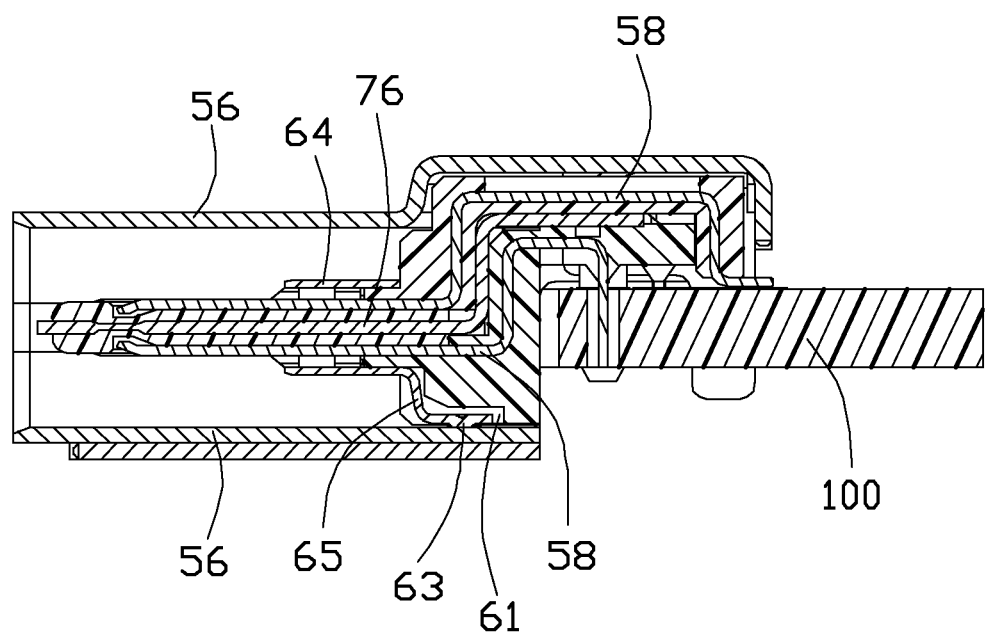
Figure 10:
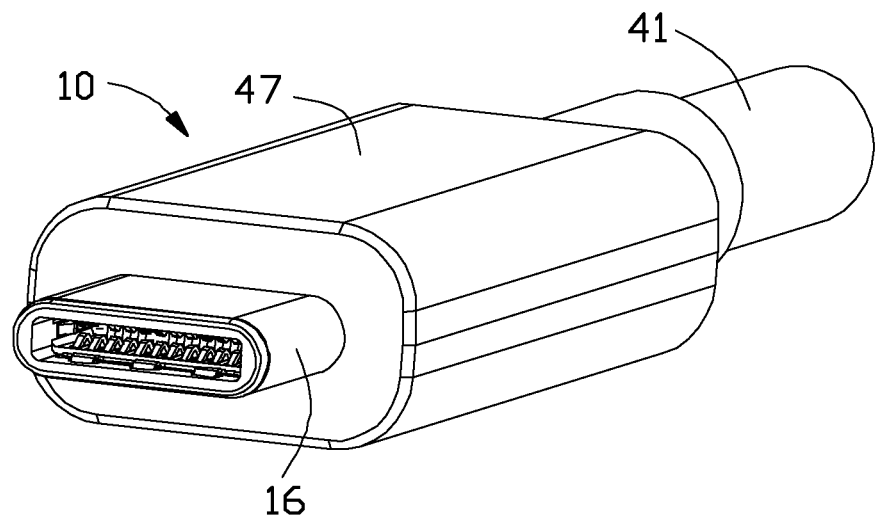
FIG. 10 is a front assembled perspective view of the plug connector of FIG. 1.
Figure 11A:
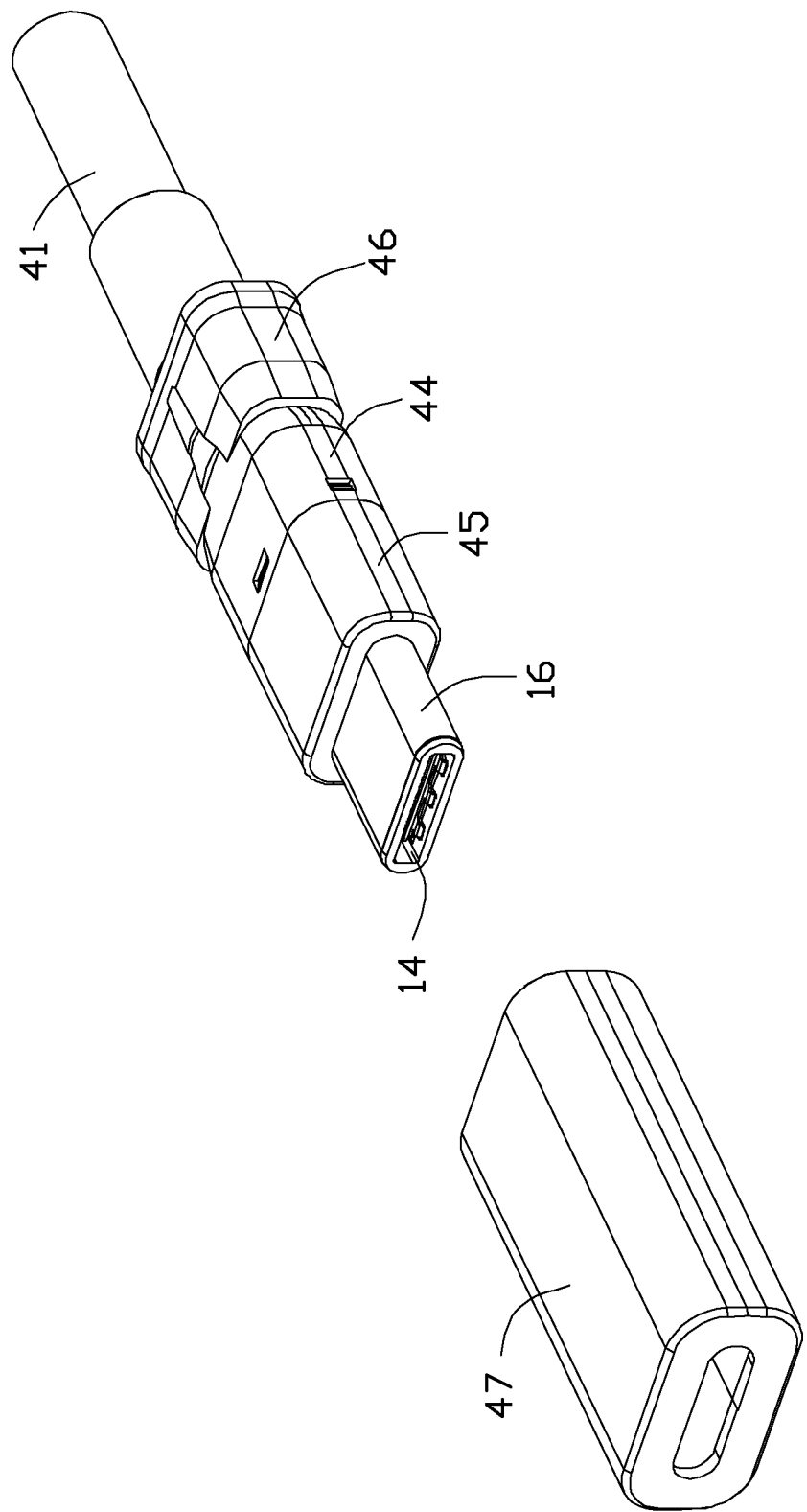
FIG. 11(A) is a front partially exploded perspective view of the plug connector of FIG. 10 wherein the cover is removed away from the remainder.
Figure 11B:
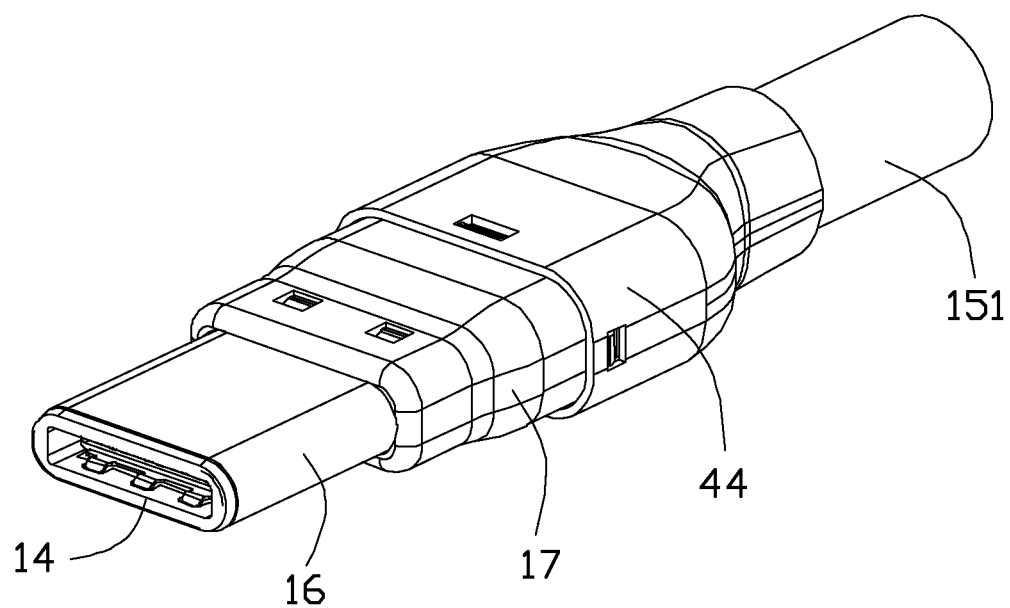
FIG. 11(B) is a front partially exploded perspective view of the plug connector of FIG. 11(A) wherein the front and rear over-moldings have been further removed.
Figure 12A:
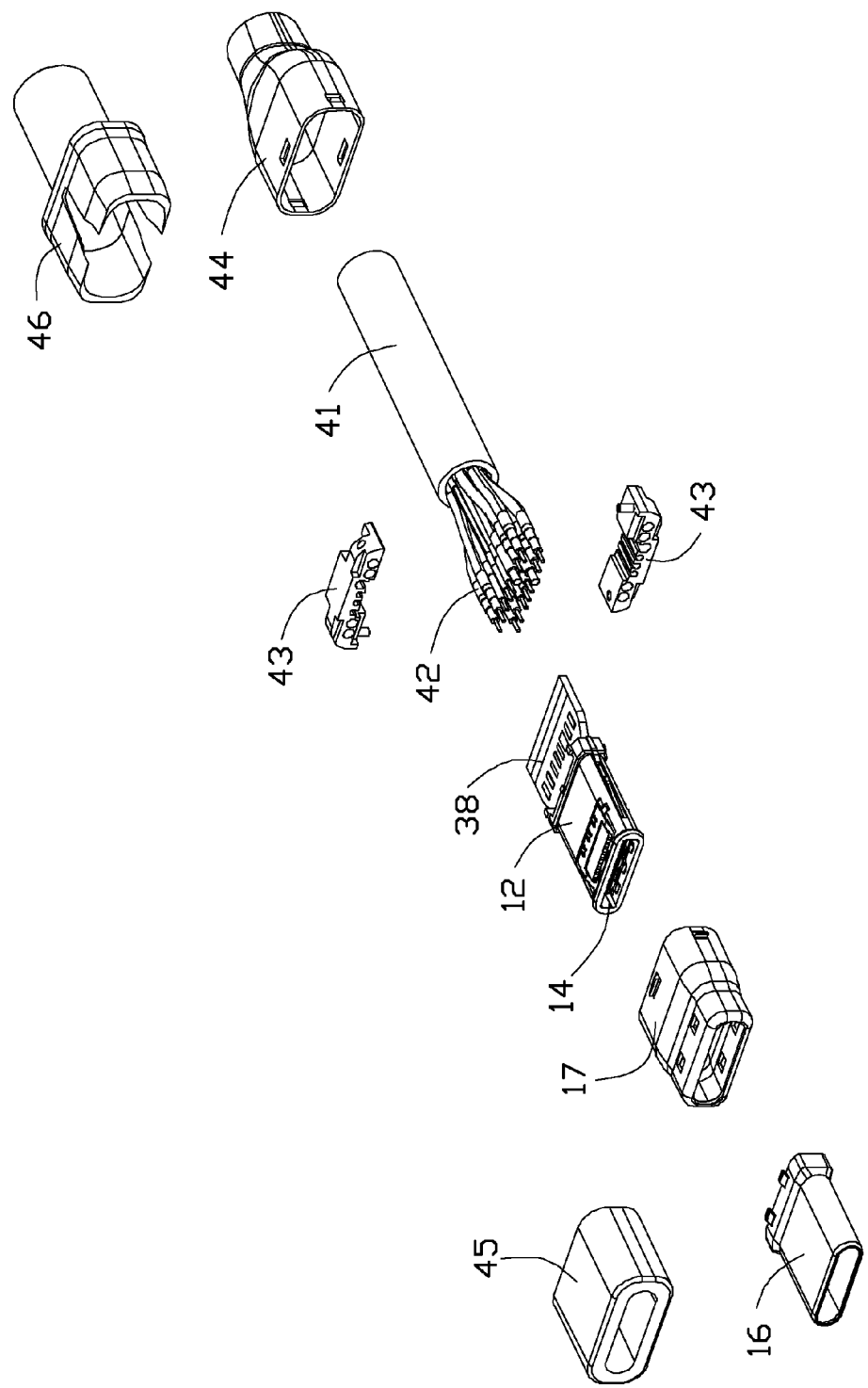
FIG. 12(A) is a front partially exploded perspective view of the plug connector of FIG. 10 without the cover thereof.
Figure 12B:
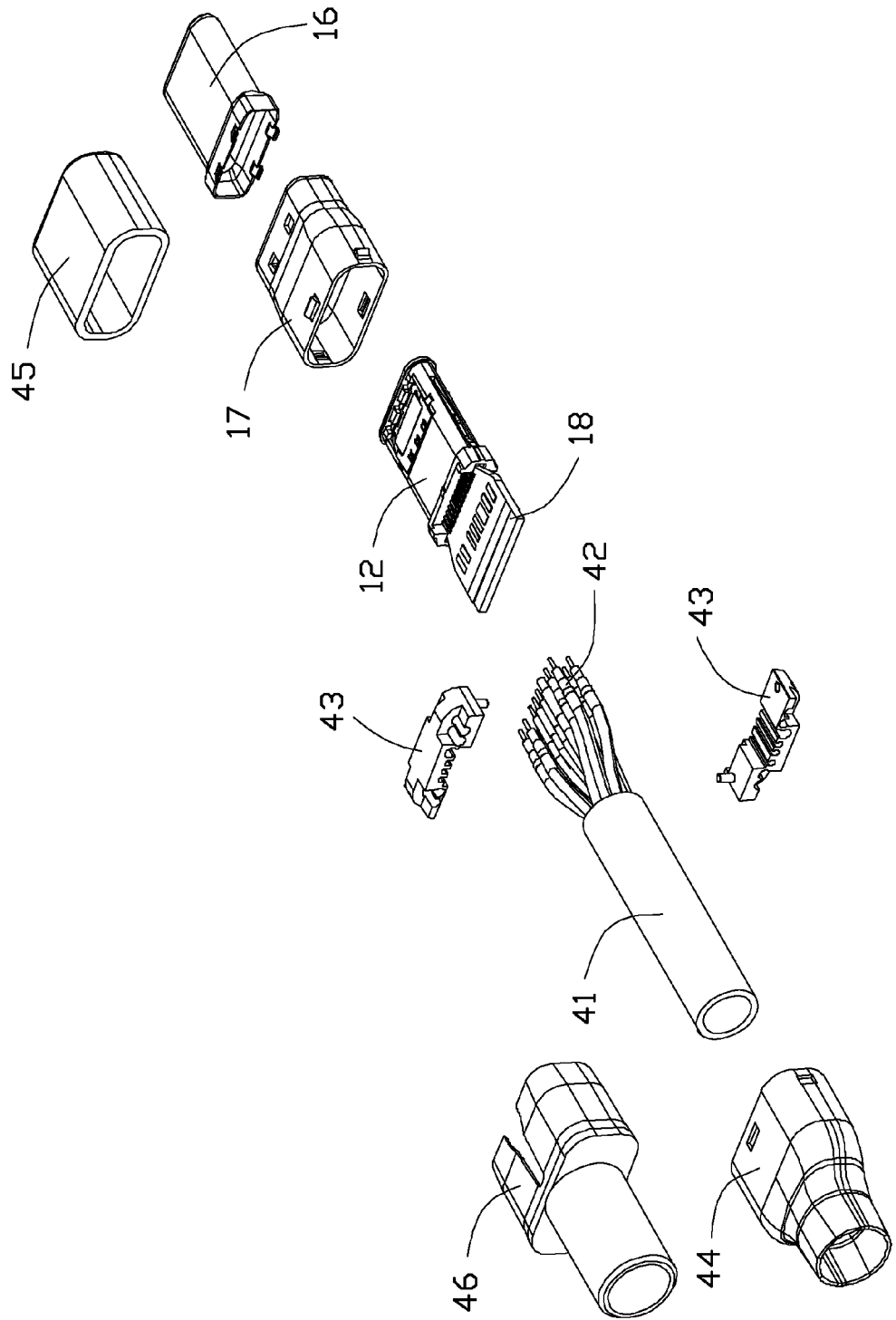
FIG. 12(B) is a rear partially exploded perspective view of the plug connector of FIG. 12(A).
Figure 13A:
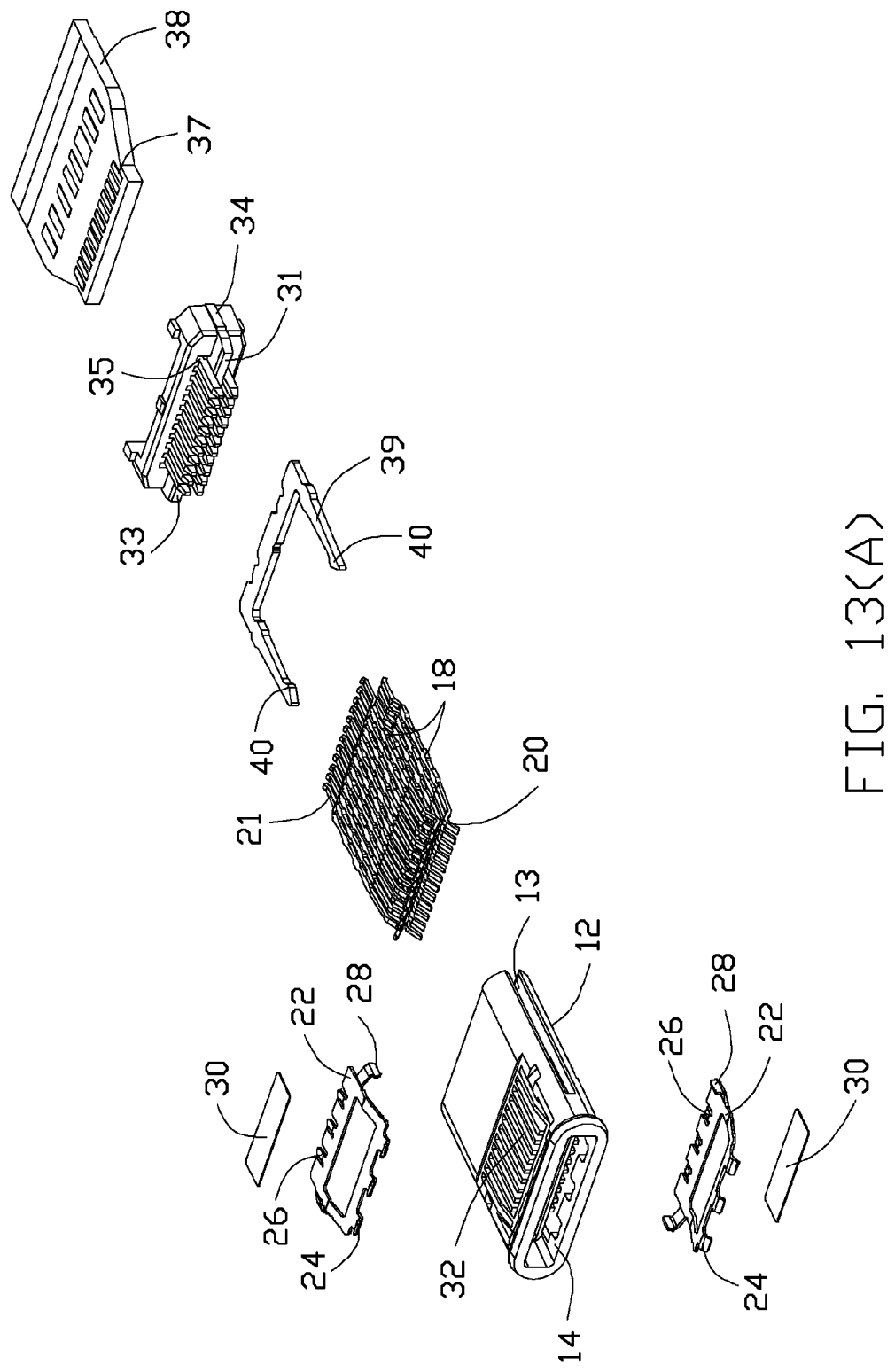
FIG. 13(A) is a front partially exploded perspective view of the plug connector of FIG. 12(A) by removal of additional parts therefrom.
Figure 13B:
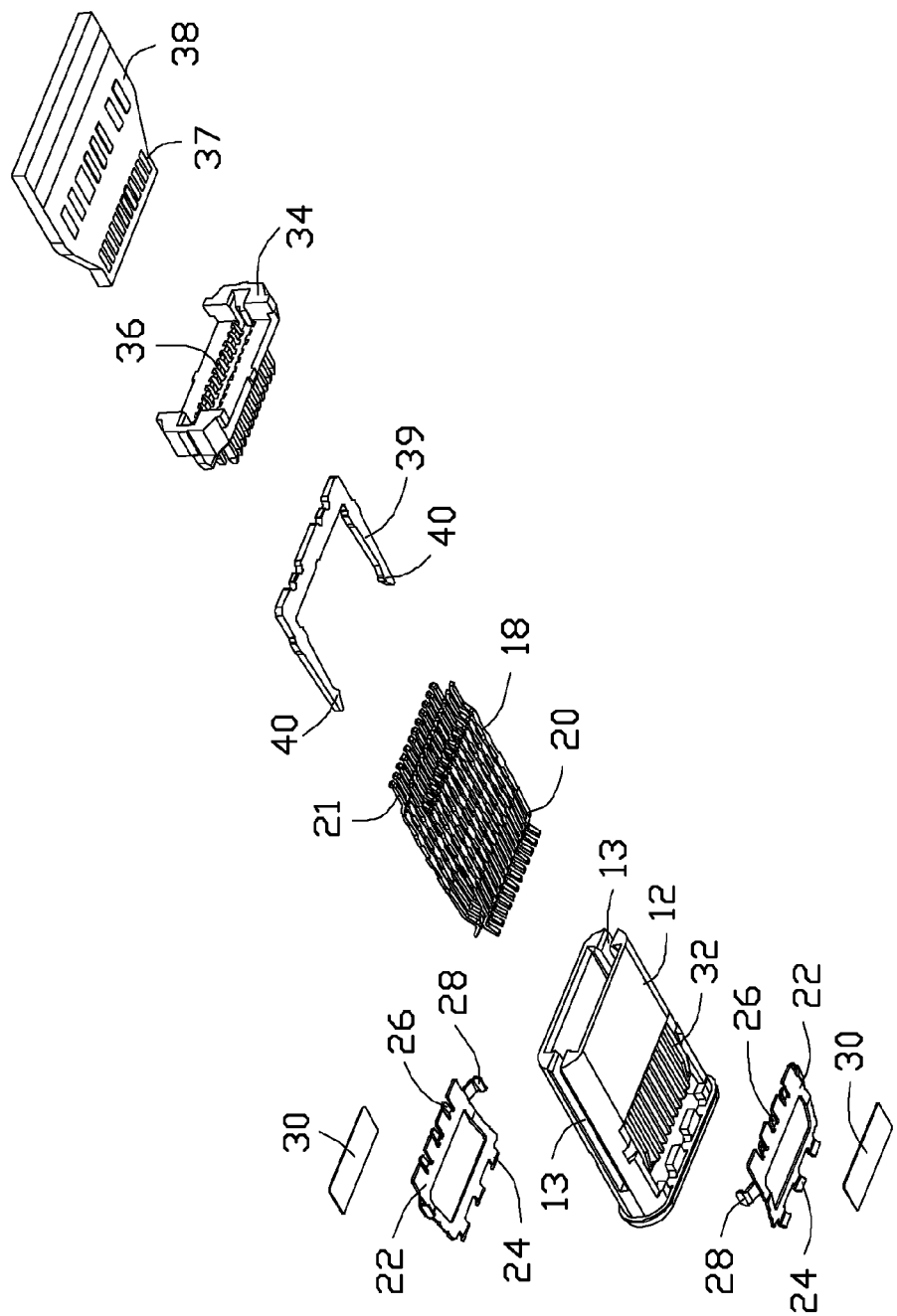
FIG. 13(B) is a rear partially exploded perspective view of the plug connector of FIG. 13(A).

FIGS. 1-2(B) show a plug connector 10 mated with a receptacle connector 50 mounted in a notch 102 of a printed circuit board. 100, of a first embodiment of this present invention. Referring to FIGS. 3-9, the receptacle connector 50 includes an insulative housing 52 with a mating tongue 54 forwardly extending in a capsular mating cavity 57 of a metallic shield 56 which encloses the housing 52. Opposite upper and lower rows of contacts 58 are disposed in the housing 52 with corresponding contacting sections 60 exposed upon opposite surfaces of the mating tongue 54 in a diagonally symmetrical arrangement mechanically and electrically so as to allow a so-called flappable insertion of the plug connector 10 thereinto. A step structure 62 is formed around a root of the mating tongue 54. A one piece metallic EMI collar 64 includes a loop structure 66 intimately surrounding the step structure 62. The collar 64 further includes an L-shaped extending plate 65 equipped with embossments 63 thereon and received in the recess 61 of the lower piece 72 of the housing 52 (illustrated later) for mechanically and electrically connecting to the shield 56. The detailed structures of EMI collar 64 may be also referred to the embodiment disclosed in FIGS. 21(A)-26.

The housing 52 is composed of the upper piece 70 and a lower piece 72 commonly sandwiching therebeween a middle piece 74 which forms the mating tongue 54. The upper row contacts 58 are associated with the upper piece 70, the lower row contacts 58 are associated with a lower piece 72 and the shielding plate 76 is associated with the middle piece 74 via an insert molding process wherein the contacting sections 60 of the upper row contacts 58 and those of the lower rows contacts 58 are seated upon opposite upper surface and lower surface of the mating tongue 54, respectively, as mentioned before. A rear portion of the step structure 62 is removed to have a front edge region 71 of the upper piece 70 and the front edge region 73 of the lower piece 72 sandwiched between the middle piece 74 and the loop structure 66 of the EMI collar 64 so as to enhance the strength during mating under some bending. In this embodiment, the shielding plate 76 defines an opening 77 and a thinner area 78 for both securing and impedance consideration, and further a pair of mounting legs 79 so as to efficiently separate the upper row contacts 58 and the lower row contacts 58 from each other wherein the upper row contacts 58 form the surface mount type tail sections while the lower row contacts 58 form the through hole type tail sections. In an alternate embodiment, the thinner area 78 may be totally removed from the shielding plate 76. The lower piece 72 includes a pair of mounting posts 80 receiving in the corresponding through hole for mounting the housing 52 to the printed circuit board 100. The lower piece 72 further forms a pair of recessions 49 to receive the corresponding retention tangs 37 of the shield 56.

In this embodiment, the middle piece 74 forms a pair of recesses 82 to respectively receive the corresponding protrusions 84 of the upper piece 70 and the lower piece 72 for securing the upper piece 70, the lower piece 72 and the middle piece 74 therebetween in a stacked manner wherein the upper piece 70 further include a pair of downward assembling poles 84 received in the corresponding alignment holes 86 of the middle piece 74, and the lower piece 72 further includes an upward assembling pole 85 received in the corresponding alignment holes 86 of the middle piece 74, and the lower piece 72 further forms a pair of upward locating posts 87 received within the corresponding recesses 89 in the upper piece 70. In this embodiment, the lower piece 72 defines a plurality of through holes 91 and 93 to receive the tail sections of the lower row contacts 58 and the mounting legs 79 of the shielding plate 76 to extend therethough as an alignment spacer. Notably, the shielding plate 76 forms a front edge section 69 extending forwardly beyond a front edge of the mating tongue 54 for anti-mismating consideration, and a pair of lateral edge sections 67 for locking with a latch 39 of the plug connector 10 (illustrated later). In brief, the shielding plate 76 is essentially multifunctional to perform shielding, grounding, reinforcing, anti-mis-mating and locking. A metallic bracket 95 is soldered under the shield 56 and forms a pair of supporting legs 97 mounted into the through hole 103 of the printed circuit board 100 for supporting the receptacle connector 50 within the notch 102 of the printed circuit board 100. The shield 56 further includes an upside-down U-shaped structure (not labeled) on a rear portion covering the rear portion of the housing 52 with a pair of mounting legs 55 received in the through holes 104 for mounting to the printed circuit board 100 and a pair of locking tabs 59 received in the recesses 99 of the upper piece 70 after the shield 56 is rearwardly assembled to the housing 52 in a front-to-back direction. Notably, the mounting leg 79 of the shielding plate 76 share the same through hole with the neighboring grounding contact tail for enhancing grounding effect.

Figure 14:
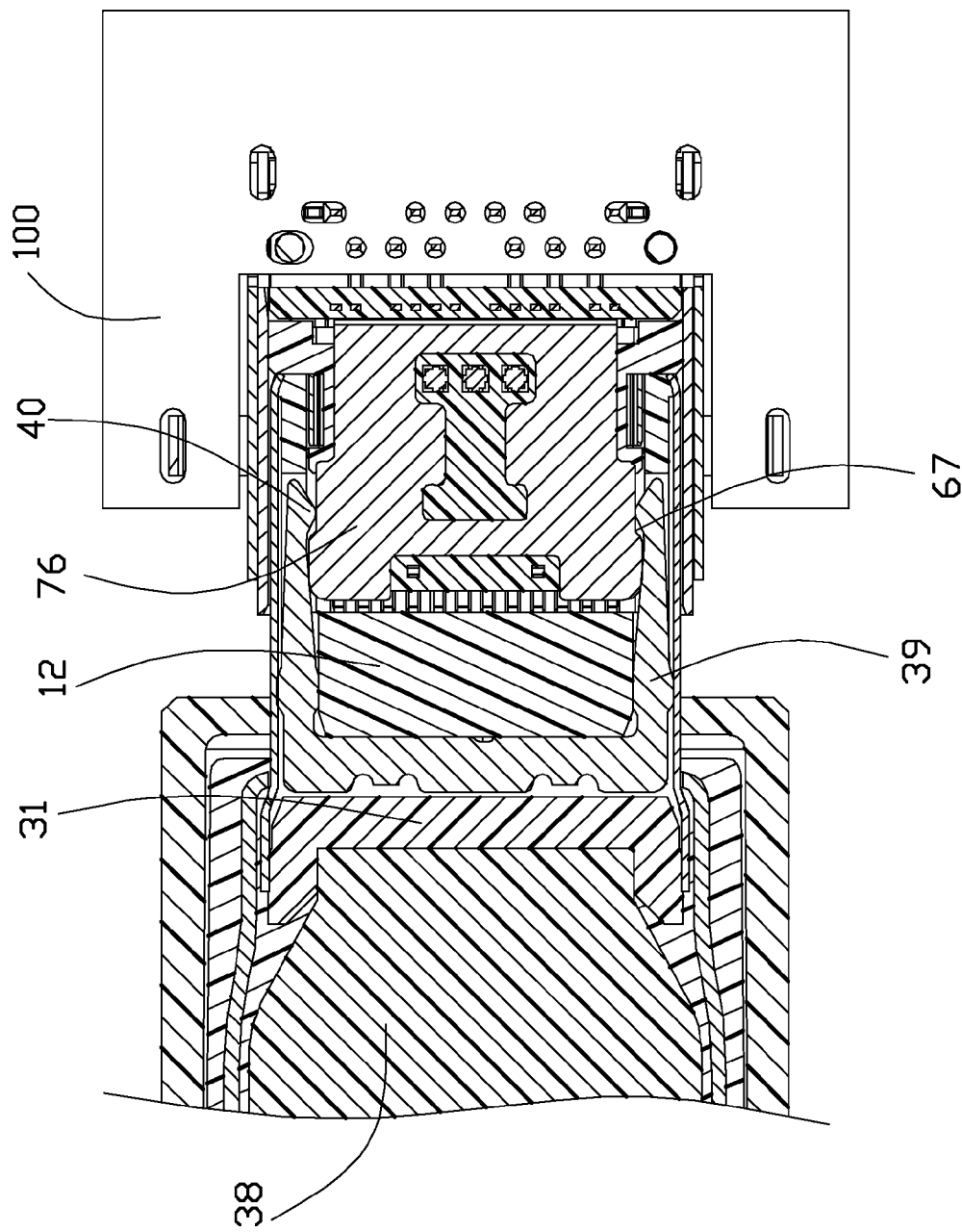
FIG. 14 is a cross-sectional view of the mated plug connector and receptacle connector of FIG. 1 to show how the latch of the plug connector is lockable engaged with the shielding plate of the receptacle connector.
Figure 15A:
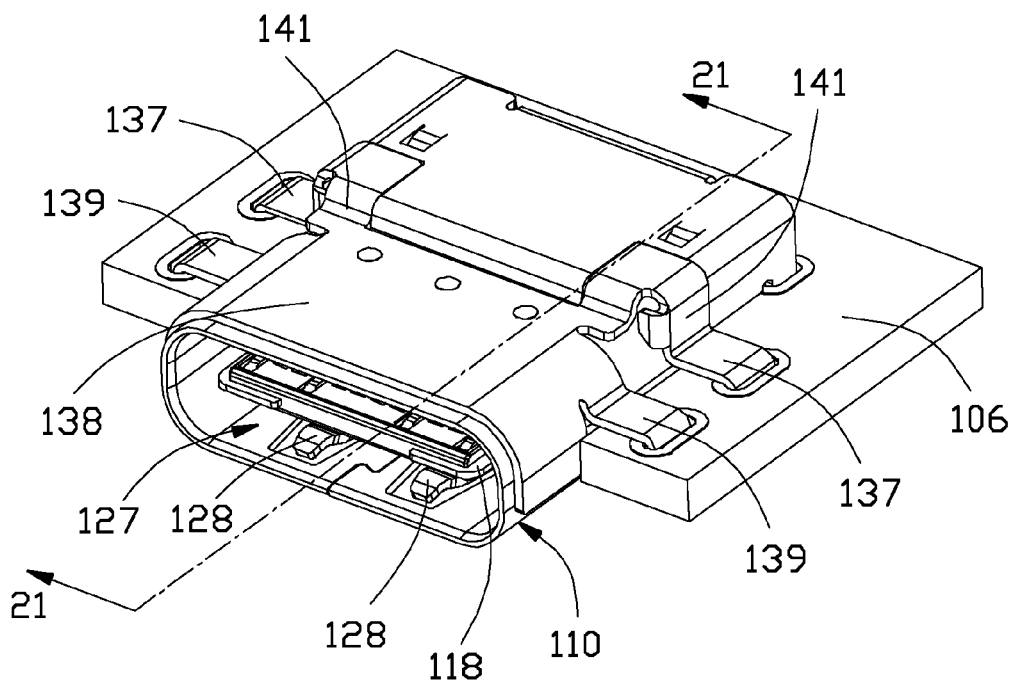
FIG. 15(A) is a front assembled perspective view of a second embodiment of a receptacle connector mounted to the printed circuit board.
Figure 15B:
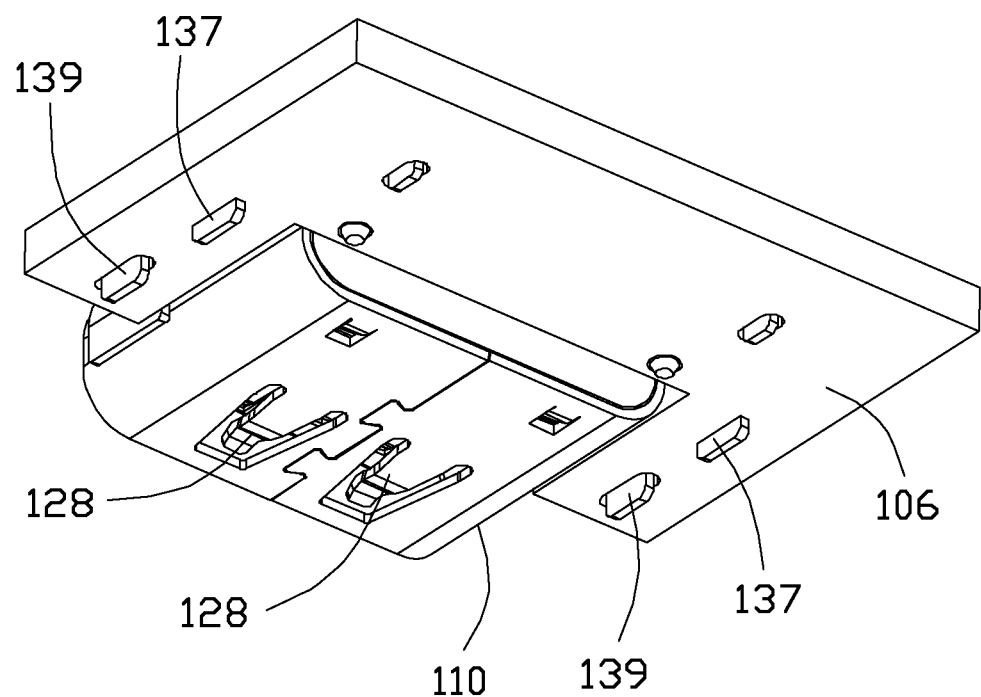
FIG. 15(B) is a rear assembled perspective view of the receptacle connector mounted upon the printed circuit board of FIG. 15(A).
Figure 17:
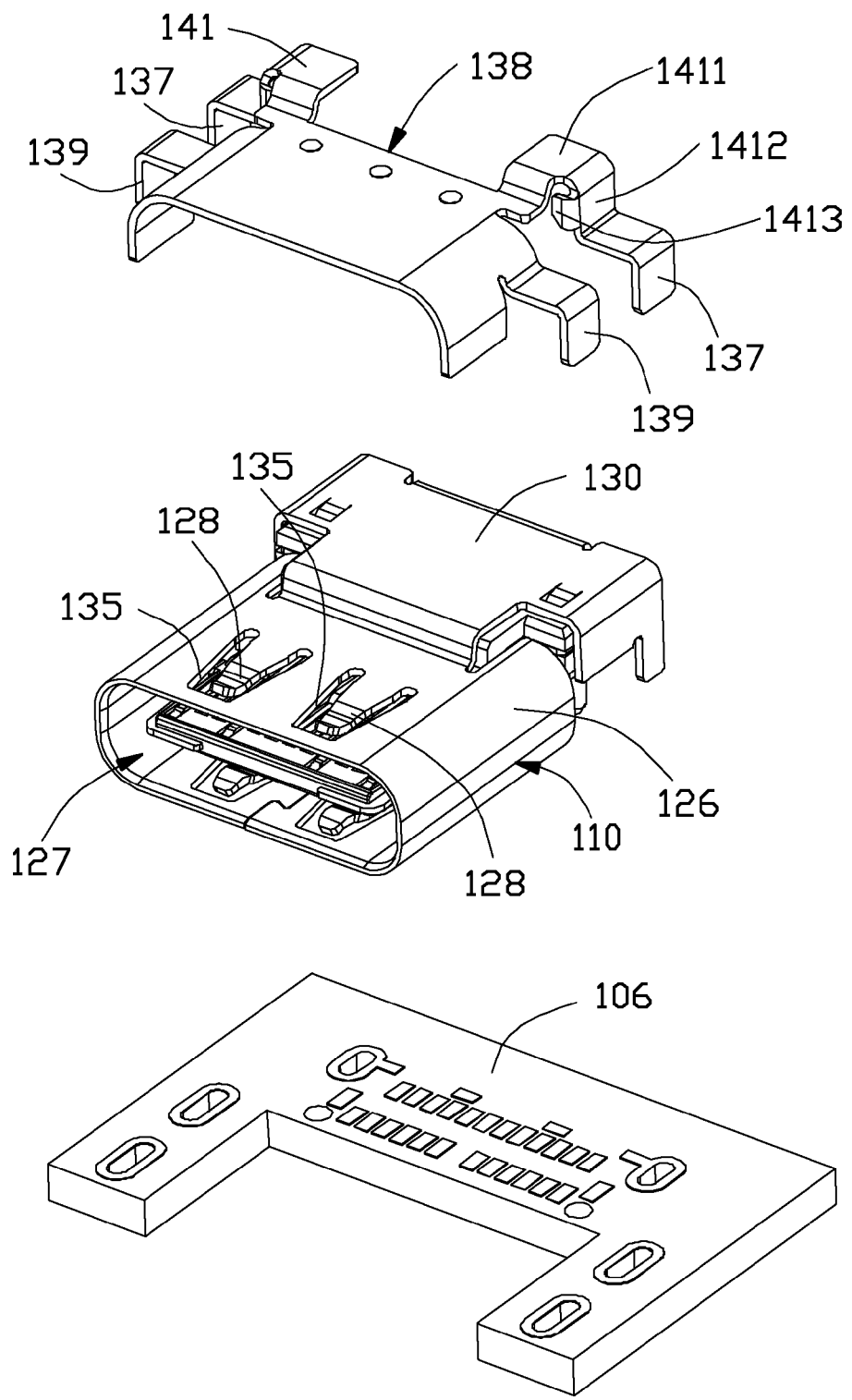
FIG. 17 is a further front exploded perspective view of the receptacle connector of FIG. 16(A).
Figure 18A:
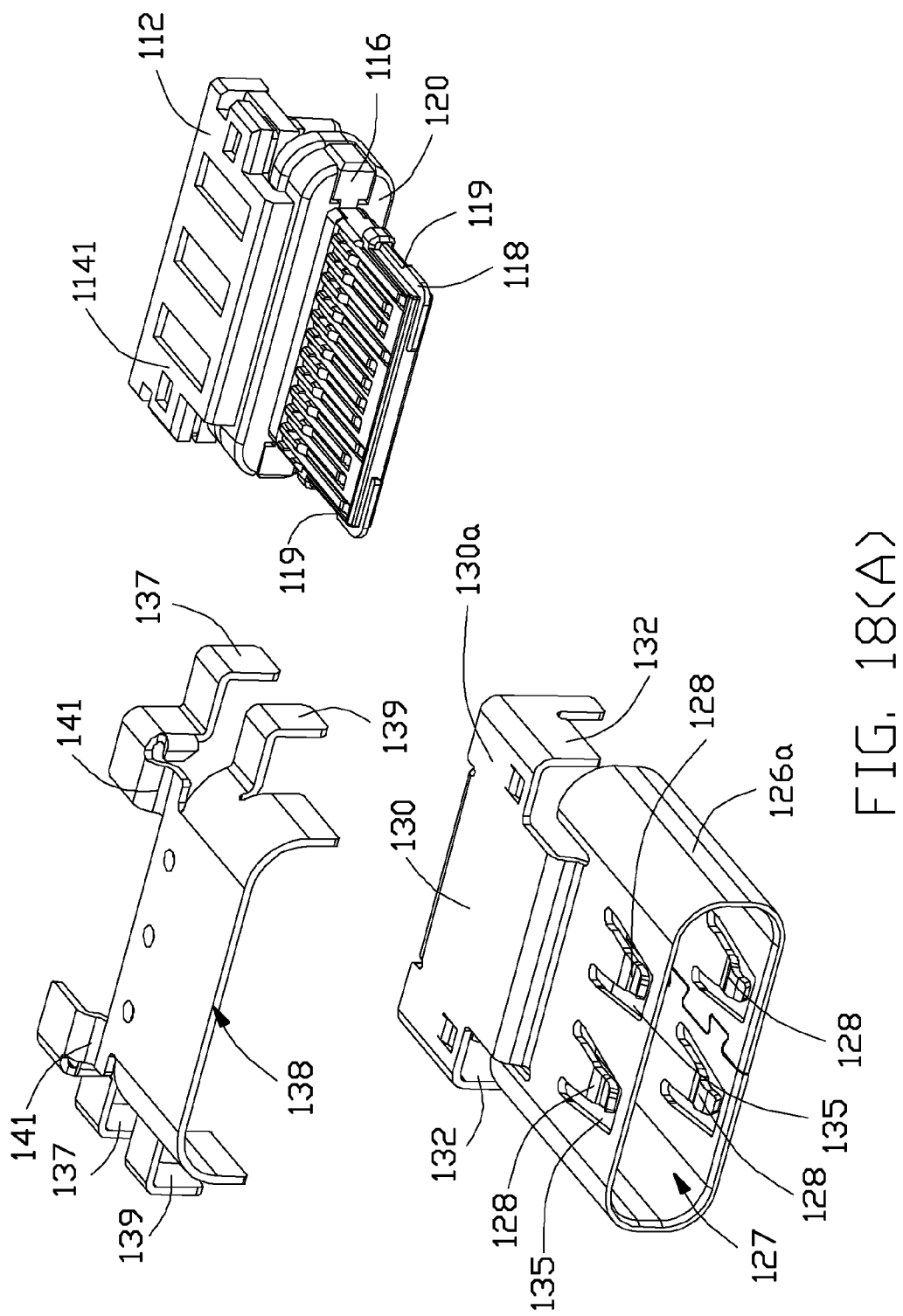
FIG. 18(A) is a further front exploded perspective view of the receptacle connector of FIG. 17.
Figure 18B:
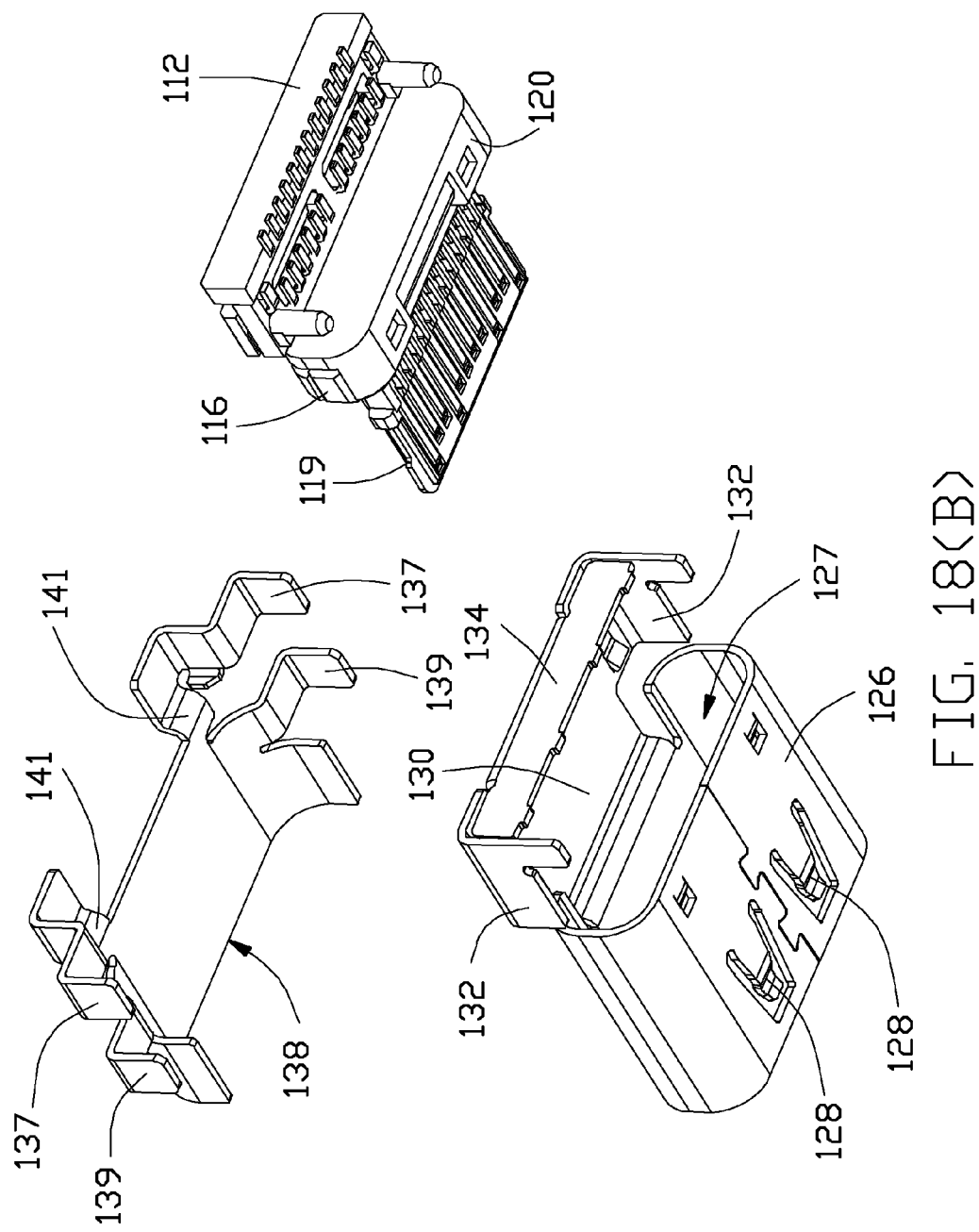
FIG. 18(B) is a further rear exploded perspective view of the receptacle connector of FIG. 17
Figure 19B:
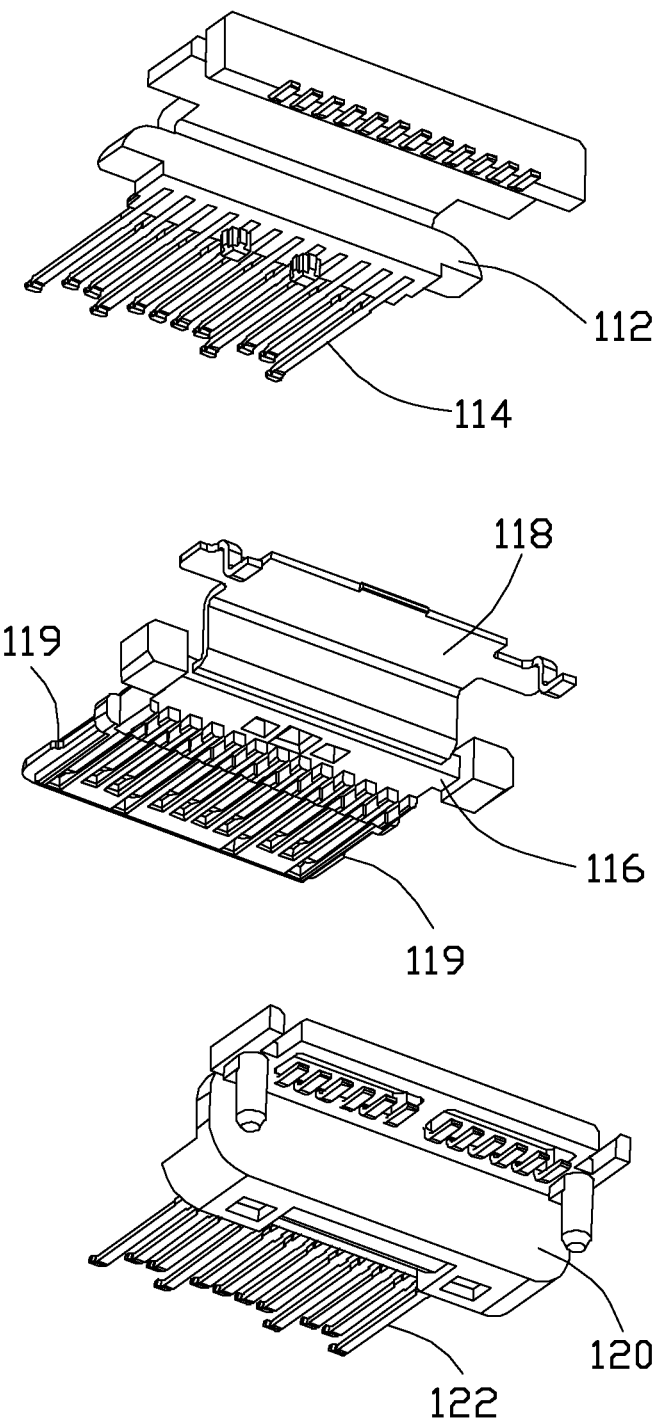
FIG. 19(B) is a further rear exploded perspective view of the receptacle connector of FIG. 18(B).
Figure 20A:
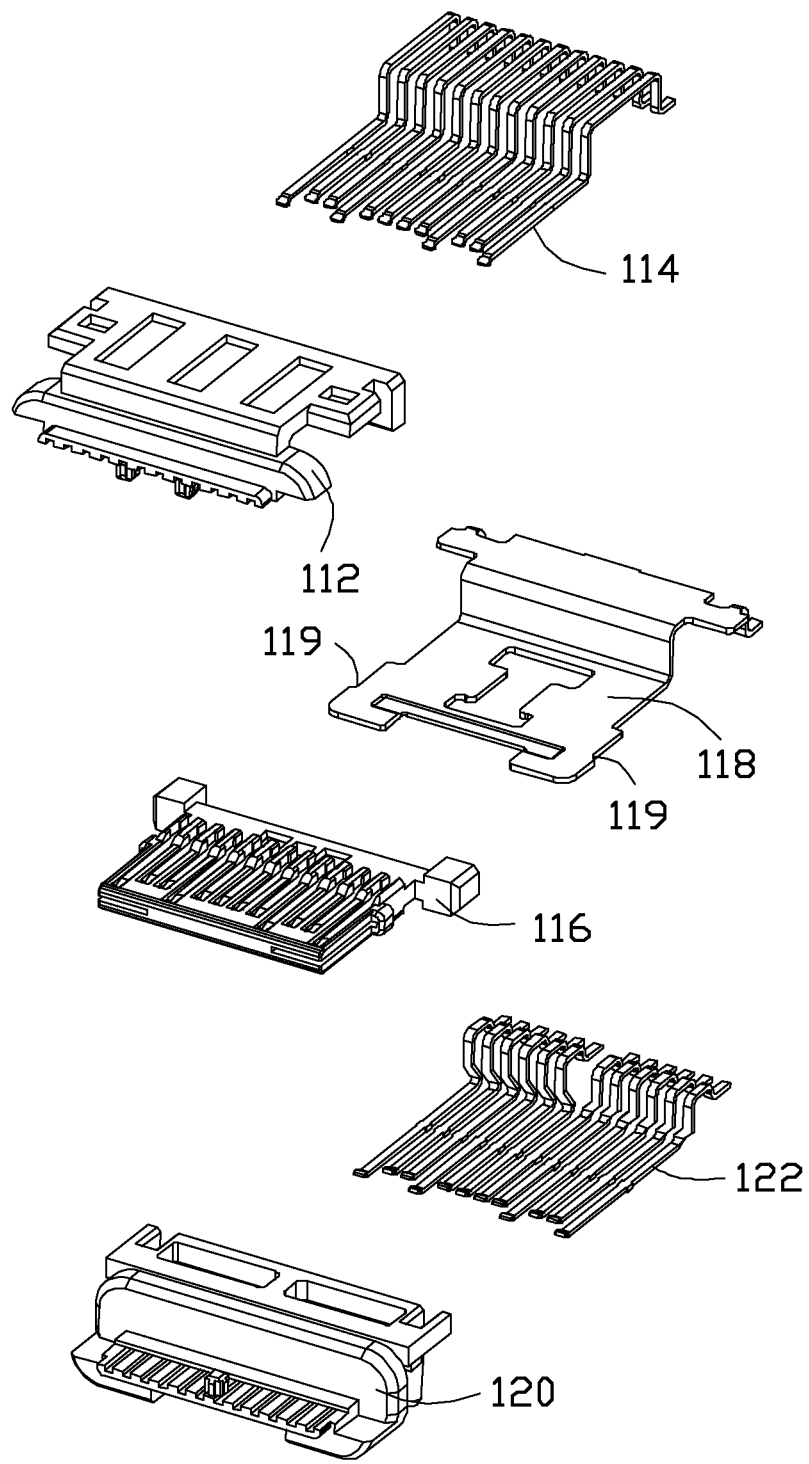
FIG. 20(A) is a further front exploded perspective view of the receptacle connector of FIG. 19(A).
Figure 20B:
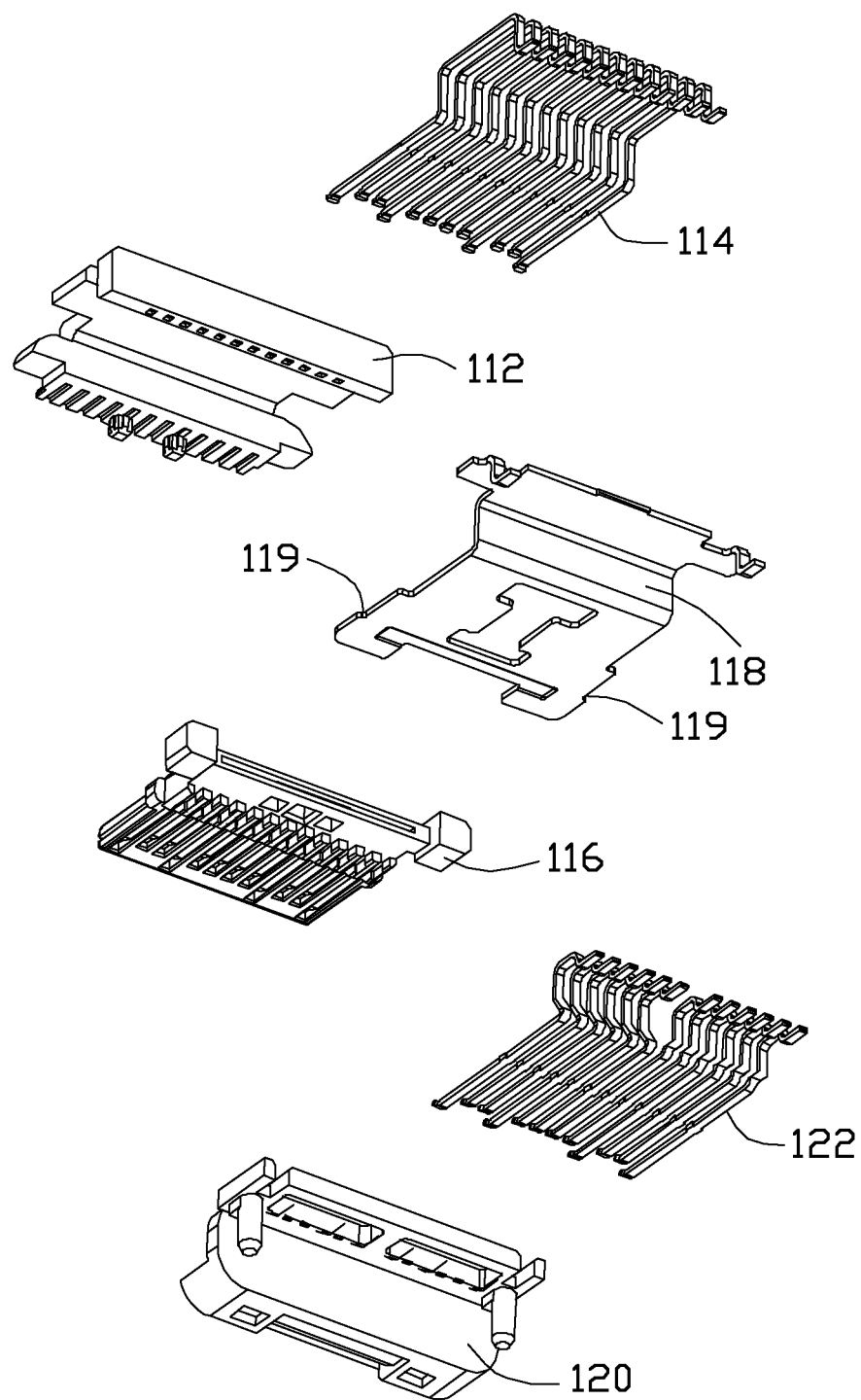
FIG. 20(B) is a further rear exploded perspective view of the receptacle connector of FIG. 19(B).
Figure 21:
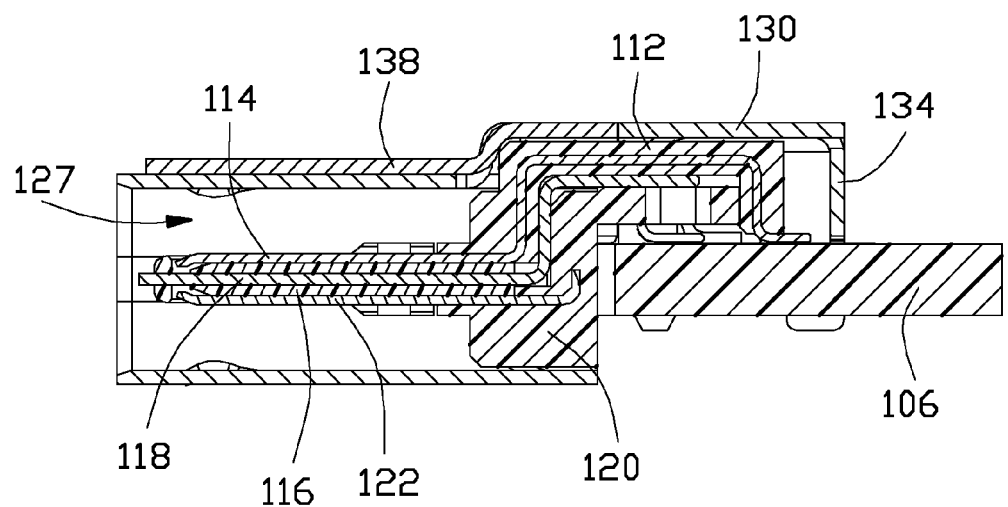
FIG. 21 is a cross-sectional view of the receptacle connector mounted upon the printed circuit board taken along lines 21-21 of FIG. 15(A).
Figure 22:
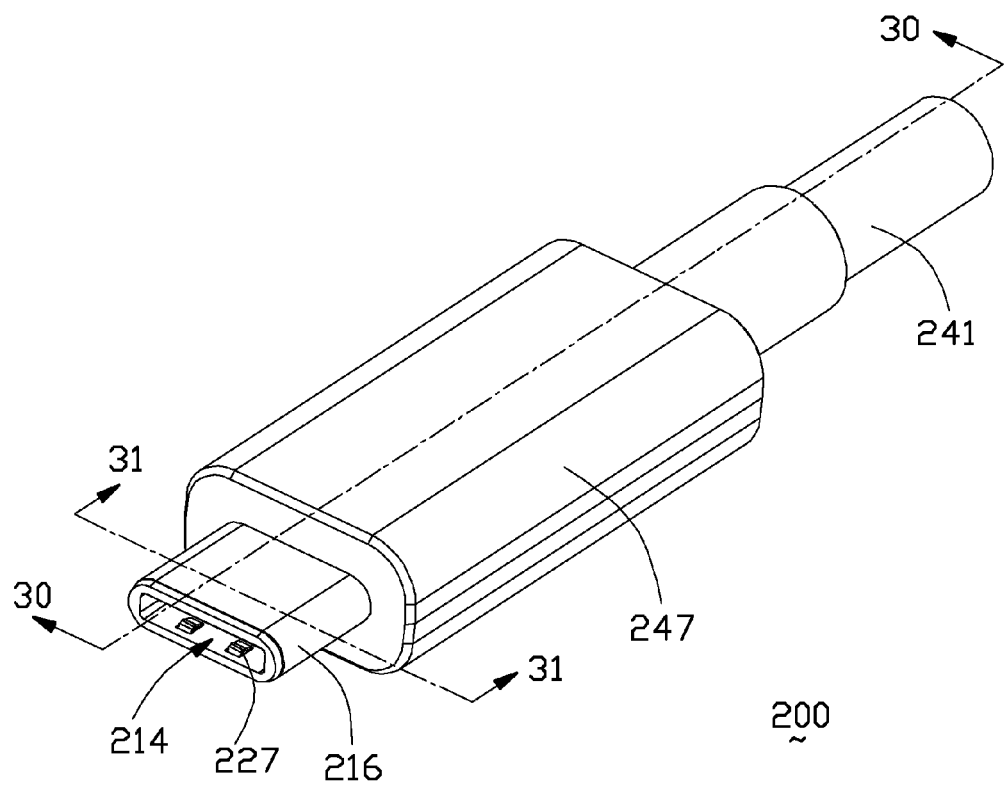
FIG. 22 is a front assembled perspective view of a third embodiment of a plug connector according to the invention.
Figure 23:
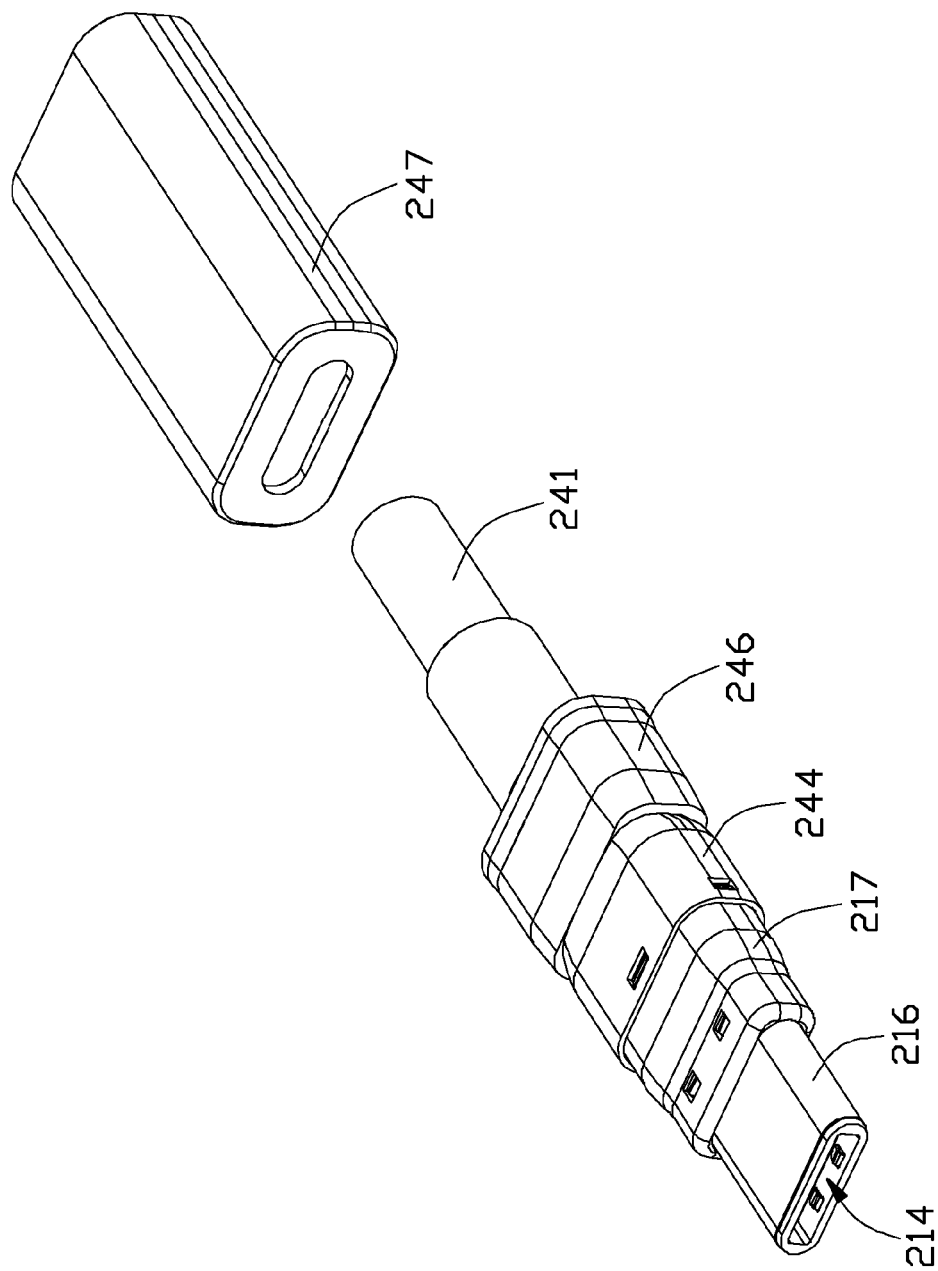
FIG. 23 is a front exploded perspective view of the plug connector of FIG. 22.
Figure 26A:
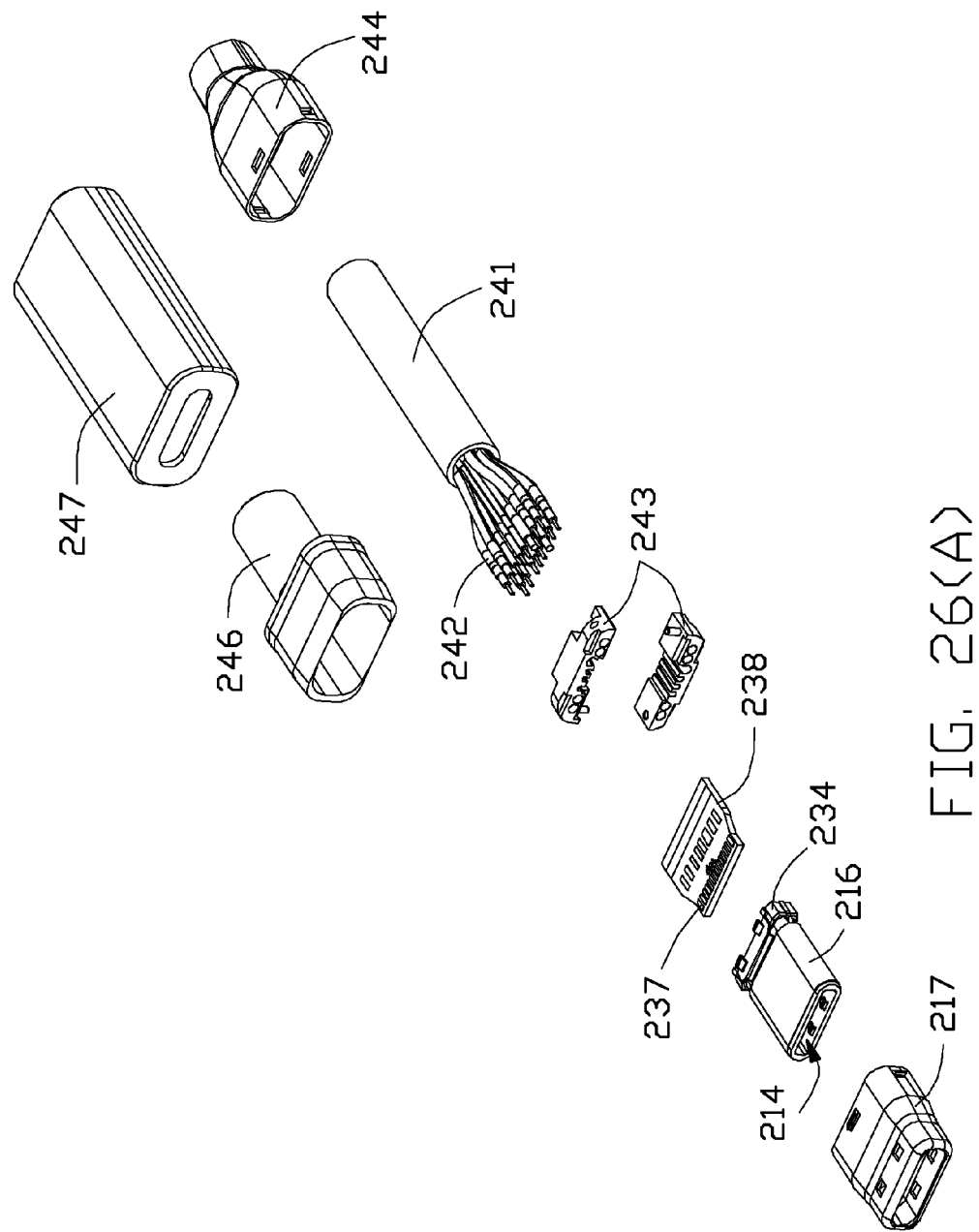
FIG. 26(A) is a further front exploded perspective view of the plug connector of FIG. 25.
Figure 26B:
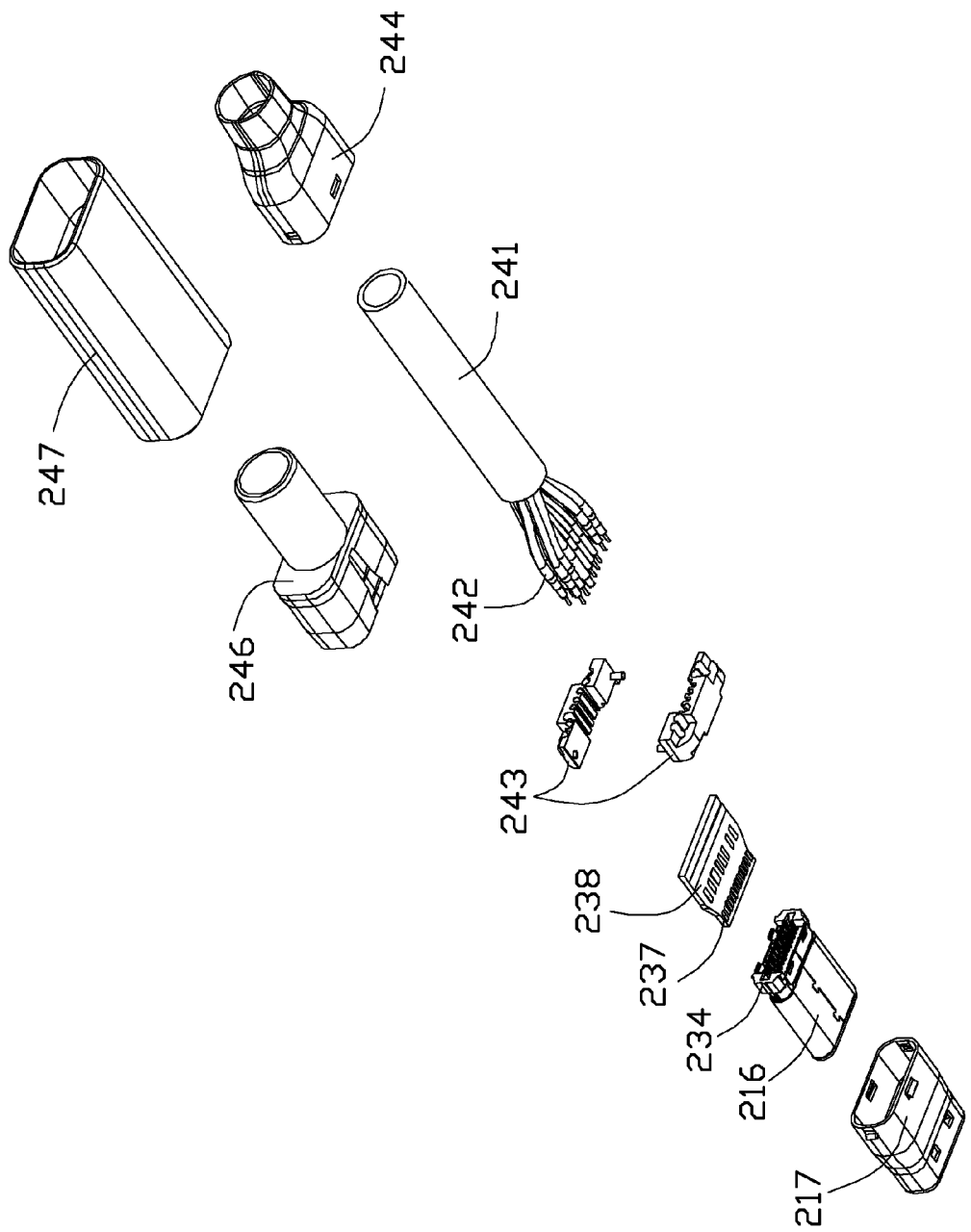
FIG. 26(B) is a further rear exploded perspective view of the plug connector of FIG. 25.
Figure 27A:
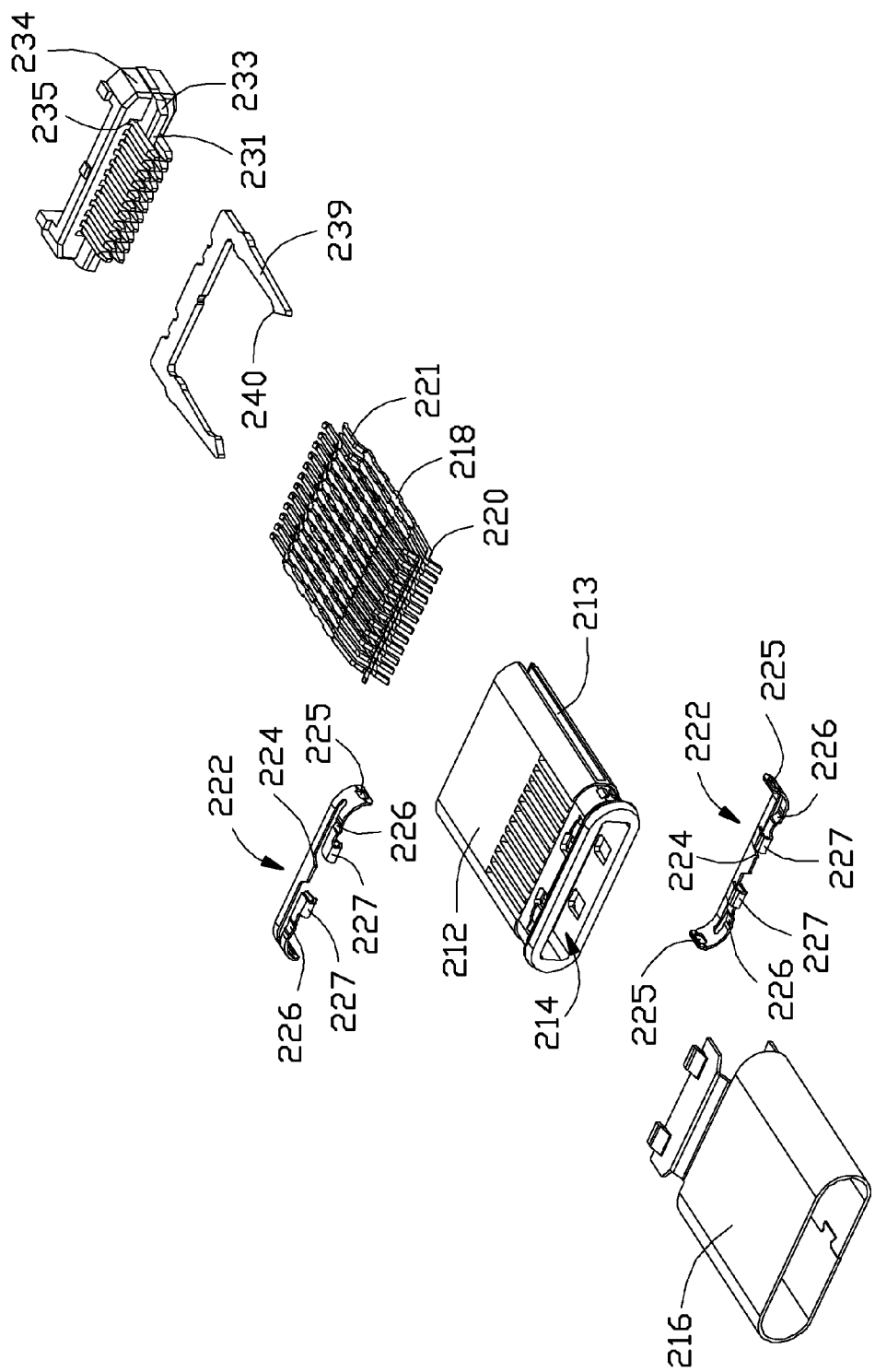
FIG. 27(A) is a further front exploded perspective view of the plug connector of FIG. 26(A).
Figure 27B:
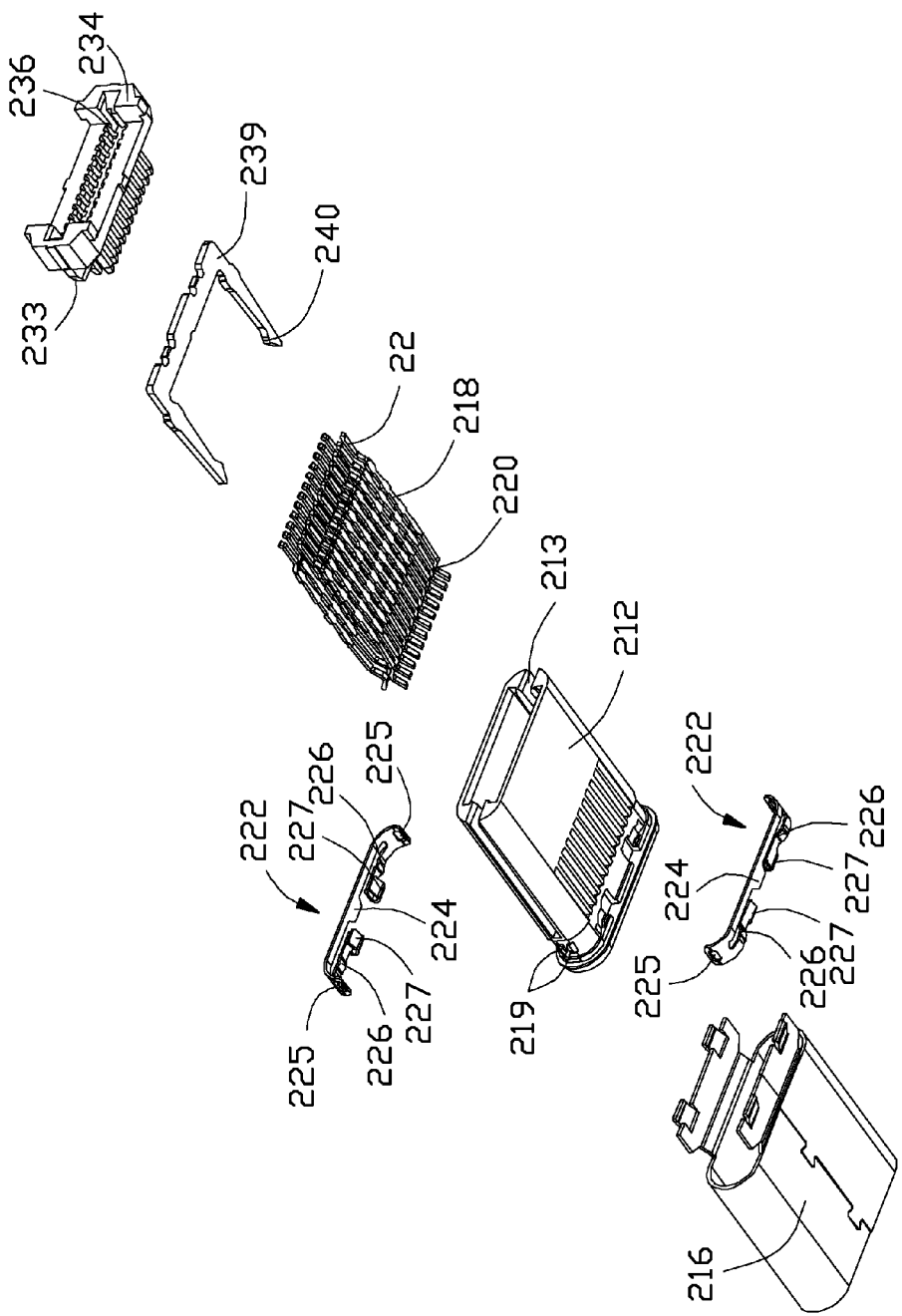
FIG. 27(B) is a further rear exploded perspective view of the plug connector of FIG. 26(B).
Figure 28A:
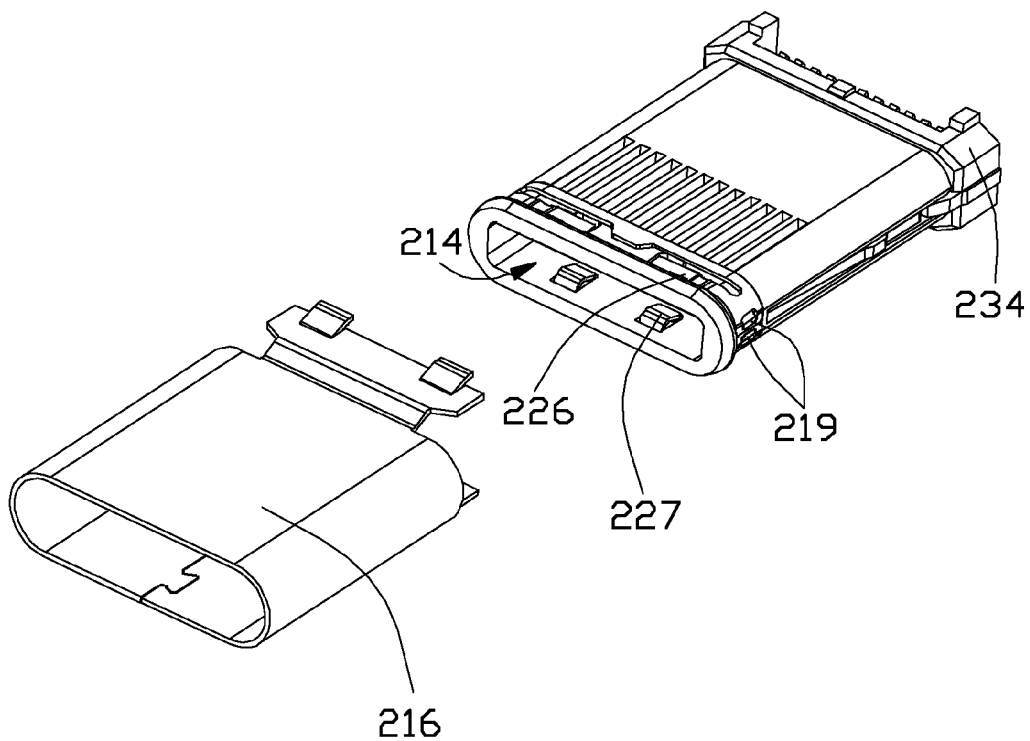
FIG. 28(A) is a front exploded perspective view of a portion of the plug connector of FIG. 26(A).
Figure 28B:
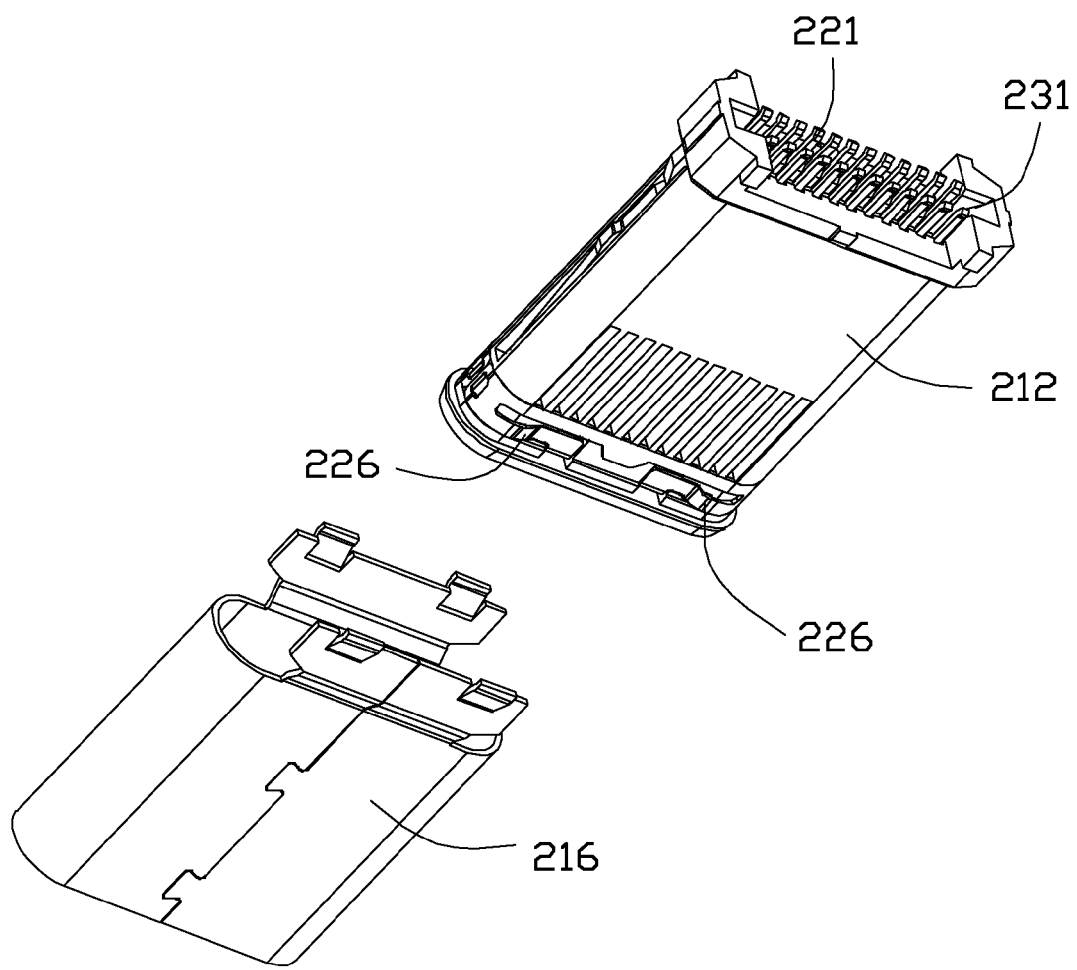
FIG. 28(B) is a rear exploded perspective view of the portion of the plug connector FIG. 26(B).
Figure 29:
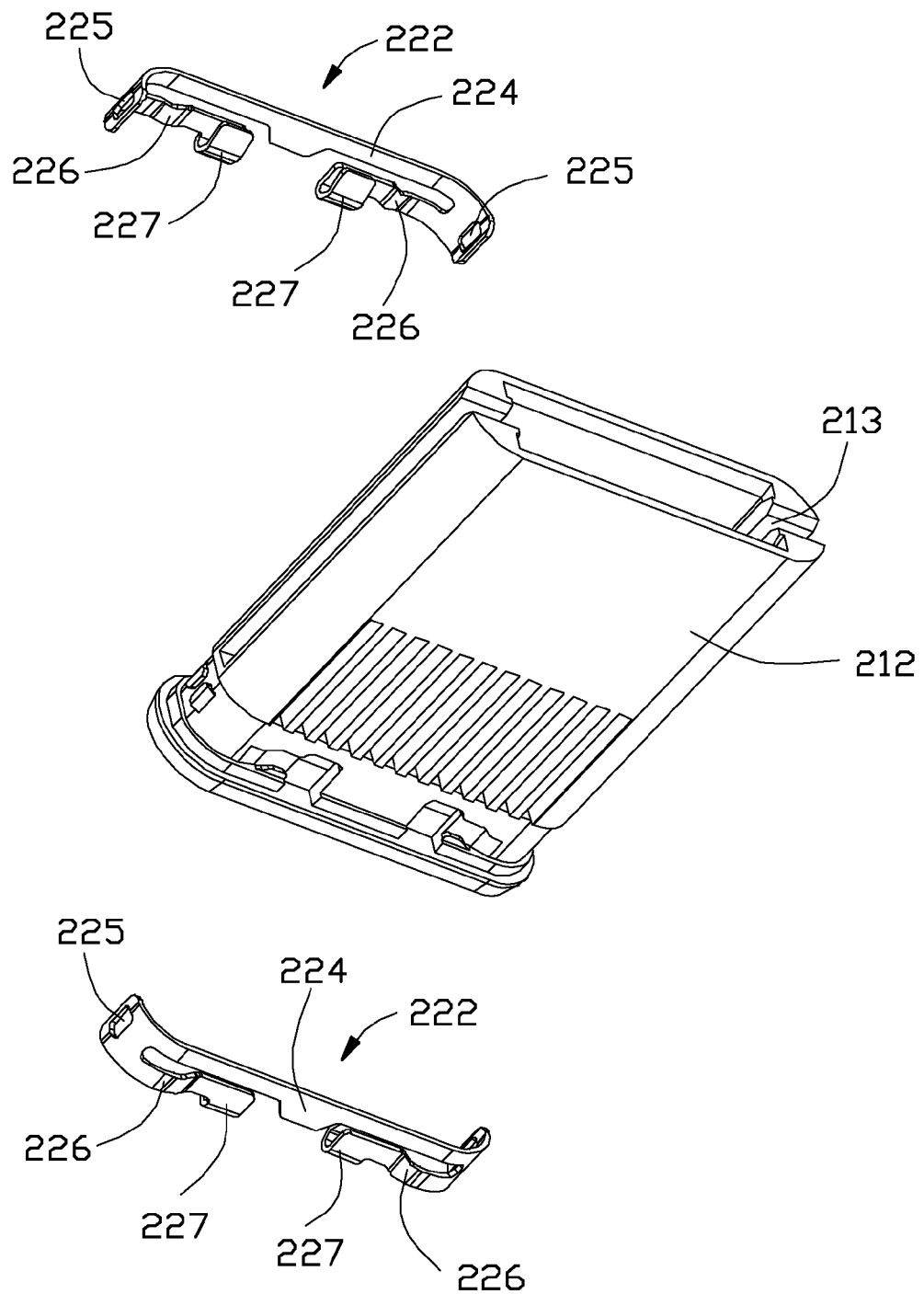
FIG. 29 is rear exploded perspective view of a portion of the plug connector of FIG. 28(B).
Figure 30:
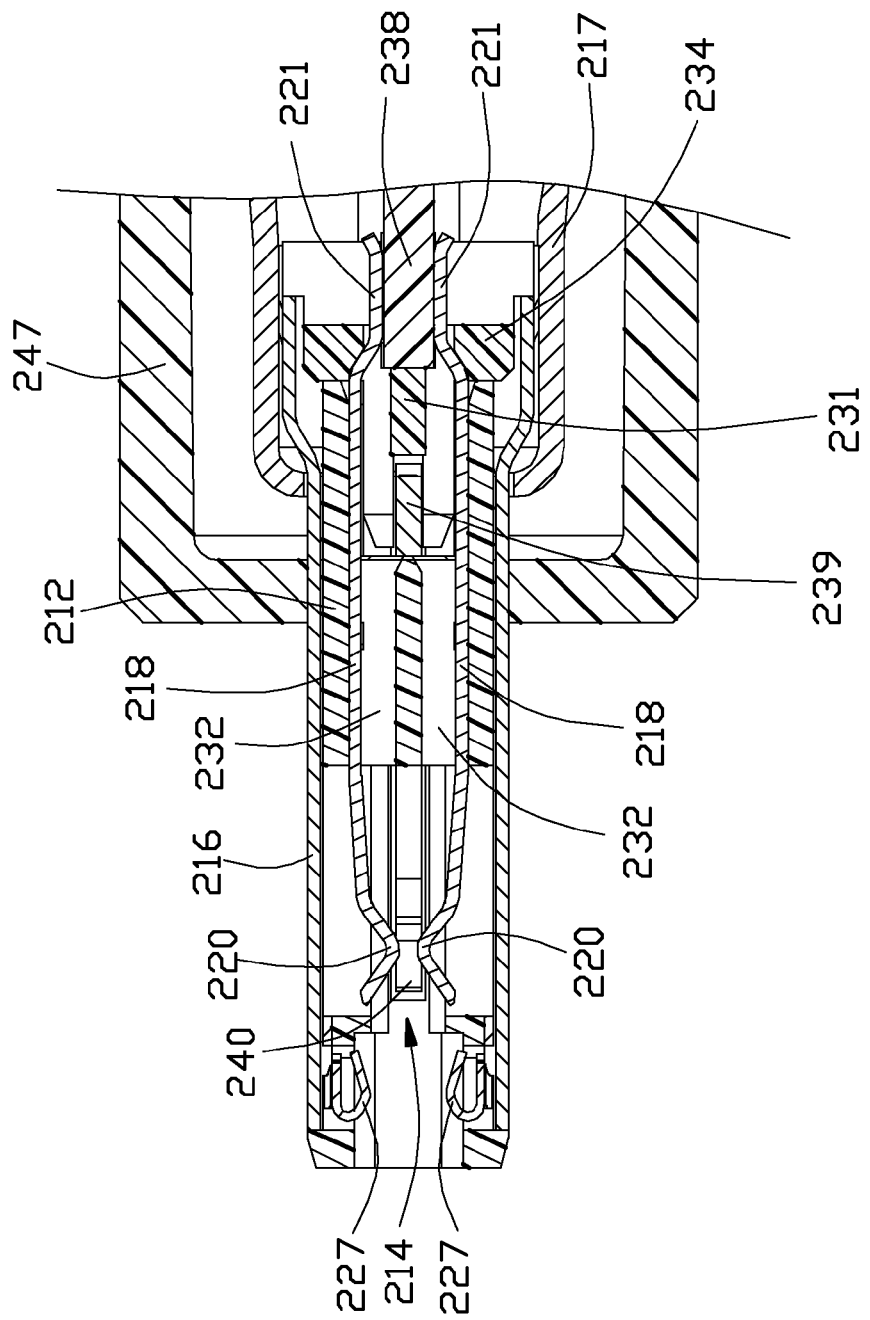
FIG. 30 is a cross-sectional view, taken along a longitudinal direction, of a portion of the plug connector taken along lines 30-30 of FIG. 22.
Figure 31:
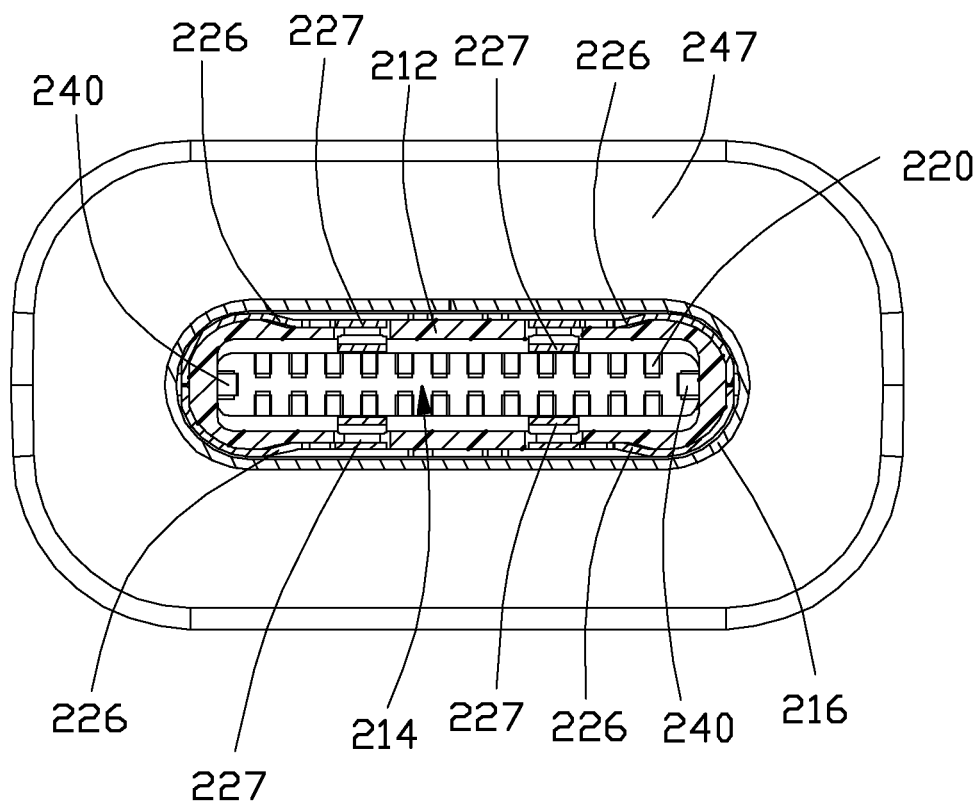
FIG. 31 is another cross-sectional view, taken along a transverse direction, of the plug connector taken along lines 31-31 of FIG. 22.
Figure 32A:
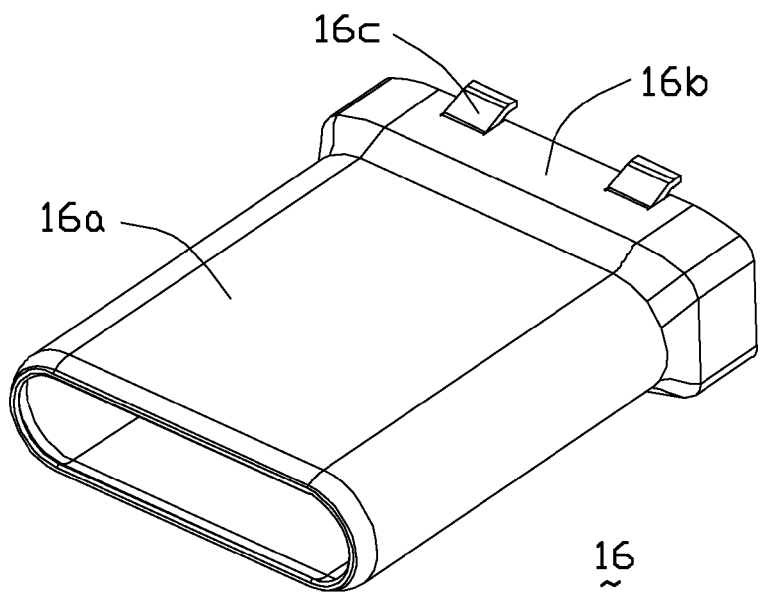
FIG. 32(A) is the front perspective view of a metallic shell of the plug connector of FIGS. 1-14.
Figure 32B:
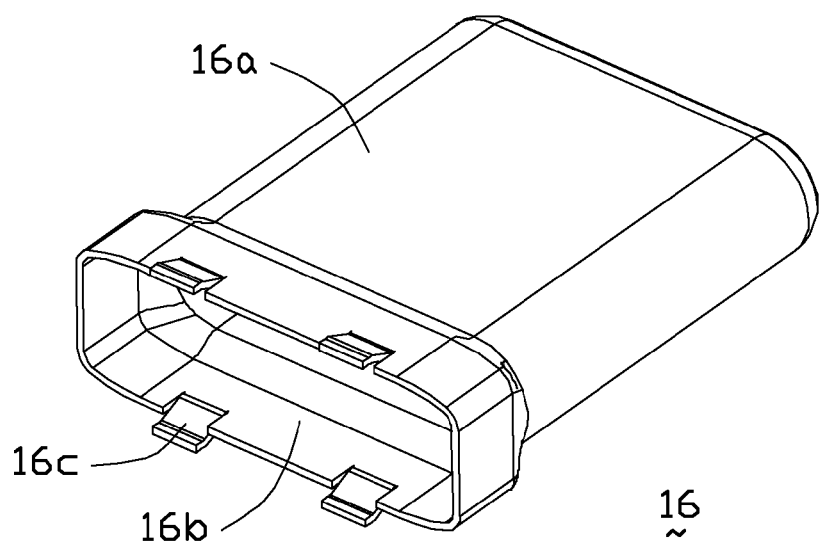
FIG. 32(B) is a rear perspective view of the metallic shell of FIG. 32(A).
Figure 33:
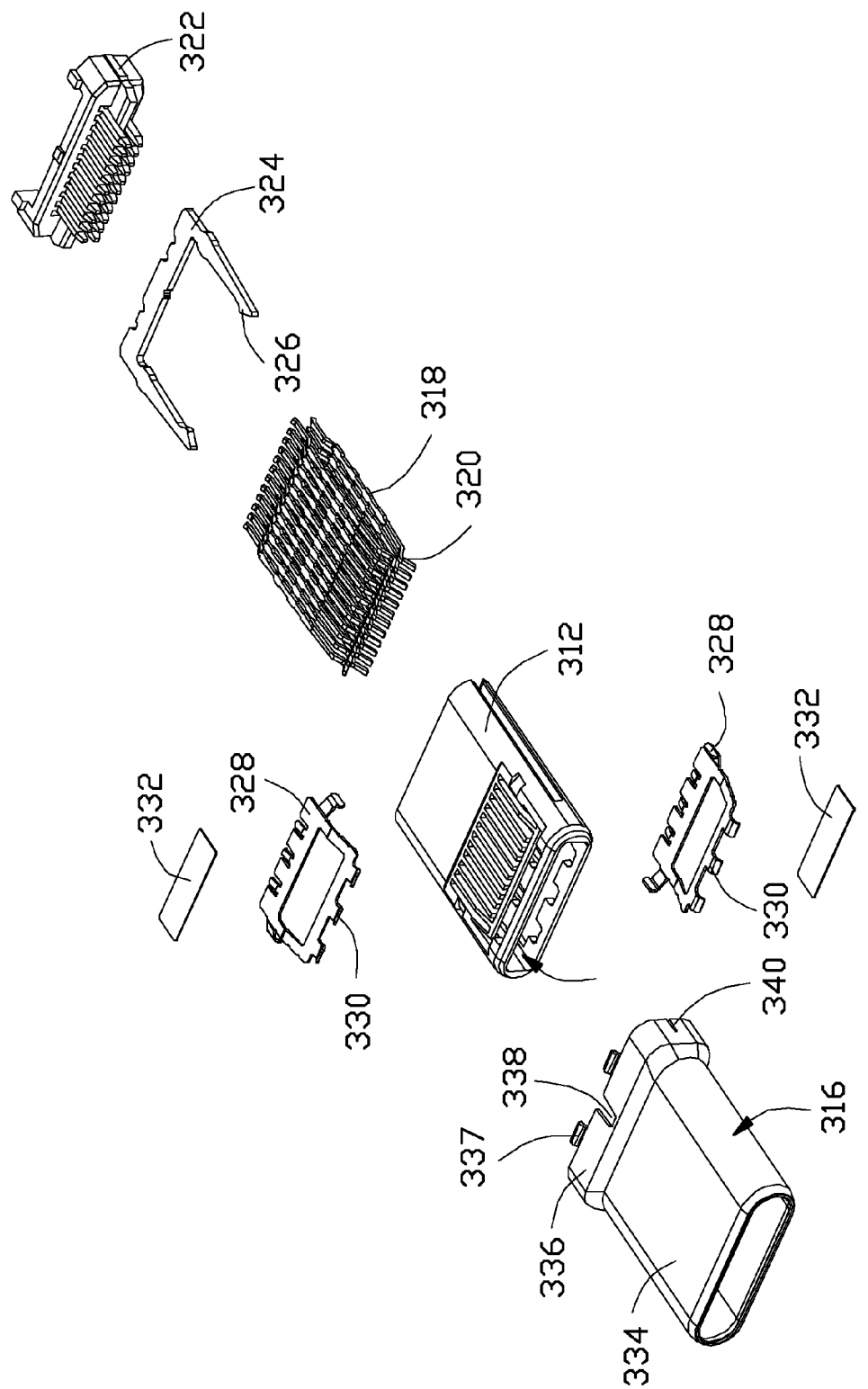
FIG. 33 is a front exploded perspective view of a portion of a plug connector according to a fourth embodiment of the invention.
Figure 34A:
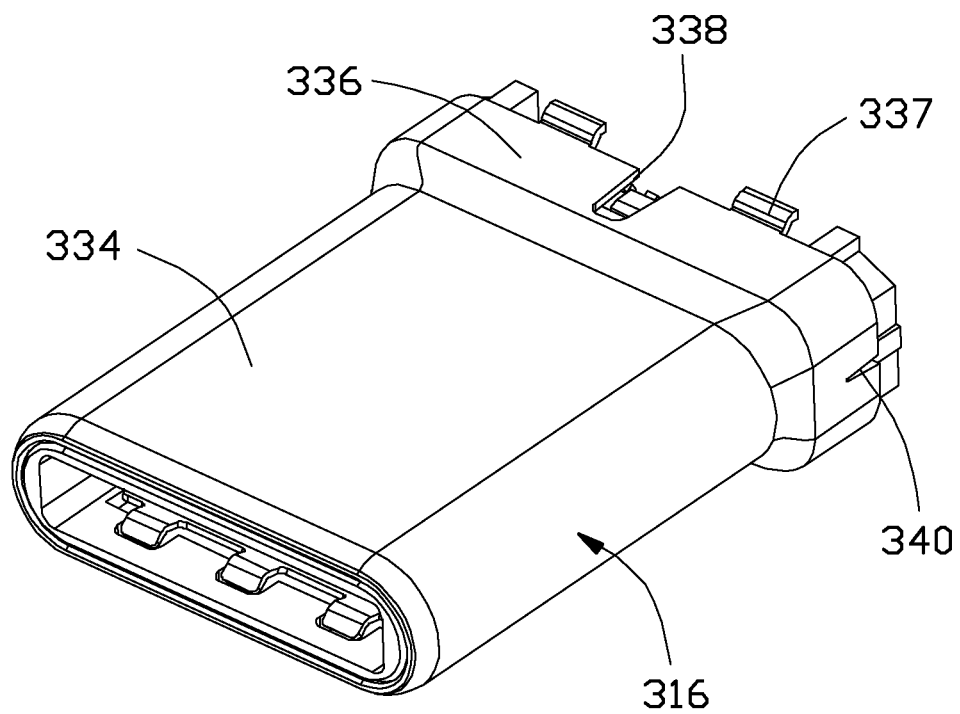
FIG. 34(A) is a front assembled perspective view of the portion of the plug connector of FIG. 33.
Figure 34B:
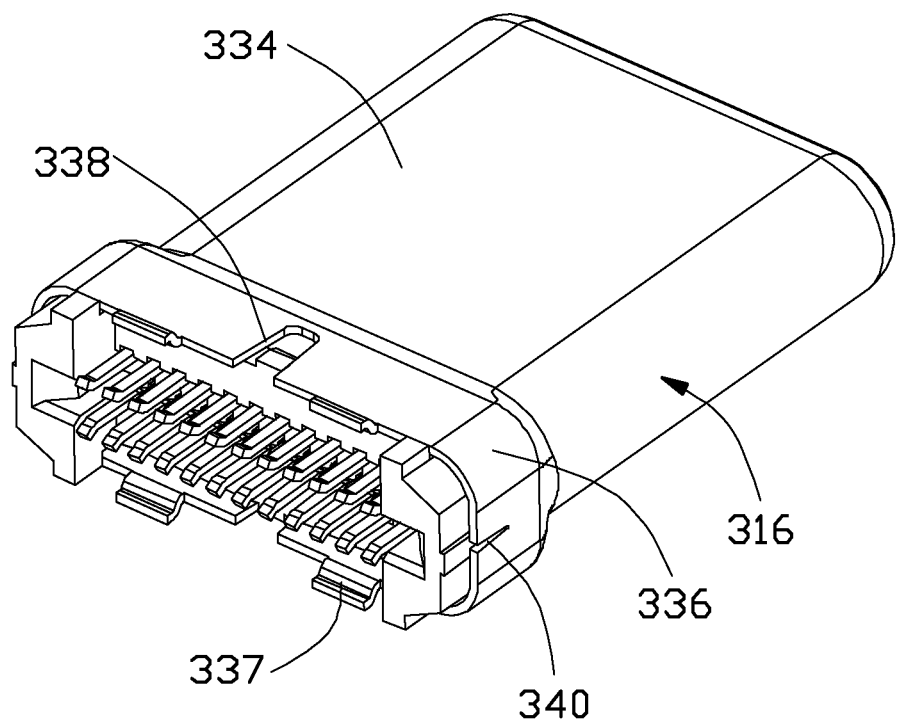
FIG. 34(B) is a rear assembled perspective view of the portion of the plug connector of FIG. 33.
Figure 35A:
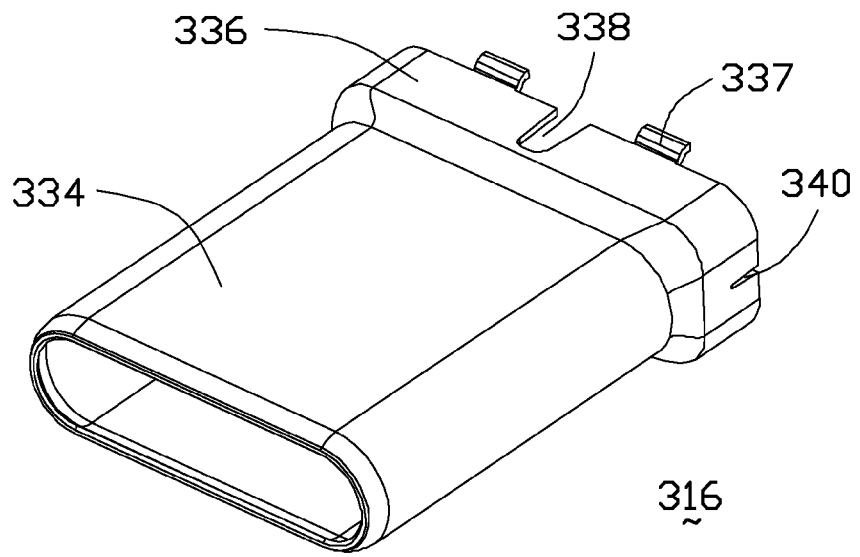
FIG. 35(A) is a front perspective view of the shell of the plug connector of FIG. 33.
Figure 35B:
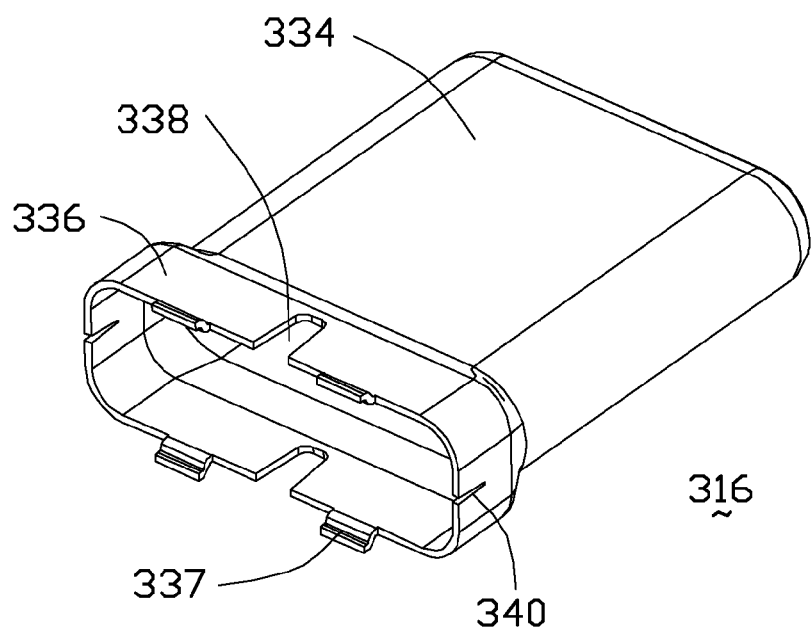
FIG. 35(B) is a rear perspective view of the shell of the plug connector of FIG. 33.

Referring to FIGS. 10-13(B) and further FIG. 14, the plug connector 10 includes an insulative housing 12 having a capsular front contour with a rectangular receiving cavity 14 therein and enclosed in a metallic shell 16. Opposite upper and lower rows of contacts 18 are disposed in the corresponding passageways 32 of the housing with corresponding contacting sections 20 extending into the receiving cavity 14 wherein the upper and lower rows of contacts 18 are diagonally symmetrically arranged with each other in both electrical and mechanical arrangement so as to meet the so-called flappable mating, i.e., the dual opposite orientations. A pair of metallic upper and lower EMI (Electro-Magnetic Interference) spring plates 22 are enclosed in the shell 16, and each of the EMI spring plates 22 is sandwiched between the shell 16 and the housing 12 and includes a front resilient region 24 extending inwardly toward and into the receiving cavity 14 and in front of the contacting sections 20, a rear abutting region 26 to abut against the shell 16, and a pair of side retention regions 28 retainably engaged within corresponding side portions of the housing 12. A pair of tapes 30 are disposed upon two opposite sides of the housing 12 so as to isolate the contacting section 20 from the shell 16. A spacer 34 is located behind the housing and defines a plurality of passages 35 through which the tail sections 21 of the contacts 18 rearwardly extend. A recessed region 36 is formed in a rear face of the spacer 34 to receive a front edge region of a paddle card 38 wherein the tail sections 21 of the contacts 18 extending through the corresponding passages 35, are soldered upon the corresponding pads 37. The spacer 34 forms a forward extending blade 31 with a pair of forward protrusions 33 on two sides to be commonly inserted into a back side of the housing 12 wherein the protrusions 33 of the blade 31 are essentially received in the side slots 13 of the housing 12. A U-shaped metallic latch 39 of a blanking type received in the side slots 13 of the housing 12 with a pair of locking heads 40 extending into the two opposite lateral sides of the receiving cavity 14 to lock with the lateral edge sections 67 of the shielding plate 76 of the receptacle connector 50 during mating. Understandably, the latch 39 is restrained by the blade 31, the comb structures on the blade 31, the protrusions 33 of the blade 31, the slots 13 and an interior rear face of the housing 12.

A cable 41 behind the paddle card 38, encloses a plurality of wires 42 regulated by a pair of organizer 43 to be soldered upon a rear region of the paddle card 38. Via the protrusions and openings (not labeled), an auxiliary rear shell 17 grasps the shell 16 to shield the paddle card 38, and a clipper 44 grasps the rear shell 17 and further the cable 41 behind the paddle card 38. Opposite front overcoat 45 and rear overcoat or strain relief 46 are overmolded upon the rear shell 17 and the clipper 44, respectively. Finally, a cover 47 essentially fully covers the clipper 44, the front overcoat 45 and the rear overcoat 46. During mating, the mating tongue 54 is received in the receiving cavity 14 with the corresponding contacting sections 60 of the contacts 58 of the receptacle connector 50 connected to the contacting sections 20 of the contacts 18 of the plug connector 10 wherein the latch 39 is locked with the shielding plate 76, and the front resilient region 24 of the spring plate 22 contacts the collar 64.

Referring to FIGS. 15(A)-21 showing a second embodiment of the receptacle connector 110 similar to that disclosed in the first embodiment, the receptacle connector 110 adapted to be mounted upon a printed circuit board 106, includes the insulative upper piece 112 with the upper contacts 114 insert molded therein, the middle piece 116 with the shielding plate 118 therein, and the insulative lower piece 120 with the lower contacts 122 therein wherein the upper piece 112 and the lower piece 120 are commonly sandwich the insulative middle piece 116 therebetween with an EMI metallic collar (not shown) surrounding all around a root area of the mating tongue 129 formed by the middle piece 116. The upper contacts 114 and the lower contacts 122 are diagonally symmetrically arranged with each other for flippable insertion of the corresponding plug connector. A metallic shield 126, i.e., a capsular segment 126a (labeled in FIG. 18(A)) encloses the assembled upper piece 112, middle piece 116 and lower piece 120 and forms a mating cavity 127 in which the mating tongue 129 forwardly extends. Notably, similar to that in the first embodiment, the shielding plate 118 forms a pair of lateral edge sections 119 for locking to the corresponding latch of the complementary plug connector. Also, similar to that in the first embodiment, the metallic shield 126 further forms an upside-down U-shaped structure 130a including a top wall 130, a pair of side walls 132 and further a rear wall 134 so as to relatively completely shield the rear portions 1191 of the upper piece 112 and lower piece 120 above the printed circuit board 106. Different from what is disclosed in the first embodiment, the shield 126 does not defines a sealed type capsular mating cavity 127 but with two pairs of spring tangs 128 for engagement with the mated plug connector. In addition, a metallic top bracket 138 covering an upper part of the capsular segment 126a of the shield 126, is optimally welded to the shield 126 and mounted upon the top surface of the printed circuit board 106 via a pair of first mounting legs 139 and a pair of second mounting legs 137. Notably, the top bracket 138 shields the openings 135 in the top face of the shield 126 derived from the spring tangs 128, thus reducing RFI leakage and improving waterproof. The top bracket 138 forms a pair of raised blocks 141 to cover a pair of opposite top corners of the upper piece 112 in the front-to-back direction, and the pair of mounting legs 137 downwardly extends from the raised blocks 141 and is mounted to the printed circuit board 106 for better RFI performance. The raised block 141 includes a first section 1411, a second section 1412 and a third section 1413, the first section 1411 extends in a front rear direction and a transverse direction, the second section 1412 extends in the front rear direction and a vertical direction, the third section 1413 bend from a front edge of the second section and bends in a transverse direction and a vertical direction. The mounting leg 137 extends downwards from a bottom edge of the second section 1412.

Referring to FIGS. 22-31 showing a third embodiment of the plug connector 200 similar to those disclosed in the first embodiments, includes an insulative housing 212 having a capsular front contour with a rectangular receiving cavity 214 therein and enclosed in a metallic shell 216. Opposite upper and lower rows of contacts 218 are disposed in the corresponding passageways 232 of the housing 212 with corresponding contacting sections 220 extending into the receiving cavity 214 wherein the upper and lower rows of contacts 218 are diagonally symmetrically arranged with each other in both electrical and mechanical arrangement so as to meet the so-called flappable mating, i.e., the dual opposite orientations. A pair of metallic upper and lower EMI (Electro-Magnetic Interference) spring plates 222 is enclosed in the shell 216. Each of the EMI spring plates 222 is sandwiched between the shell 216 and the housing 212 and includes a rear retention region 224 having a pair of locking opening 225 retained to a pair of locking protrusions 219, and a pair of spring arms 226 extending in a lateral direction with a contacting end 227 in front of the contacting sections 220. Notably, different from that the spring plate 22 forming the front resilient region 24 extending along the front-to-back direction disclosed in the first embodiment, the spring arm 226 extending in the lateral direction perpendicular to the front-to-back direction so as to occupy the relatively small space for not jeopardizing the strength of the housing 212 while still keeping the sufficient resilient force thereof. A pair of tapes (not shown) are disposed upon two opposite sides of the housing 212 so as to isolate the contacting section 220 from the shell 216. A spacer 234 is located behind the housing and defines a plurality of passages 235 through which the tail sections 221 of the contacts 218 rearwardly extend. A recessed region 236 is formed in a rear face of the spacer 234 to receive a front edge region of a paddle card 238 wherein the tail sections 221 of the contacts 218 extending through the corresponding passages 235, are soldered upon the corresponding pads 237. The spacer 234 forms a forward extending blade 231 with a pair of forward protrusions 233 on two sides to be commonly inserted into a back side of the housing 212 wherein two opposite sides of the blade 231 is essentially received in the side slots 213 of the housing 212. A U-shaped metallic latch 239 of a blanking type received in the side slots 213 of the housing 212 with a pair of locking heads 240 extending into the two opposite lateral sides of the receiving cavity 214 to lock with the lateral edge sections of the shielding plate of the corresponding receptacle connector during mating. Understandably, the latch 239 is restrained by the blade 231, the comb structures on the blade 231, the forward protrusions 233, the slots 213 and an interior rear face of the housing 212.

A cable 241 behind the paddle card 238, encloses a plurality of wires 242 regulated by a pair of organizer 243 to be soldered upon a rear region of the paddle card 238. Via the protrusions and openings (not labeled), an auxiliary rear shell 217 grasps the shell 16 to shield the paddle card 238, and a clipper 244 grasps the rear shell 217 and further the cable 241 behind the paddle card 238. Opposite front overcoat (not shown) and rear overcoat or strain relief 246 are overmolded upon the rear shell 217 and the clipper 244, respectively. Finally, a cover 247 essentially fully covers the clipper 244, the front overcoat and the rear overcoat 246. During mating, understandably the mating tongue of the receptacle connector is received in the receiving cavity 214 with the corresponding contacting sections of the contacts of the receptacle connector connected to the contacting sections 220 of the contacts 218 of the plug connector 210 wherein the latch 239 is locked with the shielding plate of the receptacle connector, and the spring plate 222 contacts the collar.

Referring to FIGS. 32(A)-38(B), FIGS. 32(A) and 32(B) show the shell 16 disclosed in the first embodiment wherein the shell, via a drawing process, includes a front capsular segment 16a and a rear rectangular segment 16b including protrusions 16c for locking to the corresponding openings formed in the rear shell 17. Because the shape and dimension differences between these two segments 16a and 16b, the rear segment 16b is easily subject to tearing or incompleteness during such a drawing process. The embodiments disclosed in FIGS. 33-38(B) show the different approaches for avoiding this defect.

FIGS. 33-35(B) show a portion of the flippable plug connector of a third embodiment including an insulative housing 312 defining a receiving cavity 314 and enclosed in the metallic shell 316. Two rows of contacts 318 disposed in the housing 312 with front contacting sections 320 extending into the receiving cavity 314. A spacer 322 is assembled to a rear side of the housing 312 to retain the U-shaped latch 324 within the housing 312 wherein the locking head 326 of the latch 324 extends into the receiving cavity 314. A pair of spring plates 328 are attached to opposite surfaces of the housing 312 with front contacting regions 330 extending in to the receiving cavity 314. A pair of tapes 332 are positioned upon the housing 312 to isolate the contacts 318 from the shell 316. The shell 316 forms the front small capsular segment 334 and the rear large rectangular segment 336 with locking protrusions 337 around the rear edge thereof, wherein a large cutout 338 is formed in the long side and a slit 33 is formed in the short side of the rear rectangular segment 336. Therefore, completeness of the rear rectangular segment 336 can be achieved.

Figure 36A:
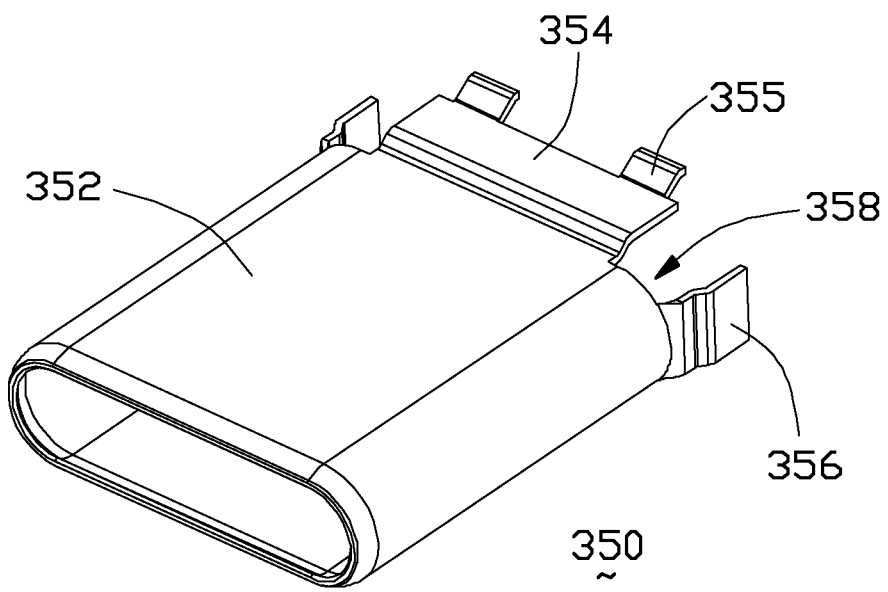
FIG. 36(A) is a front perspective view of a fifth embodiment of the shell of the plug connector according to the invention.
Figure 36B:
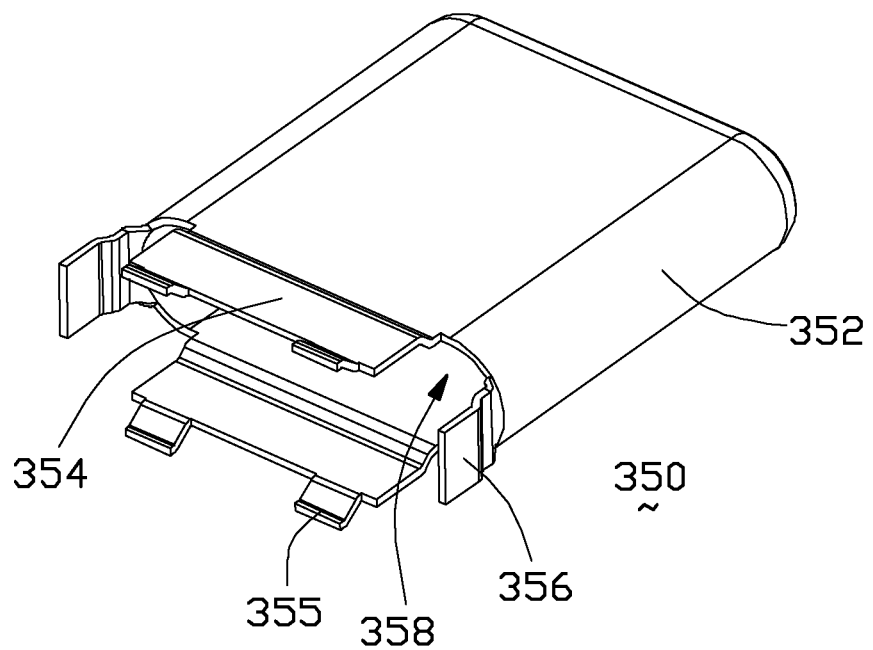
FIG. 36(B) is a rear perspective view of the shell of the plug connector of FIG. 36(A).

FIGS. 36(A) and 36(B) show the shell 350 of a fourth embodiment, which defines a capsular segment 352 with a pair of long retention plates 354 with the locking protrusions 355 thereon and a pair of short retention plates 356 on the rear edge wherein a large cutout 358 is formed between every two adjacent long retention plate 354 and short retention plate 356.

Figure 37A:
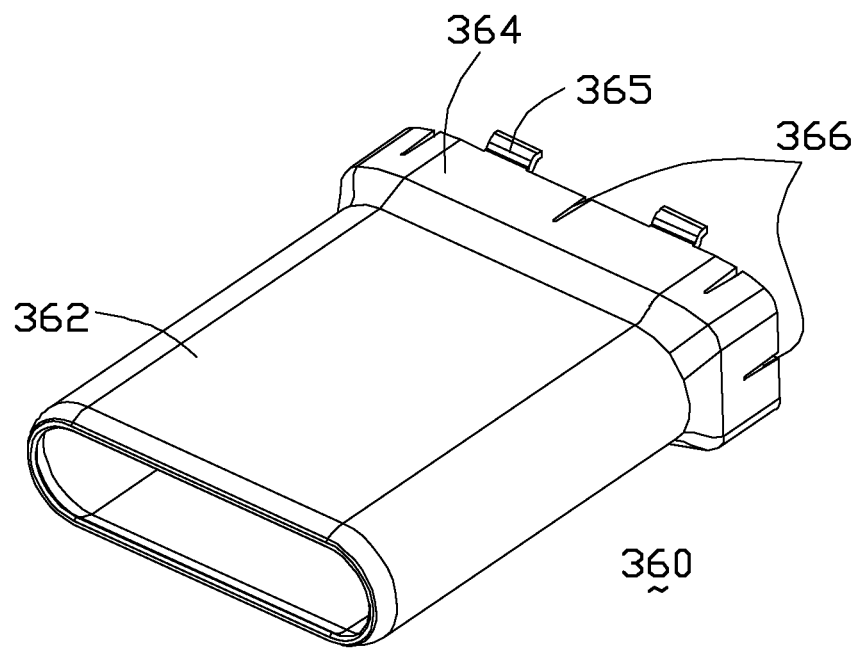
FIG. 37(A) is a front perspective view of a sixth embodiment of the shell of the plug connector according to the invention.
Figure 37B:
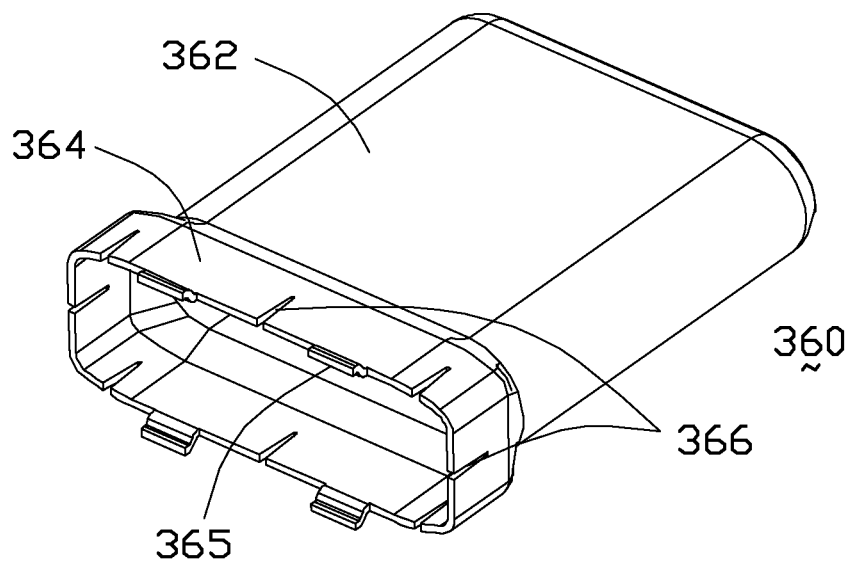
FIG. 37(B) is a rear perspective view of the shell of the plug connector of FIG. 37(A).

FIGS. 37(A) and 37(B) show the shell 360 of a plug connector of a fifth embodiment, which defines a front small capsular segment 362 and a rear large rectangular segment 364 with the locking protrusions 365 thereon wherein a plurality slits 366 are formed in the rear rectangular segment through the rear edge thereof.

Figure 38A:
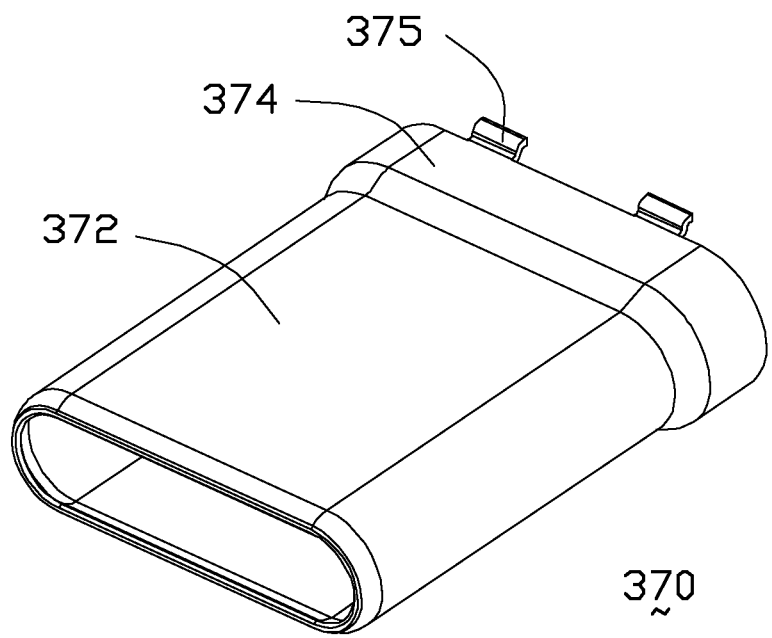
FIG. 38(A) is a front perspective view of a seventh embodiment of the shell of the plug connector.
Figure 38B:
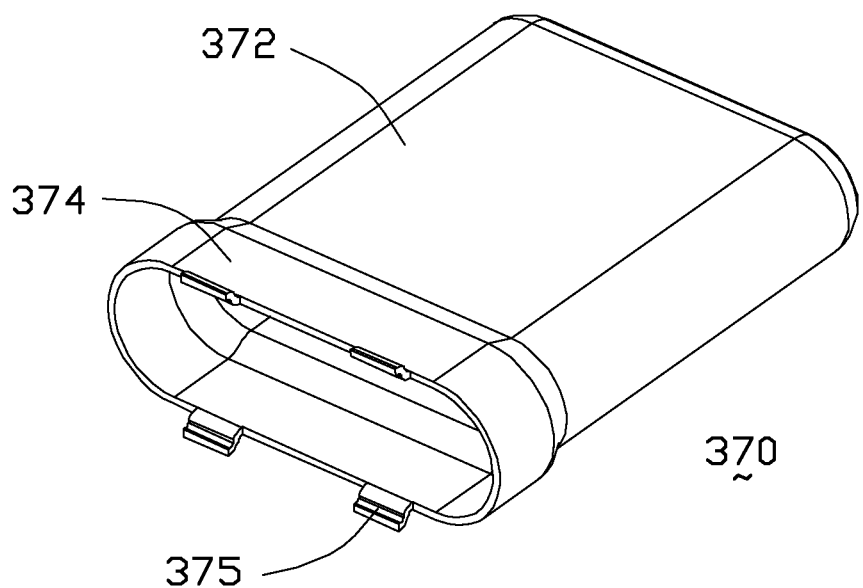
FIG. 38(B) is a rear perspective view of the shell of the plug connector.
Figure 39A:
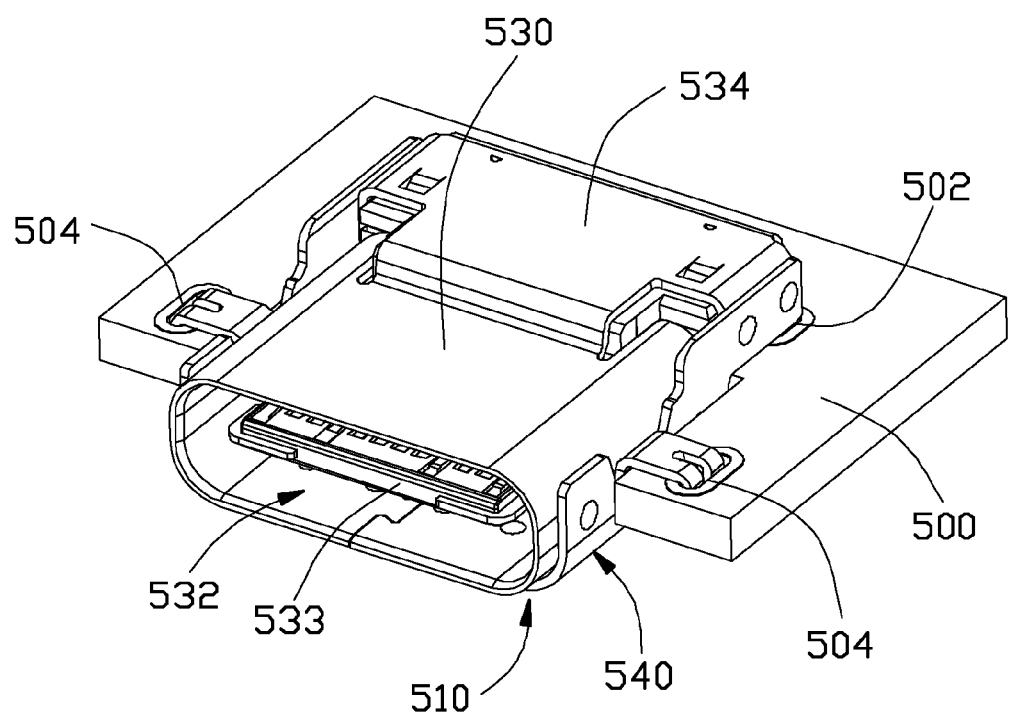
FIG. 39(A) is a front top perspective view of an eighth embodiment of the receptacle connector mounted upon the printed circuit board according to the invention.
Figure 39B:
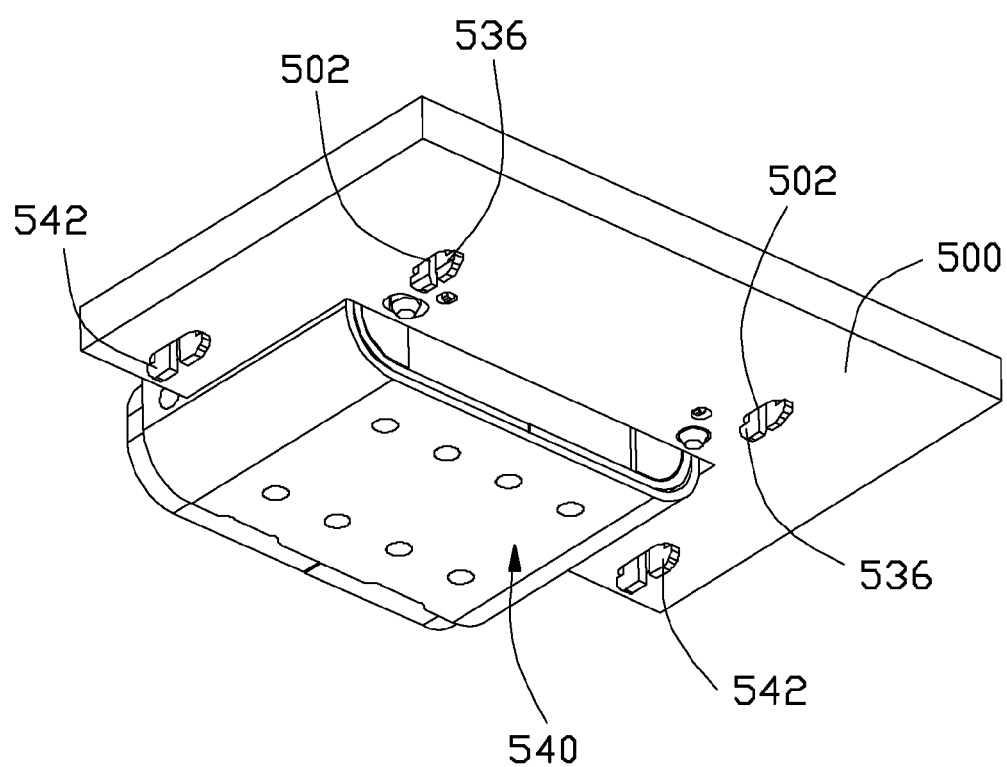
FIG. 39(B) is a rear bottom perspective view of the receptacle connector on the printed circuit board of FIG. 39(A).
Figure 40A:
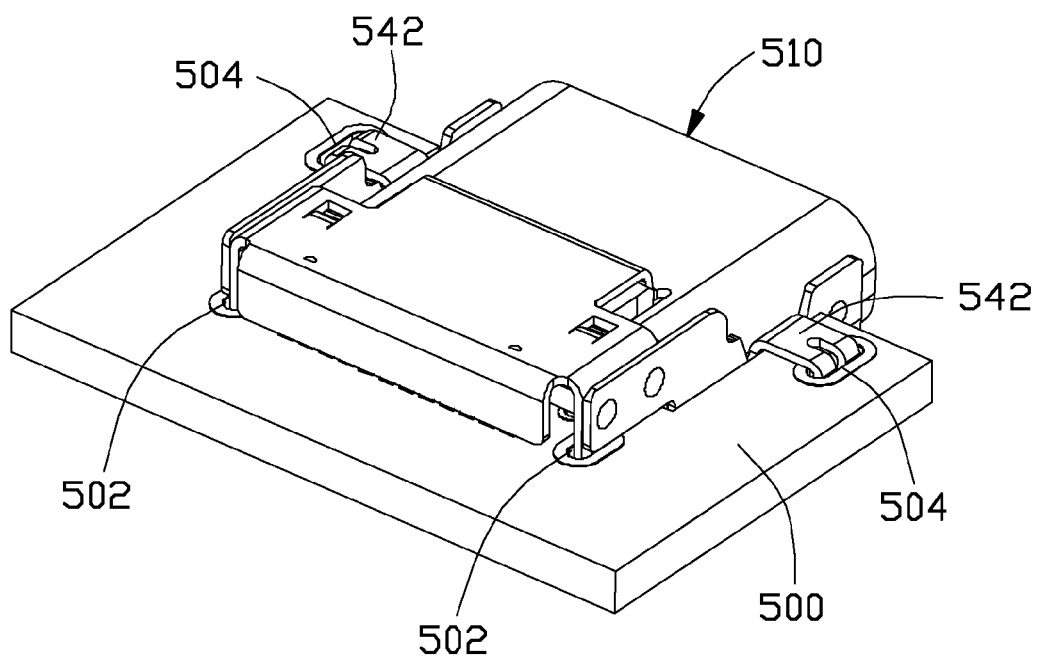
FIG. 40(A) is a rear top perspective view of the receptacle connector assembled upon the printed circuit board of FIG. 39(A).
Figure 40B:
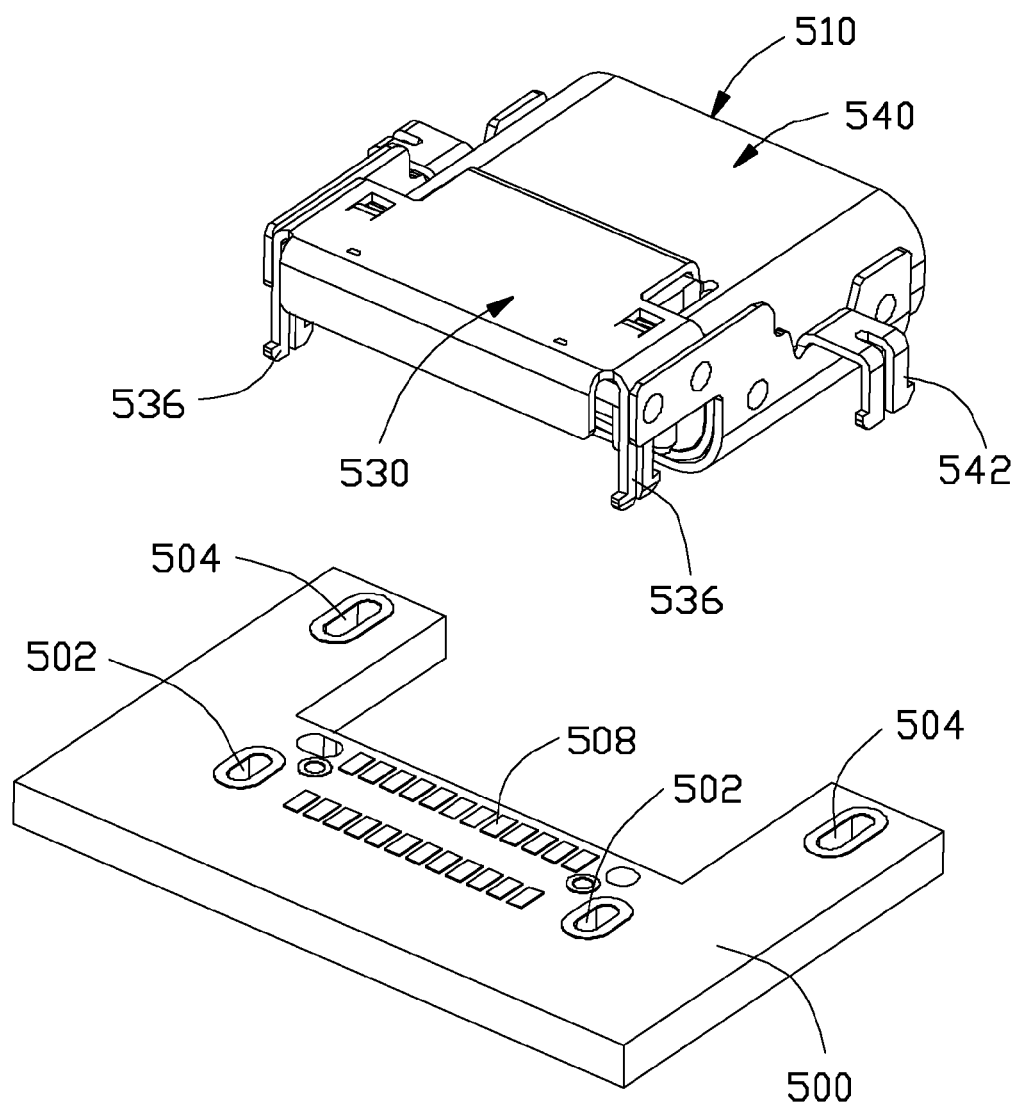
FIG. 40(B) is a rear top exploded perspective view of the receptacle connector of FIG. 40(A).
Figure 41:
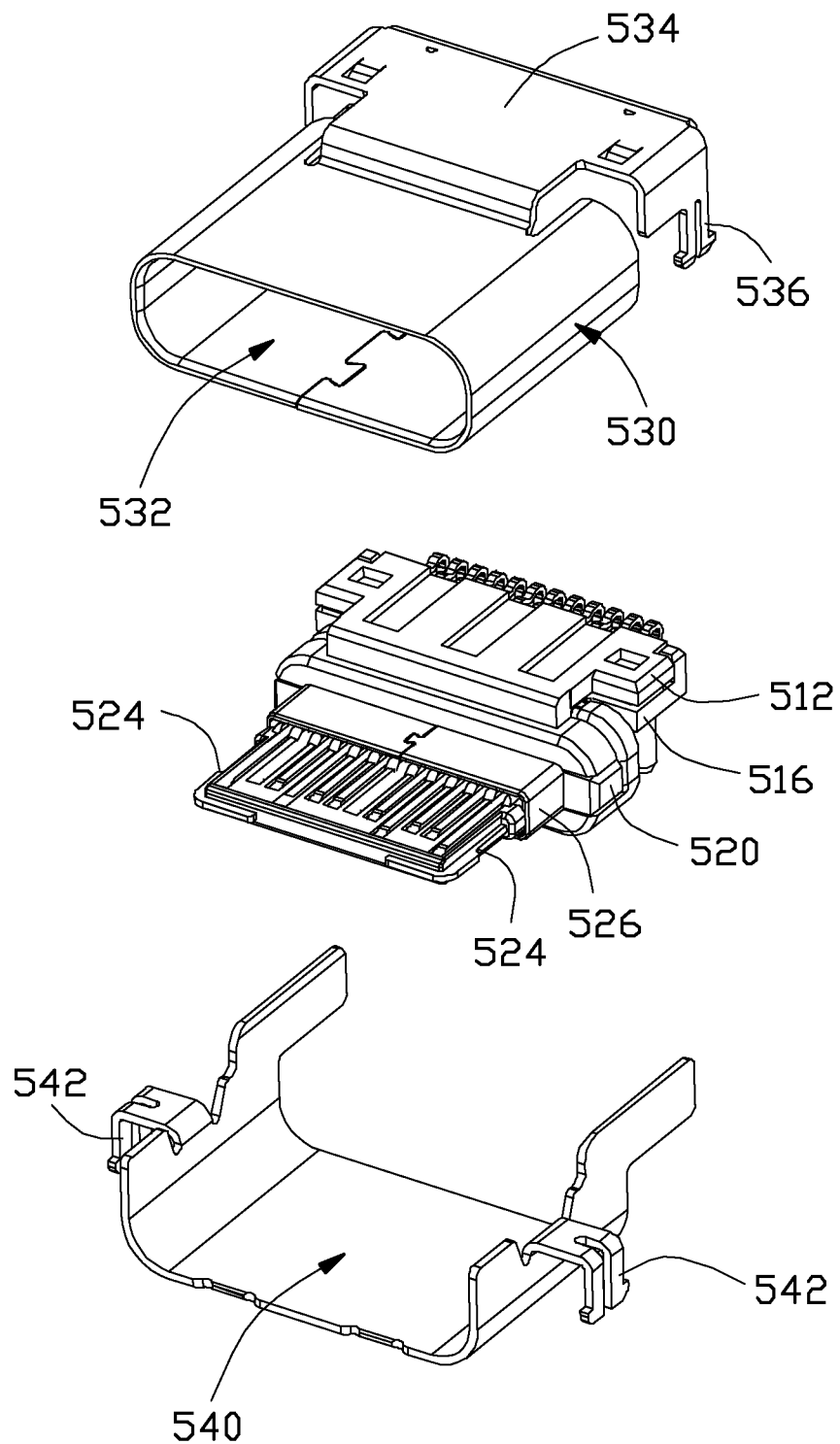
FIG. 41 is a further front exploded perspective view of the receptacle connector of FIG. 40(B).
Figure 42A:
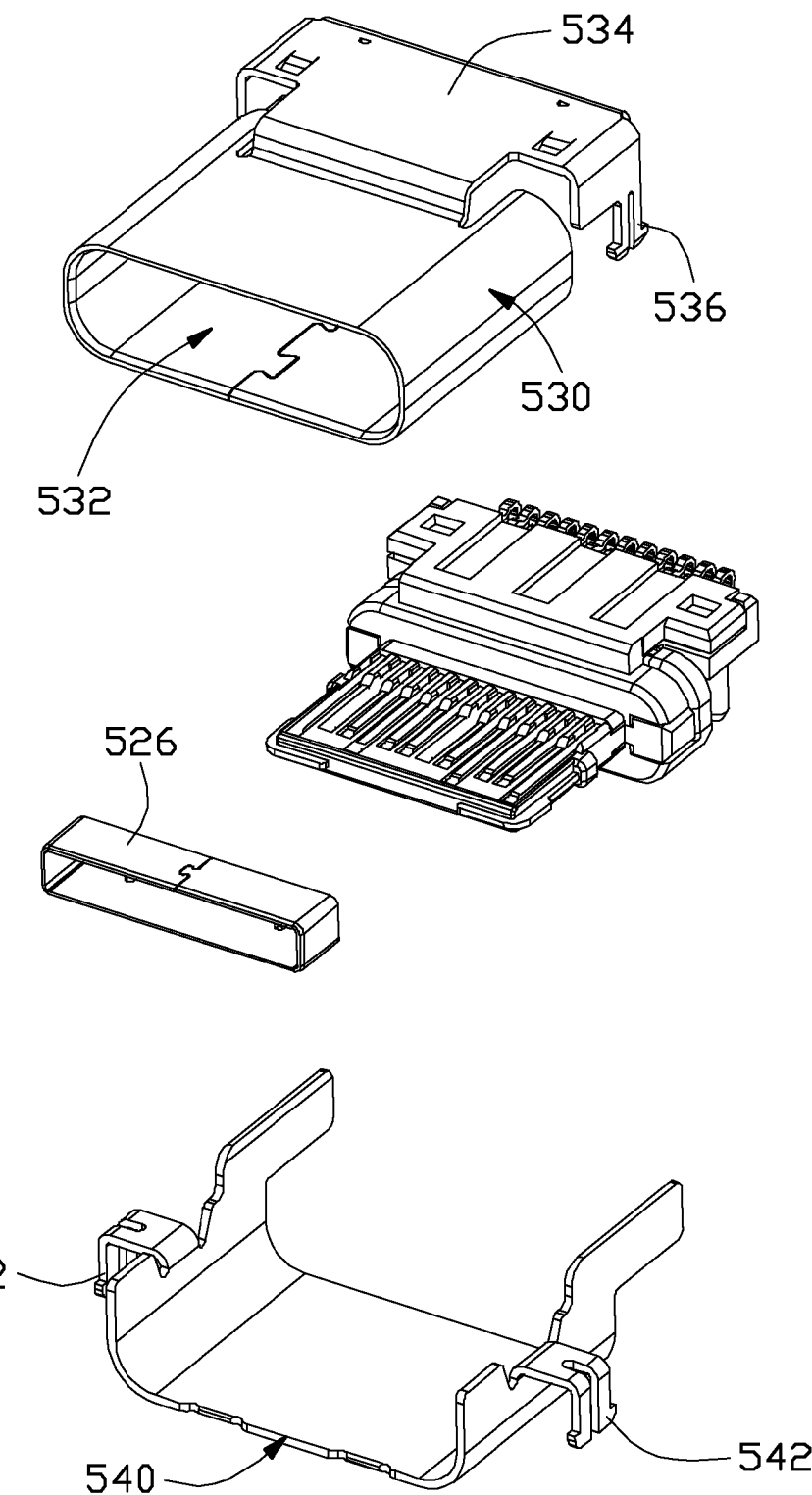
FIG. 42(A) is a further front exploded perspective view of the receptacle connector of FIG. 41.
Figure 42B:
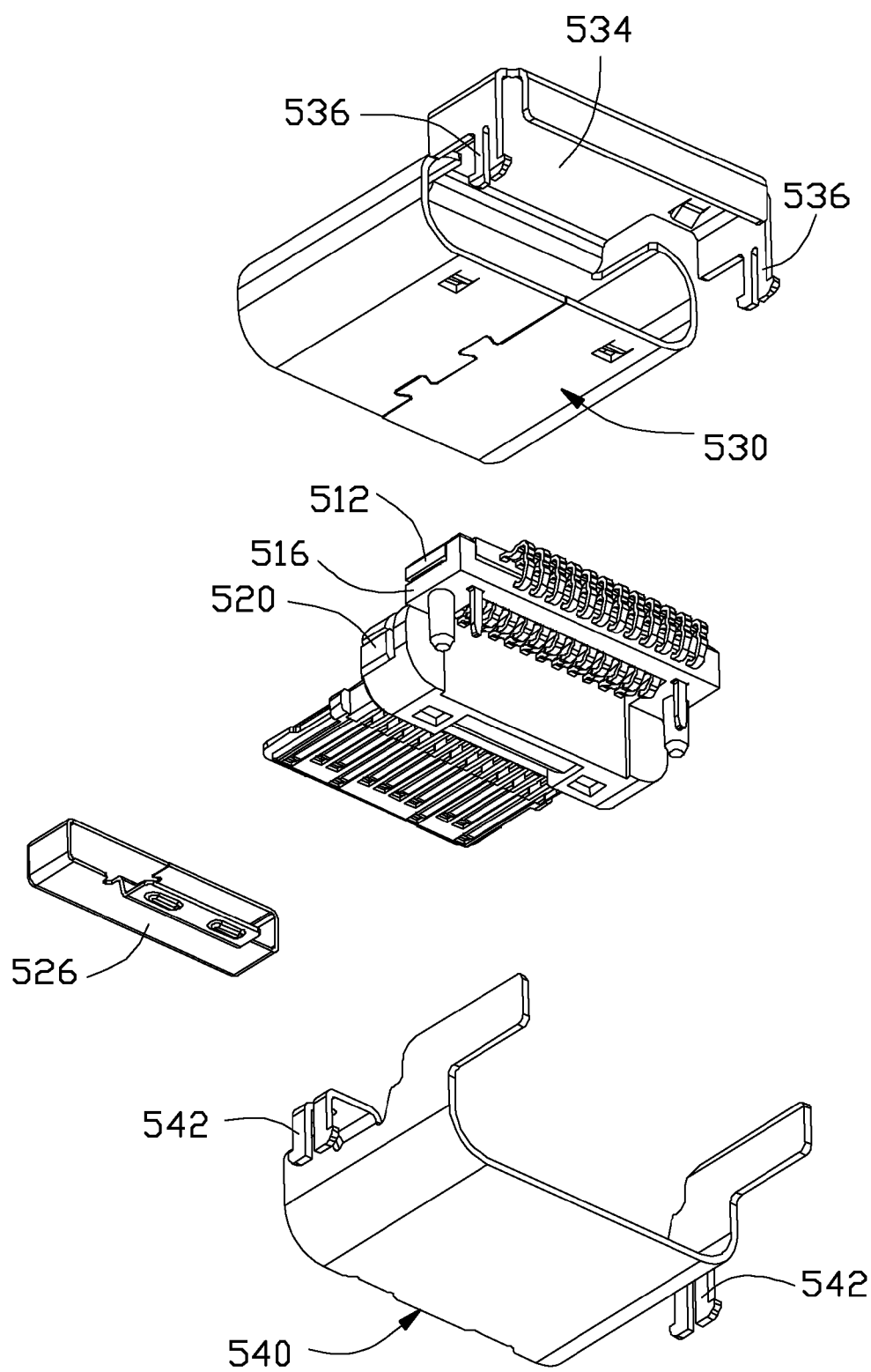
FIG. 42(B) is a further rear exploded perspective view of the receptacle connector of FIG. 42(A).
Figure 43A:
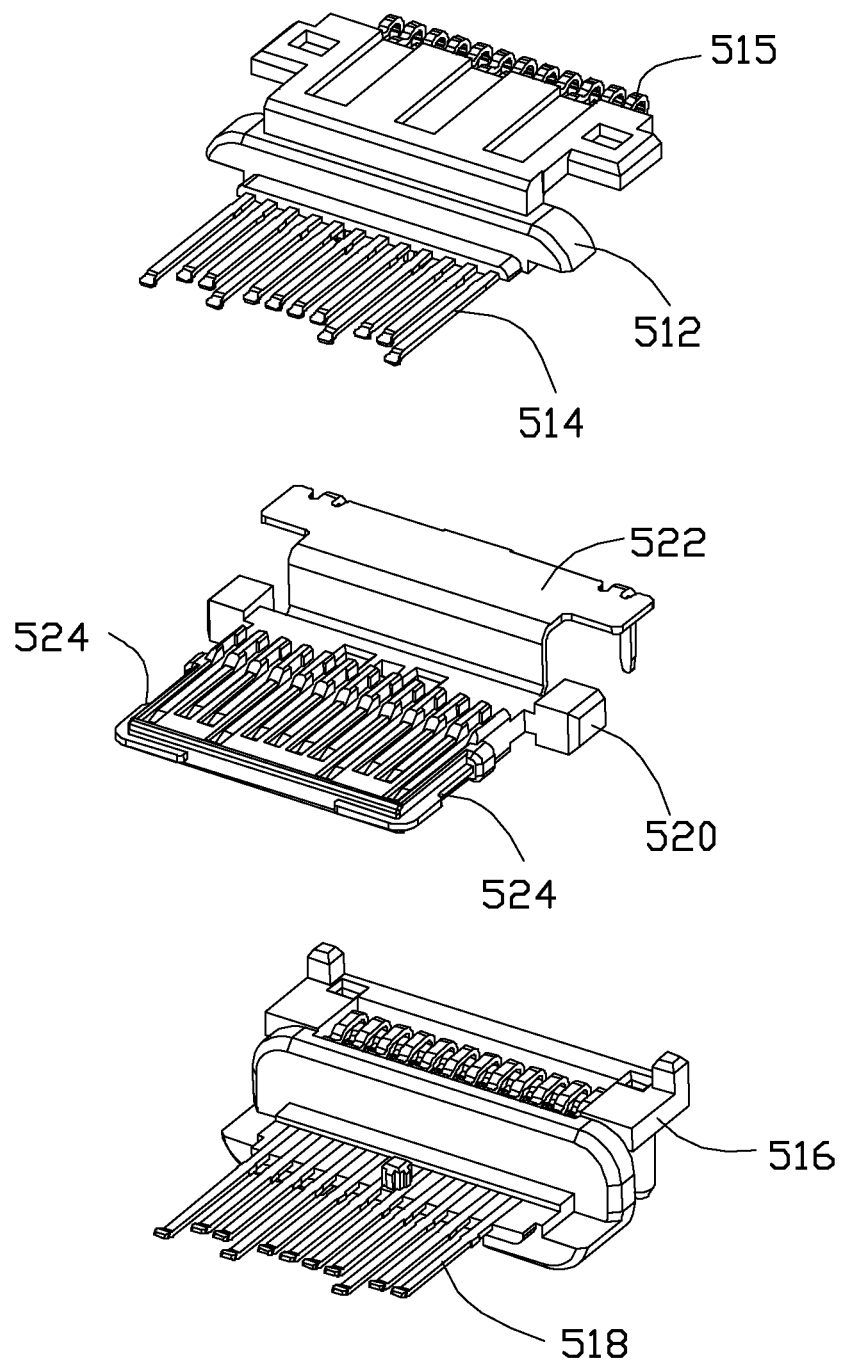
FIG. 43(A) is a further front exploded perspective view of the receptacle connector of FIG. 42(A).
Figure 43B:
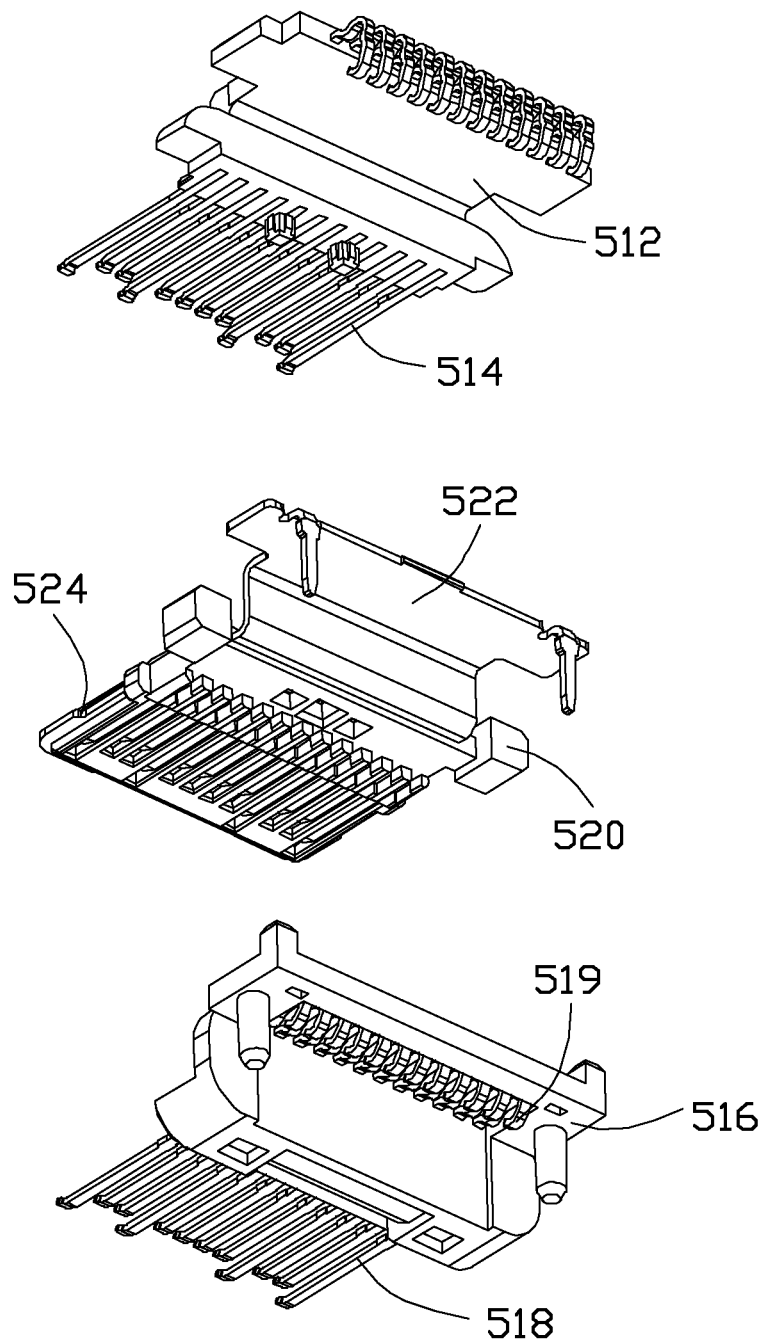
FIG. 43(B) is a further rear exploded perspective view of the receptacle connector of FIG. 43(A).
Figure 44A:
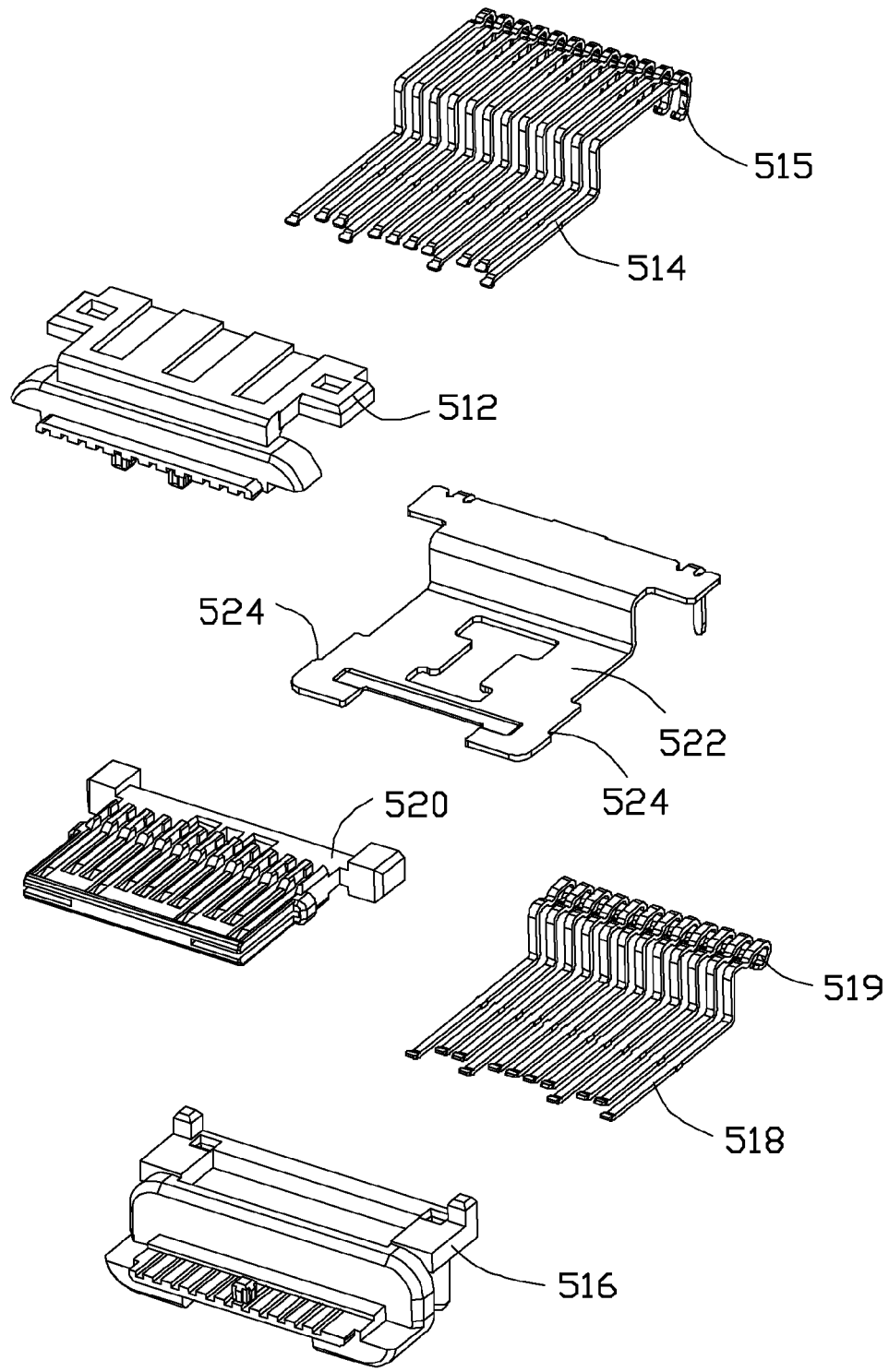
FIG. 44(A) is a further front exploded perspective view of the plug connector FIG. 43(A).
Figure 44B:
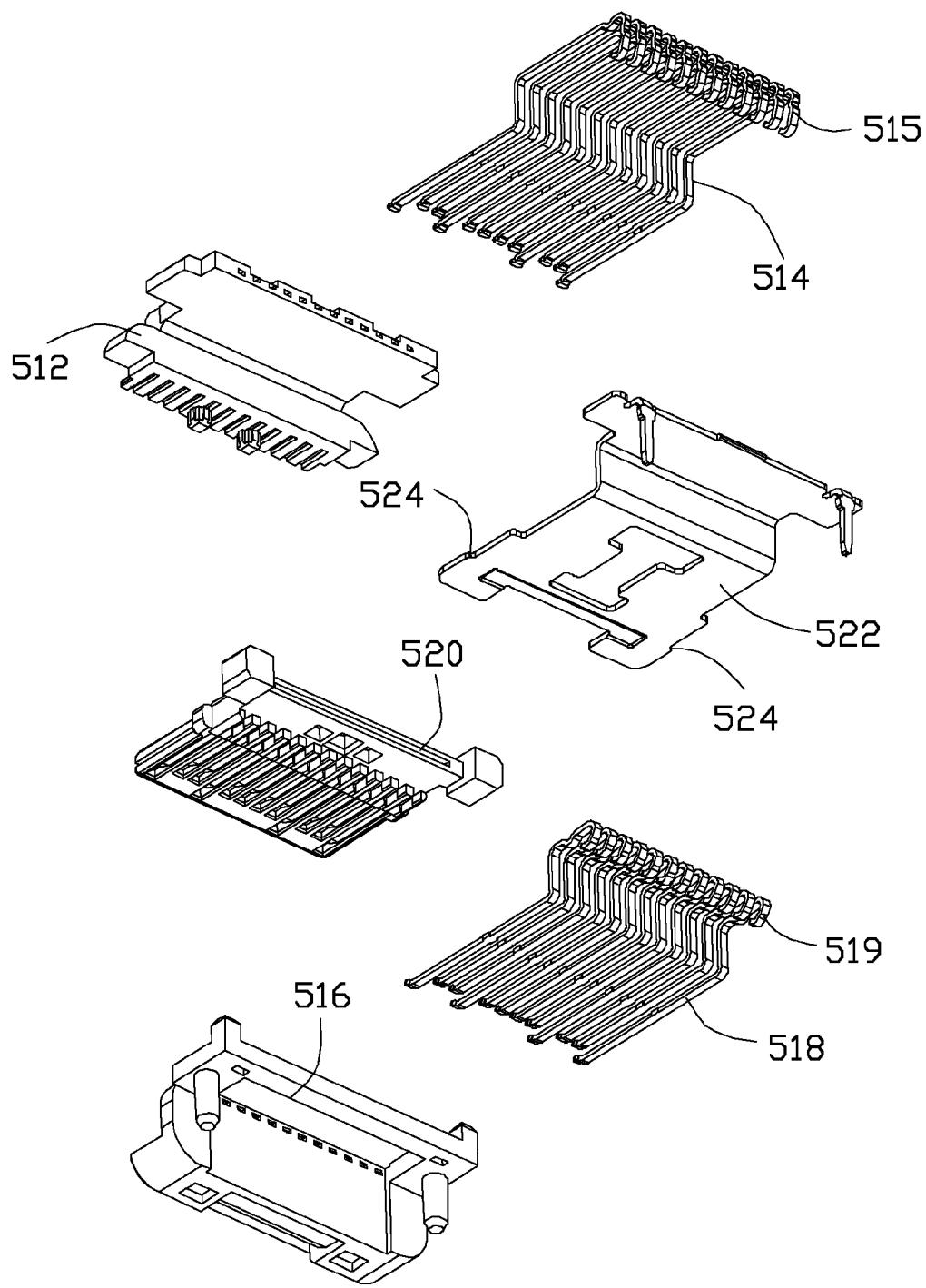
FIG. 44(B) is a further rear exploded perspective view of the receptacle connector of FIG. 44(A).
Figure 45:
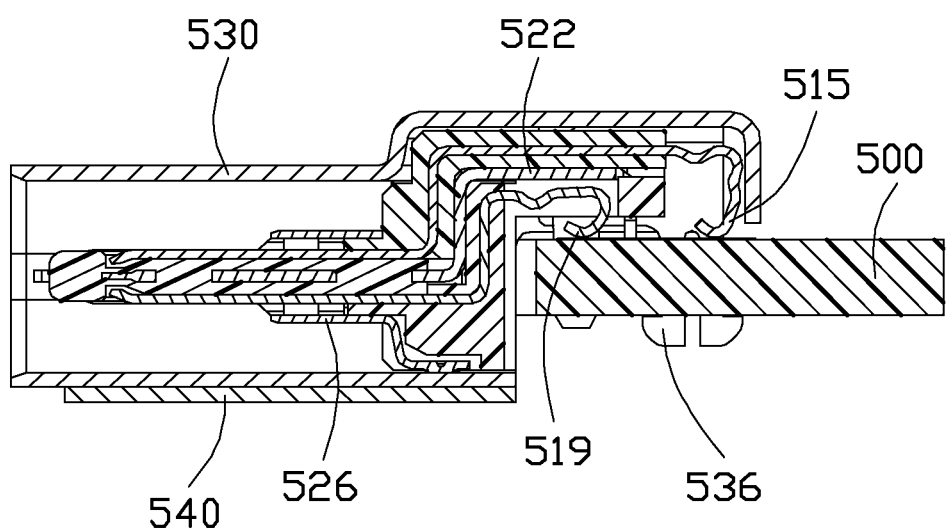
FIG. 45 is a cross-section al view of the receptacle connector mounted upon the printed circuit board of FIG. 39(A).
Figure 46:
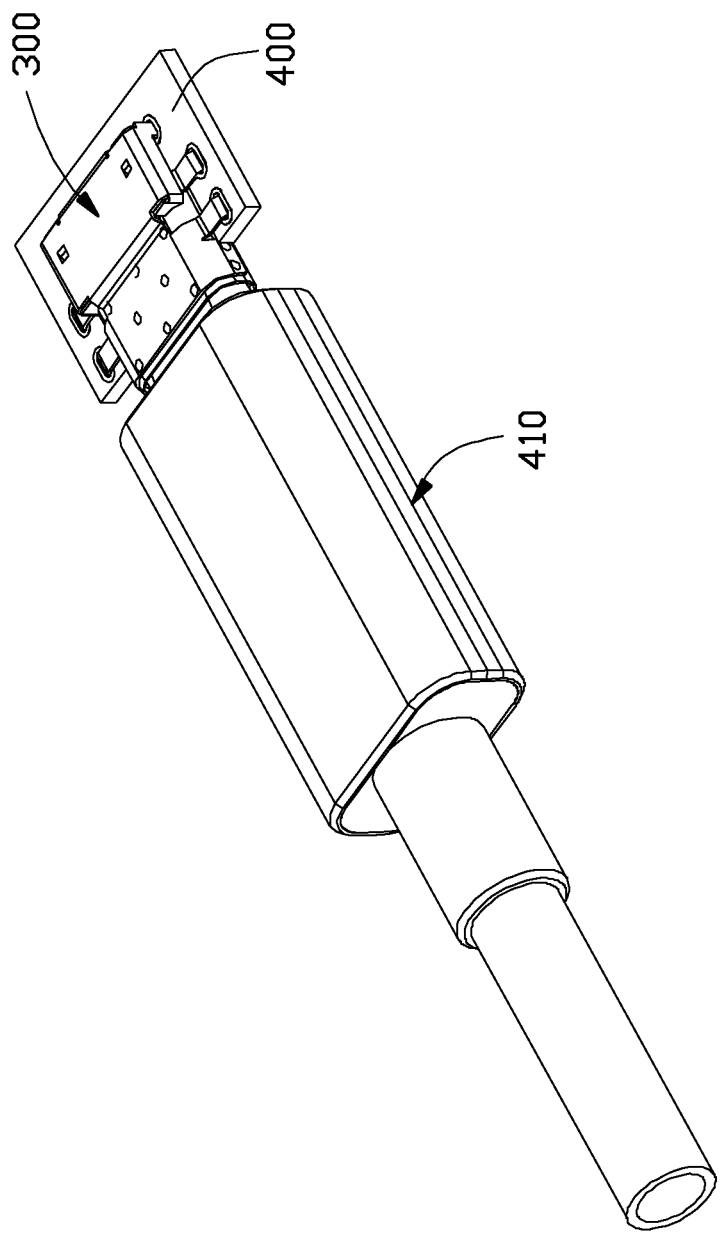
FIG. 46 is a plug connector mated with a receptacle connector mounted on the printed circuit board of a ninth embodiment.
Figure 47:
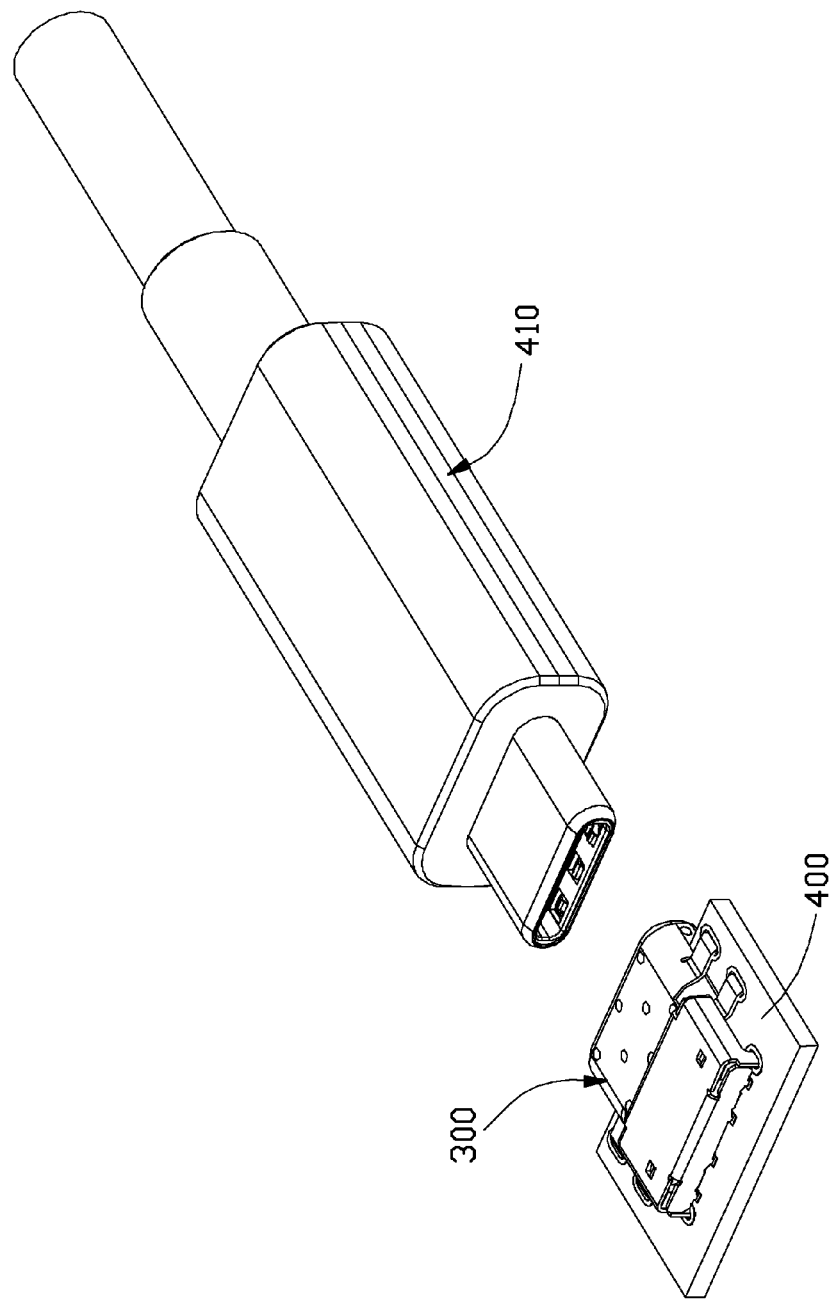
FIG. 47 is the plug connector unmated from the receptacle connector on the printed circuit board of FIG. 46.
Figure 48:
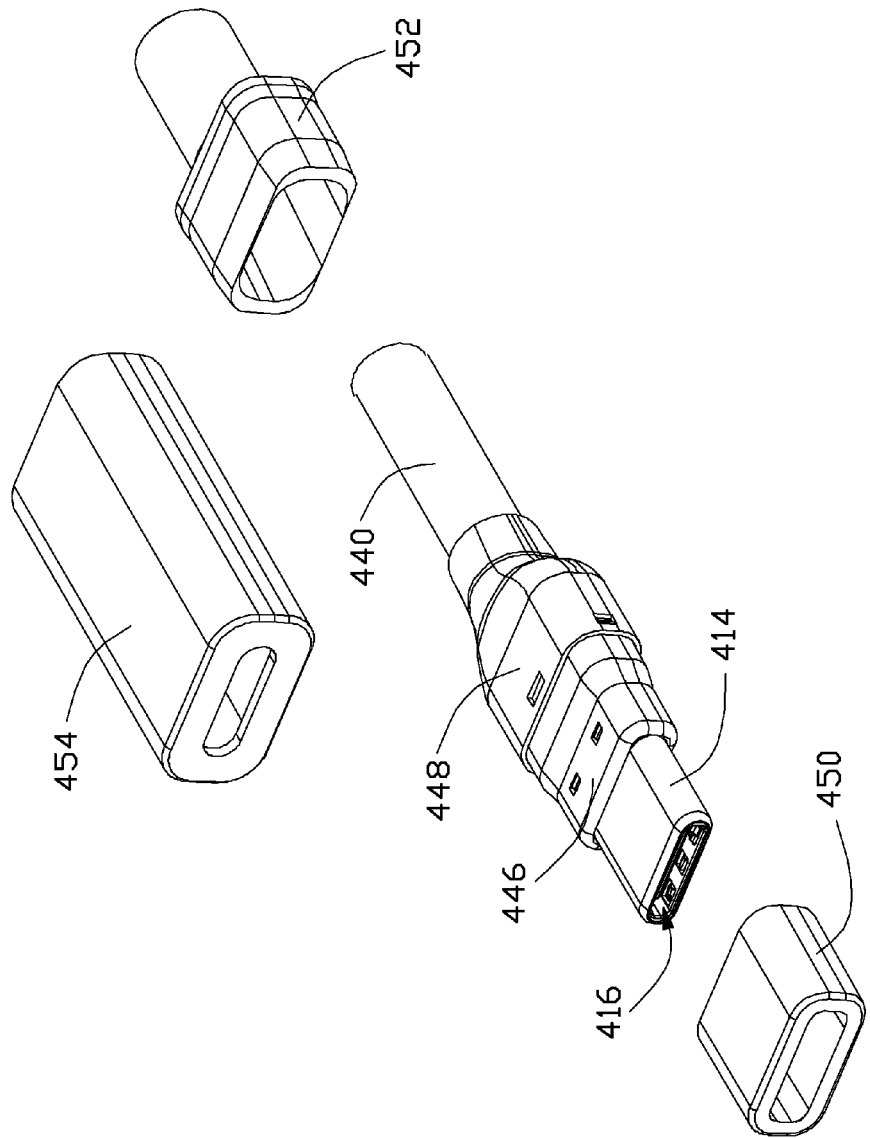
FIG. 48 is a front exploded perspective view of the plug connector of FIG. 46.
Figure 49:
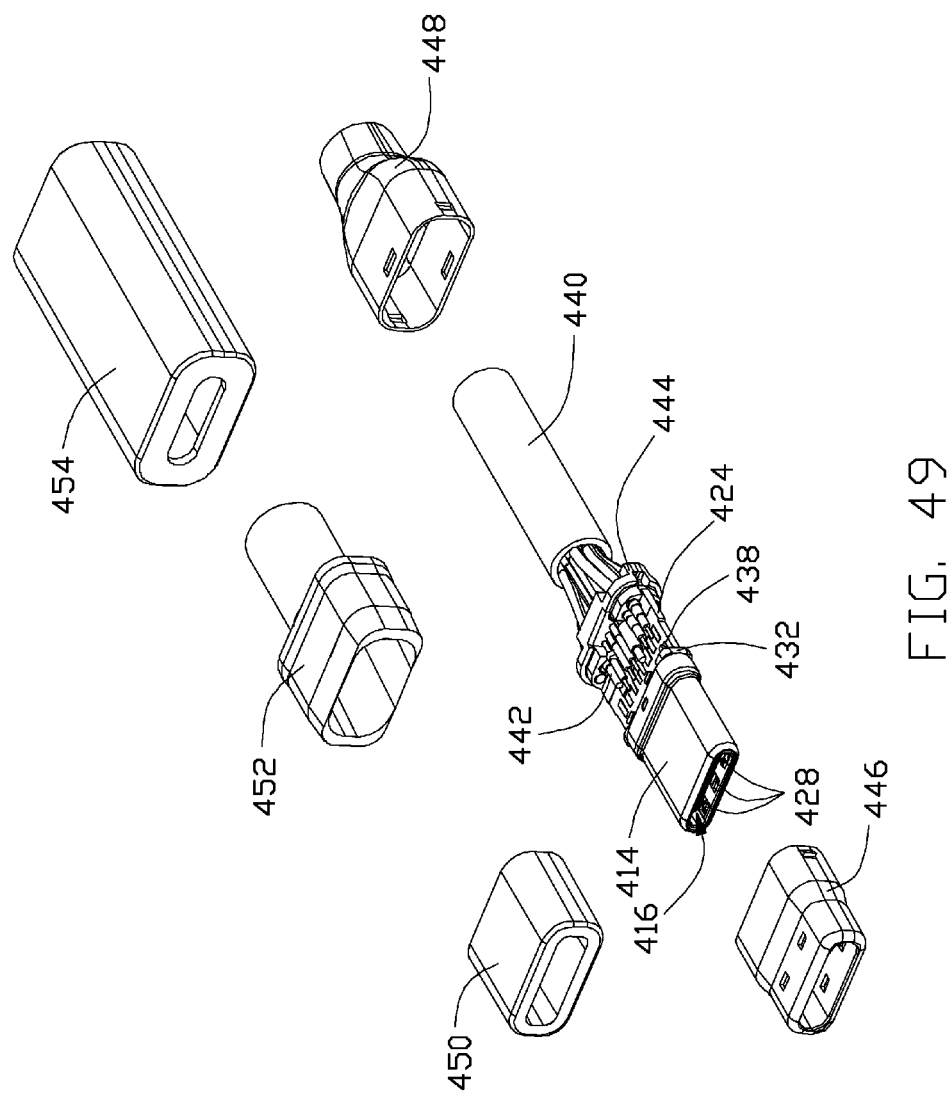
FIG. 49 is a further front exploded perspective view of the plug connector of FIG. 48.
Figure 50:
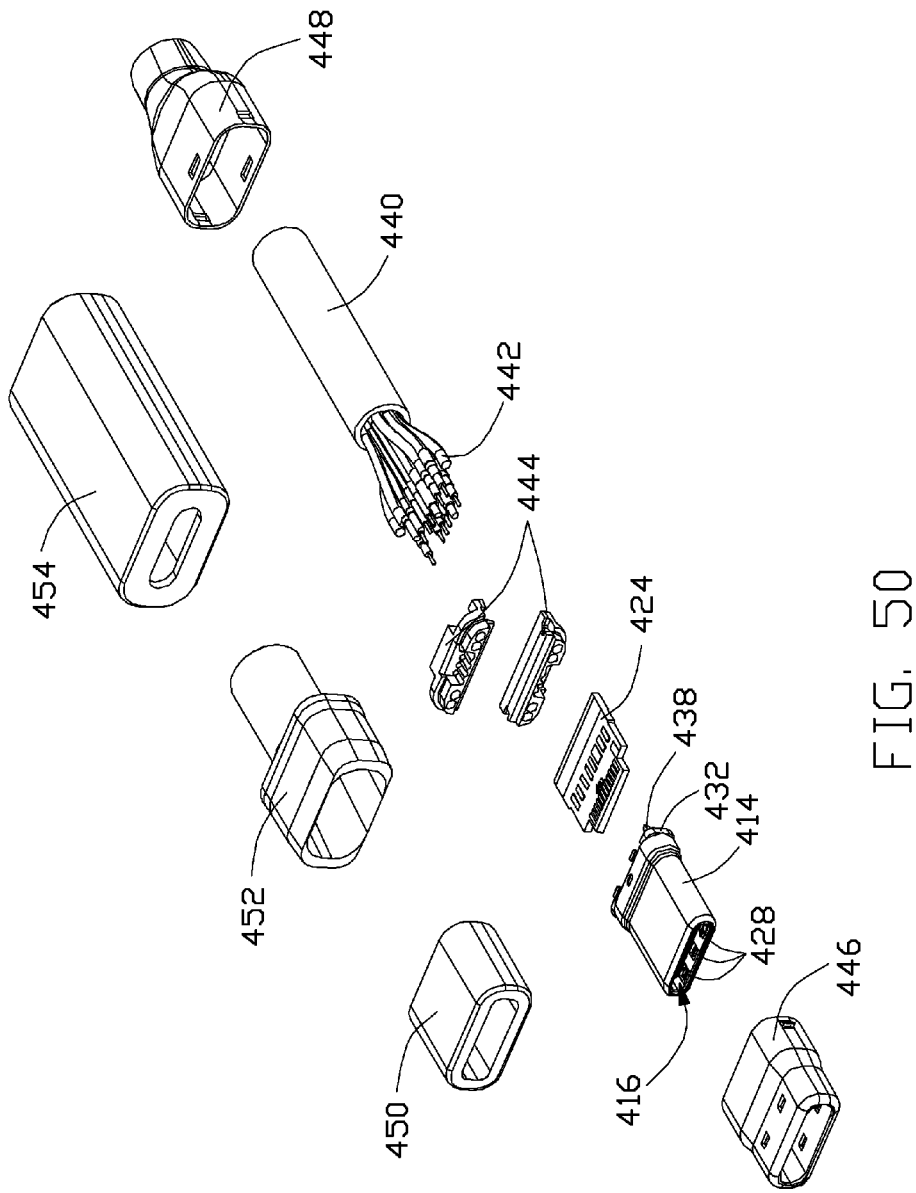
FIG. 50 is a further front exploded perspective view of the plug connector of FIG. 49.
Figure 51A:
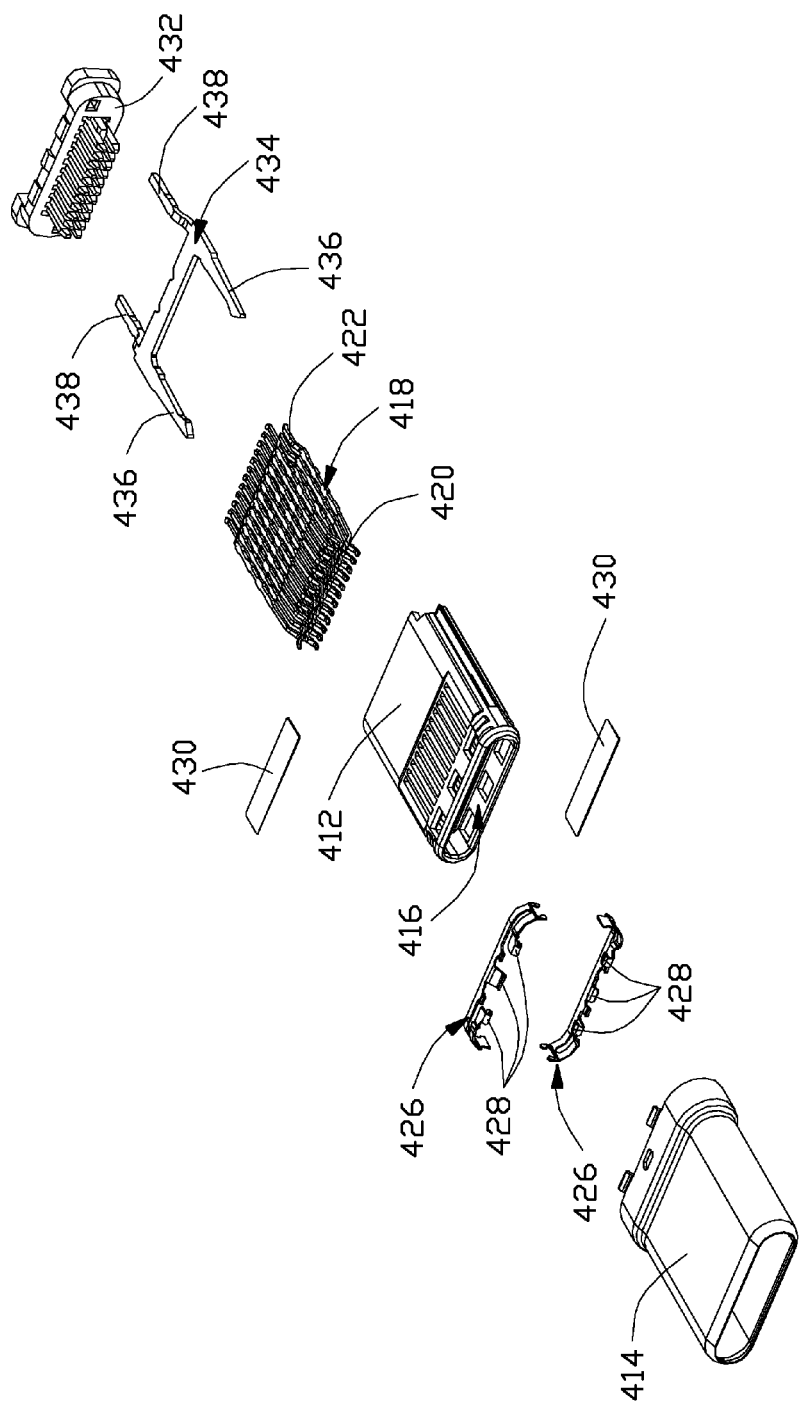
FIG. 51(A) is a further front exploded perspective view of a portion of the plug connector of FIG. 50.
Figure 51B:
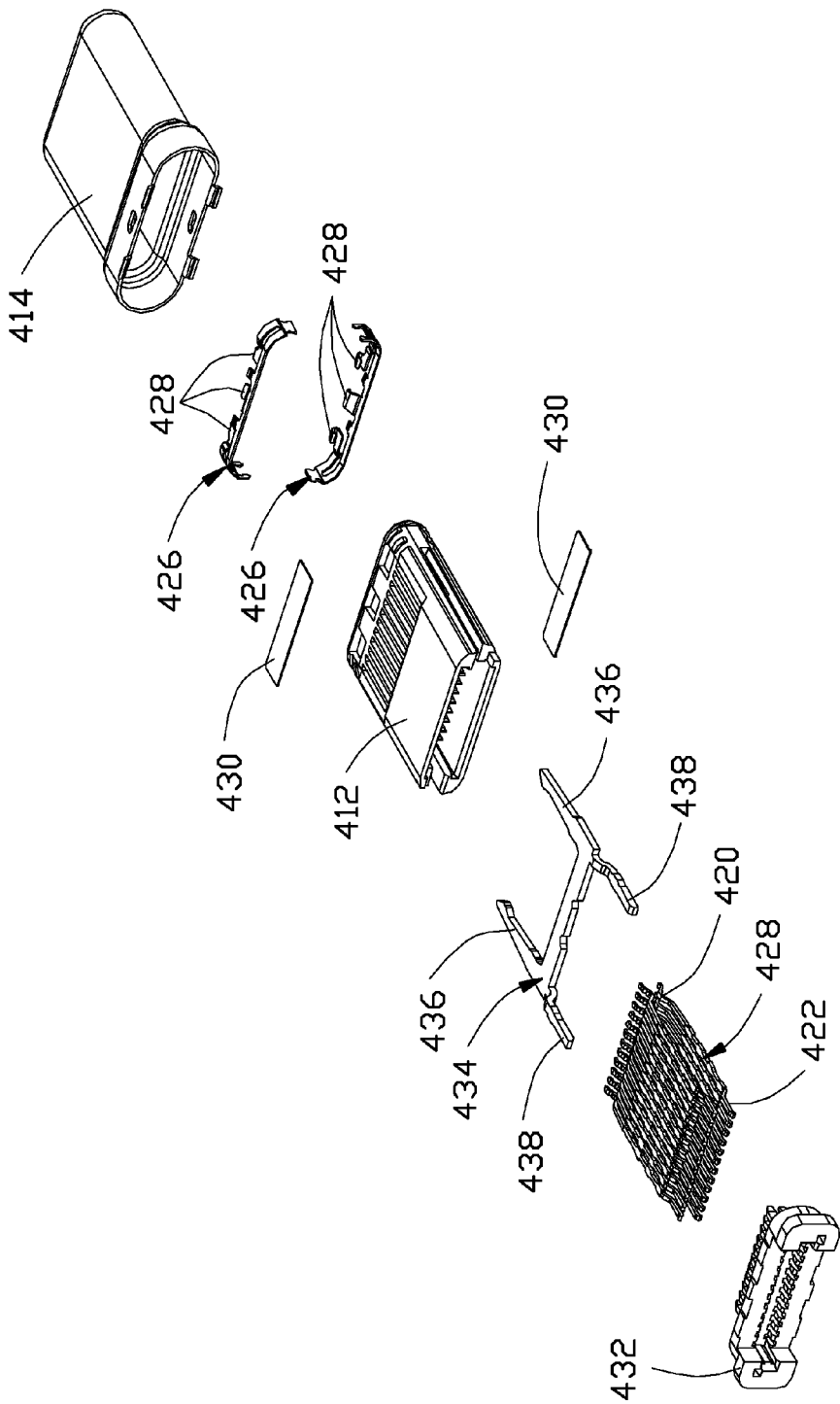
FIG. 51(B) is a further rear exploded perspective view of the portion of the plug connector of FIG. 51(A).

FIGS. 38(A) and 38(B) show the shell 370 of a sixth embodiment, which defines a front small capsular segment 372 and a rear large capsular segment 374 with locking protrusions 375 while without the slits or cutouts therein.

Referring to FIGS. 39(A)-45, a receptacle connector 510 of a seventh embodiment of this present invention, is detachably mounted upon the printed circuit board 500. The receptacle connector 510 includes an upper insulative piece 512 associated with the upper contacts 514 and an insulative piece 516 with the associated lower contacts 518 to commonly sandwich an insulative middle piece 520 with an associate shielding plate 522 wherein a metallic collar 526 encloses all the upper piece 512, the middle piece 520 and the lower piece 516 together. The shielding plate 522 includes a pair of lateral edge sections 524 for locking to the latch of the plug connector. Both the tail sections 515 of the upper contacts 514 and the tail sections 519 of the lower contacts 518 are of a compression manner for mounting to the printed circuit board 500 in a detachable deflection manner with regard to the corresponding circuit pads 508. A metallic shield 530 encloses the upper piece 512, the middle piece 520 and the lower piece 516 and defines a capsular mating cavity 532 in which a mating tongue 533 formed by the middle piece 520 is received. The shield 530 includes an extension plate 534 with a pair of claws 536 detachably locking into the corresponding holes 502 of the printed circuit board 500. A metallic bracket 540 optimally welded under the shield 310 to support the whole connector 510, includes a pair of mounting legs 542 detachably mounted into the corresponding holes 504 of the printed circuit board 500. Under this structure, the whole connector 510 is adapted to be detachably attached upon the printed circuit board 500 via engagement of the claws 536 within the holes 502 and the mounting legs 542 within the holes 504 wherein the tail sections 515 of the upper contacts 514 and those of the lower contacts 518 are under compression with regard to the pad 508.

FIGS. 46-51(B) show a ninth embodiment of a counterpart plug connector 410 similar to the plug connector 10 of the first embodiment for mating with the receptacle connector 300, including an insulative capsular housing 412 enclosed in the front metallic capsular shell 414 and defining a receiving cavity 416 for receiving the mating tongue 399 of the receptacle connector 300. A plurality of contacts 418 are disposed in the housing 412 in two rows with front contacting sections 420 extending into the receiving cavity 416 and a rear mounting sections 422 mounted to a paddle card 424 located behind the housing 412. A pair of spring plates 426 are attached upon the housing 412 with a tenon-mortise structure, at opposite ends, fastened to each other wherein each of the spring plates forms a plurality of contacting tangs 428 extending through the housing into the receiving cavity 416 for coupling to the corresponding collars 390. A pair of insulating plates 430 cover two opposite surfaces of the housing 412 for avoiding shorting between the contacts 418 and the shell 414 when the contacting sections 420 are outwardly deflected by the inserted mating tongue 399 of the receptacle connector 300. An insulative spacer 432 is located behind the housing 412 and in front of the paddle card 424, through which the mounting sections 422 of the contacts 418 extend rearwardly and mounted upon two opposite surfaces of the paddle card 424. A metallic H-shaped latch 434 is located between the housing 412 and the spacer 432, and includes a pair of forwardly extending latching arms 436 in a coplanar manner with locking heads (not labeled) transversely extending into the receiving cavity 416 for latching the corresponding locking side edges 358 of the receptacle connector 300, and a pair of mounting legs 438 in an offset manner along the vertical direction for respectively mounting to the two opposite surfaces of the paddle card 424.

A cable 440 is located behind the paddle card 424 and includes a plurality of wires 442 extending through a pair of organizers 444 to be mounted to a rear region of the paddle card 424. A middle metallic shell 446 is assembled to a rear side of the shell 414 to enclose the paddle card 424, and a rear metallic shell 448 is assembled to the rear side of the middle metallic shell 446 to enclose the dispersing wires 442. An insulative inner cover 450 surrounds the middle metallic shell 446 and an insulative strain relief 452 surrounds the rear metallic shell 448. An insulative outer cover 454 surrounds both the inner cover 450 and the strain relief 452 while exposing the forwardly extending shell 414 and the rearwardly extending cable 440.

However, the disclosure is illustrative only, changes may be made in detail, especially in matter of shape, size, and arrangement of parts within the principles of the invention.

What is claimed is:
1. A receptacle connector for use with a plug, comprising:
an insulative housing defining a base with a mating tongue forwardly extending therefrom along a front-to-back direction;
a plurality of contacts disposed in the housing with contacting sections exposed upon the mating tongue and categorized with signal contacts, power contacts and grounding contacts;

a metallic shell enclosing the housing to define a capsular mating cavity in which said mating tongue is disposed; and a metallic shielding plate embedded within the mating tongue;

wherein the shielding plate defines a pair of rigid lateral edge sections without flexibility thereof, in a transverse direction perpendicular to said front-to-back direction, configured to be locked with a deflectable latch of the plug.

2. The receptacle connector as claimed in claim 1, further including a metallic bracket soldered to and at least partially surrounding the shield and equipped with mounting legs for mounting to a printed circuit board.

3. The receptacle connector as claimed in claim 2, wherein the bracket is located on a bottom side of the shield in a vertical direction perpendicular to both said front-to-back direction and said transverse direction.

4. The receptacle connector as claimed in claim 2, wherein the bracket is either softer or stiffer than the shield.

5. The receptacle connector as claimed in claim 2, wherein said bracket is located upon a top side of the shield and includes a pair of block like raised portions to cover two opposite lateral sides of the housing which is originally exposed via gaps of an extending plate of the shield.

6. The receptacle connector as claimed in claim 5, wherein said mounting legs extend downwardly from said pair of block like raised portions.

7. The receptacle connector as claimed in claim 2, wherein tails of the contacts are configured with a detachable compressing manner rather than a soldering manner.

8. The receptacle connector as claimed in claim 7 wherein the mounting legs are resilient and detachable with regard to the printed circuit board.

9. A plug connector for use with a complementary receptacle connector, comprising:
an insulative housing enclosed in the metallic shell and defining a receiving cavity forwardly communicating with an exterior in a front-to-back direction;
a plurality of contacts disposed in the housing and by two sides of the receiving cavity in a vertical direction perpendicular to said front-to-back direction, and categorized with signal contacts, power contacts and grounding contacts;
a metallic latch retained in the housing with a pair of locking heads extending into two opposite lateral sides of the receiving cavity for latchable engagement with a shielding plate which is embedded within a mating tongue of the receptacle connector during mating.

10. The plug connector as claimed in claim 9 wherein tail sections of the contacts are directly mounted to an internal printed circuit board.

11. The plug connector as claimed in claim 9 wherein the latch includes a pair of discrete latching arms with the corresponding locking heads, respectively.

12. The plug connector as claimed in claim 9 further including an EMI (Electro-Magnetic Interference) spring plate is sandwiched between the shell and the housing, wherein the spring plate is engaged with the housing in a horizontal plane.

13. The plug connector as claimed in claim 12, wherein said EMI spring plate includes a pair of spring tangs extending in a transverse direction perpendicular to both said front-to-back direction and said vertical direction.

14. The plug connector as claimed in claim 9, herein said shell is seamless and made from a drawing process, said shell defines a front small tubular section and a rear large tubular section, and a pair of cutouts are formed in a rear edge region of the large tubular section.

15. The plug connector as claimed in claim 14, wherein said front small tubular is essentially capsular while the rear large tubular section is essentially rectangular.

16. The plug connector as claimed in claim 14, where each of said cutouts extends through the rear large section and reaches the front small tubular section.

17. The plug connector as claimed in claim 14 wherein a plurality of locking protrusions are formed at a rear edge of the rear large tubular section.

18. The plug connector as claimed in claim 17, wherein said locking protrusions are split from the rear large tubular section and extend rearwardly beyond a rear edge of the rear large tubular section.

19. The plug connector as claimed in claim 9, wherein the latch is formed with an H like configuration having a transverse bar extending along the transverse direction with a pair of outwardly deflectable arms respectively extending forwardly from two opposite ends of the transverse bar at a same plane with the corresponding locking heads and with a pair of extensions respectively extending from said two opposite ends at different levels opposite to said same plane in the vertical direction.

20. The plug connector as claimed in claim 9, further including EMI (Electro-Magnetic Interference) spring plate sandwiched between the shell and the housing, wherein the insulative housing defines through holes distinct from each other, contacting ends extending from the spring plate in the front-to-back direction protruding into the receiving cavity through the corresponding through holes.

* * * * *